(12) United States Patent
Mayville et al.

(10) Patent No.: US 11,651,914 B2
(45) Date of Patent: May 16, 2023

(54) VEHICLE SHIFTER WITH ONE POSITION TOGGLE SWITCH WITH MONOSTABLE/RETURN TO CENTER FUNCTIONALITY

(71) Applicant: Kuster North America, Inc., Troy, MI (US)

(72) Inventors: Brian Andrew Mayville, Northville, MI (US); Calogero Alu, Shelby Charter Township, MI (US); Michael Benedetto D'Annunzio, Shelby charter Township, MI (US); Thorsten Dirk Connemann, Ehringshausen (DE)

(73) Assignee: Kuster North America, Inc., Troy, MI (US)

( * ) Notice: Subject to any disclaimer, the term of this patent is extended or adjusted under 35 U.S.C. 154(b) by 242 days.

(21) Appl. No.: 17/180,920

(22) Filed: Feb. 22, 2021

(65) Prior Publication Data
US 2021/0265121 A1     Aug. 26, 2021

Related U.S. Application Data

(60) Provisional application No. 62/979,794, filed on Feb. 21, 2020.

(51) Int. Cl.
*H01H 21/22* (2006.01)
*H03K 17/96* (2006.01)
(Continued)

(52) U.S. Cl.
CPC ............ *H01H 21/22* (2013.01); *B62D 1/046* (2013.01); *F16H 59/105* (2013.01); *G05G 1/04* (2013.01);
(Continued)

(58) Field of Classification Search
CPC ... H01H 21/22; H01H 21/04; B60K 2370/131
See application file for complete search history.

(56) References Cited

U.S. PATENT DOCUMENTS 9,620,309 B2 *  4/2017  Hoskins ................. H01H 19/16
9,845,868 B2 * 12/2017  Lee ......................... F16H 63/42
(Continued)

FOREIGN PATENT DOCUMENTS

CN       111828606 A     10/2020
KR       10-1316185 B1   10/2013
(Continued)

OTHER PUBLICATIONS

International Search Report and Written Opinion issued by the Korean Intellectual Property Office acting as International Searching Authority for International Patent Application No. PCT/US2021/018987 dated Jun. 16, 2021 (10 pages in total).

*Primary Examiner* — Vicky A Johnson
(74) *Attorney, Agent, or Firm* — Dinsmore & Shohl LLP

(57) ABSTRACT

A vehicle shifter assembly having a housing rotatably supporting a monostable toggle knob accessible to a vehicle operator. A processor enabled printed circuit board is incorporated into the housing and, upon actuation of the knob, instructs a gear shift condition to a display component. The housing can be incorporated into any of a variety of locations accessible to the vehicle operator, including being integrated into the steering wheel so that, and upon rotation of the wheel, the housing or display is continuously reoriented so as to maintain an upright position as viewed by the operator.

20 Claims, 38 Drawing Sheets

(51) Int. Cl.
*H05K 5/00* (2006.01)
*H01H 21/04* (2006.01)
*B62D 1/04* (2006.01)
*F16H 59/10* (2006.01)
*G05G 5/05* (2006.01)
*G05G 1/04* (2006.01)
*B60K 37/06* (2006.01)
*F16H 59/02* (2006.01)

(52) U.S. Cl.
CPC ............... *G05G 5/05* (2013.01); *H01H 21/04* (2013.01); *H03K 17/962* (2013.01); *H05K 5/0017* (2013.01); *B60K 37/06* (2013.01); *B60K 2370/131* (2019.05); *B60K 2370/1438* (2019.05); *F16H 2059/0295* (2013.01); *G05G 2505/00* (2013.01)

(56) References Cited

U.S. PATENT DOCUMENTS

| | | |
|---|---|---|
| 10,100,919 B1 | 10/2018 | Turney et al. |
| 10,190,675 B2 | 1/2019 | Turney et al. |
| 10,527,162 B2 | 1/2020 | Shamshiri et al. |
| 10,576,981 B2 | 3/2020 | Chang |
| 10,780,909 B2 | 9/2020 | Aerts et al. |
| 10,871,222 B2* | 12/2020 | Kim ..................... F16H 59/044 |
| 2003/0023353 A1 | 1/2003 | Badarneh |
| 2004/0226801 A1 | 11/2004 | De Jonge et al. |
| 2009/0107287 A1 | 4/2009 | Seki |
| 2014/0007726 A1 | 1/2014 | Muraki et al. |
| 2014/0116179 A1 | 5/2014 | Sata |
| 2017/0083039 A1* | 3/2017 | Wuisan ..................... G05G 5/05 |
| 2020/0039558 A1 | 2/2020 | Aerts et al. |

FOREIGN PATENT DOCUMENTS

| | | |
|---|---|---|
| KR | 10-2016-0121938 A | 10/2016 |
| WO | 2017213869 A1 | 12/2017 |
| WO | 2021001142 A1 | 1/2021 |

* cited by examiner

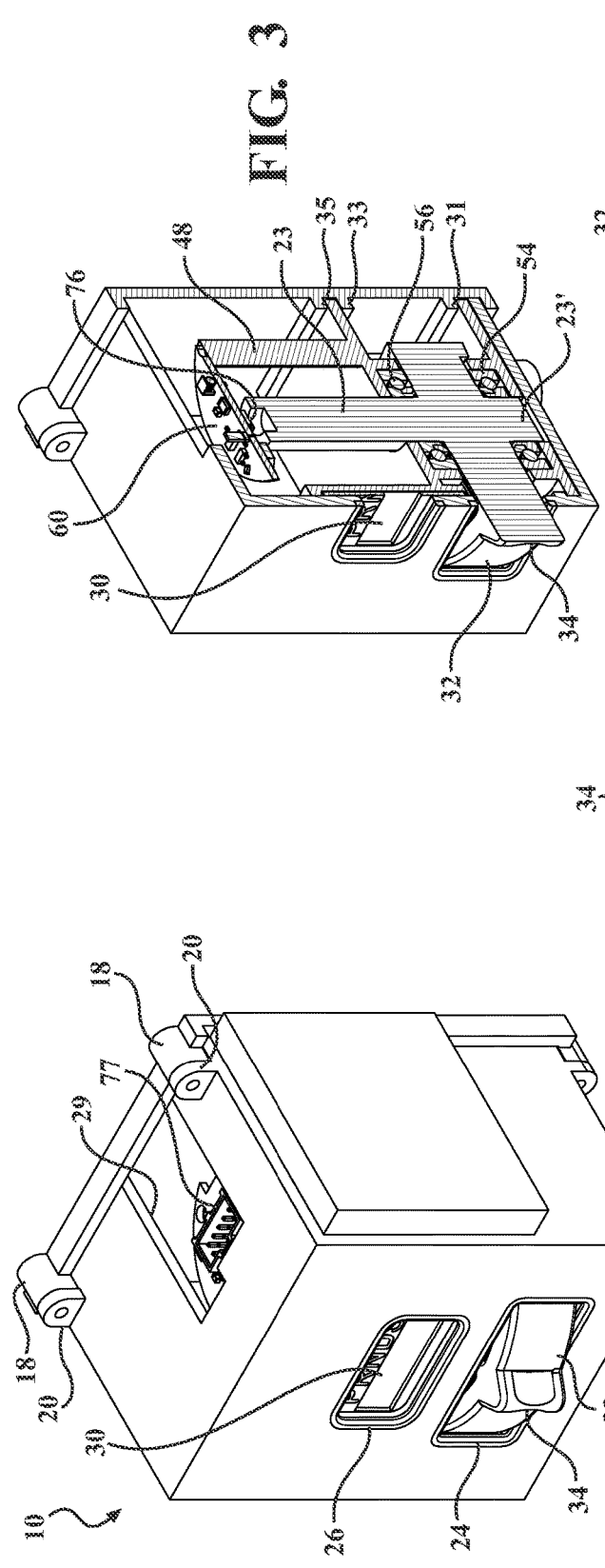
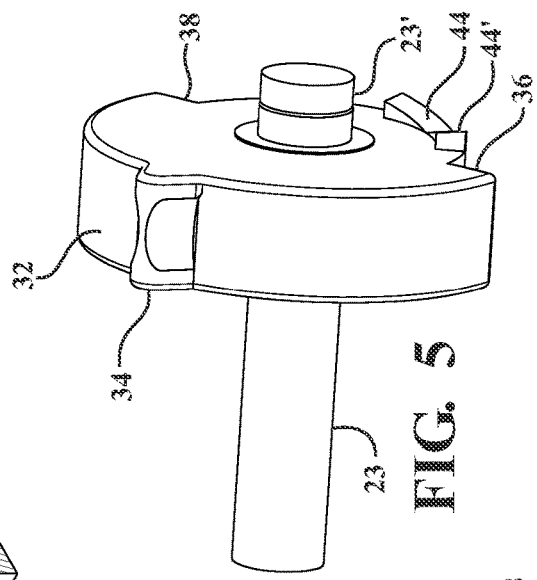
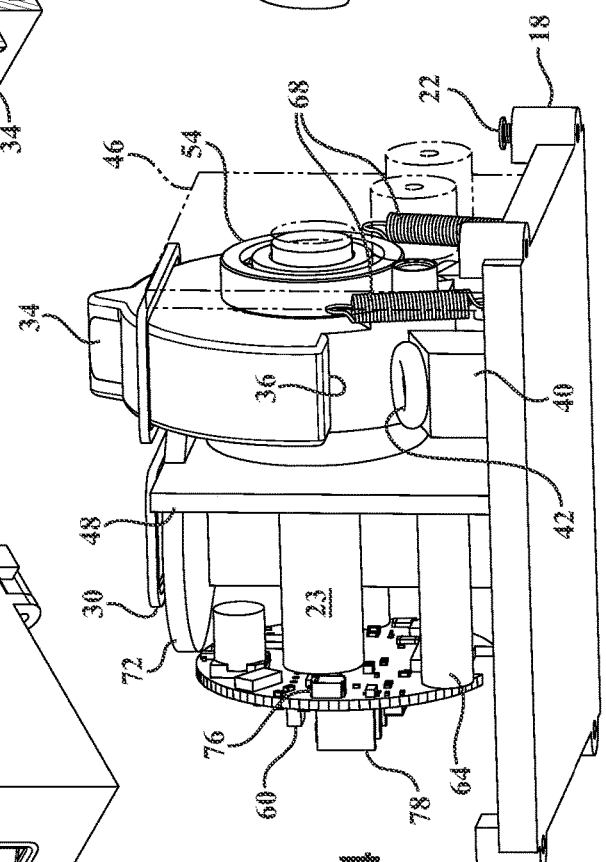

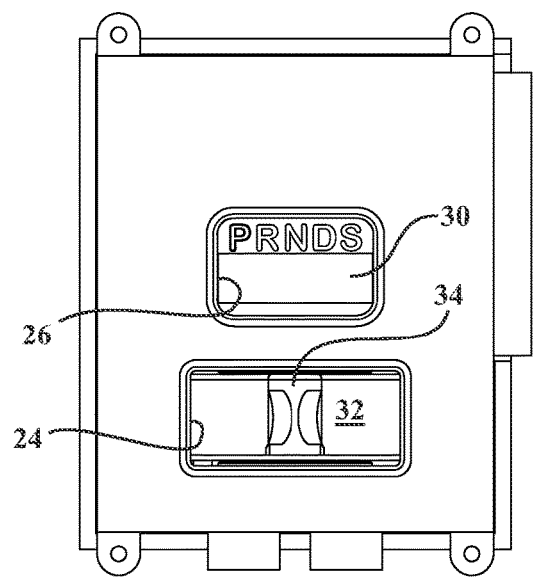 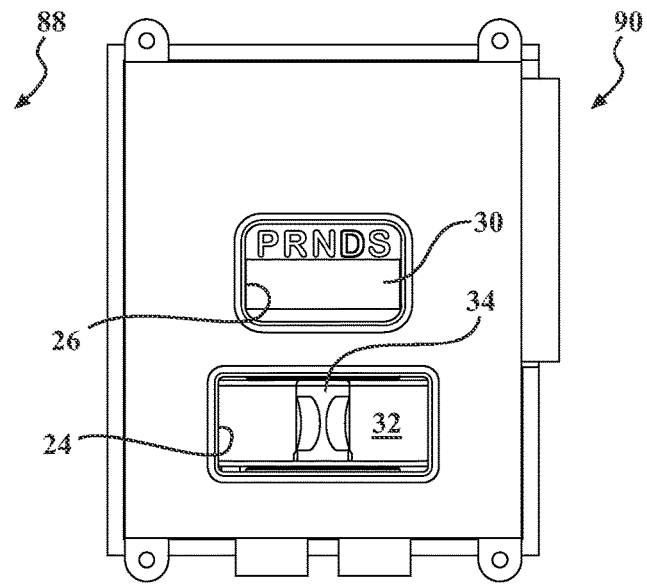
FIG. 13A  FIG. 13B
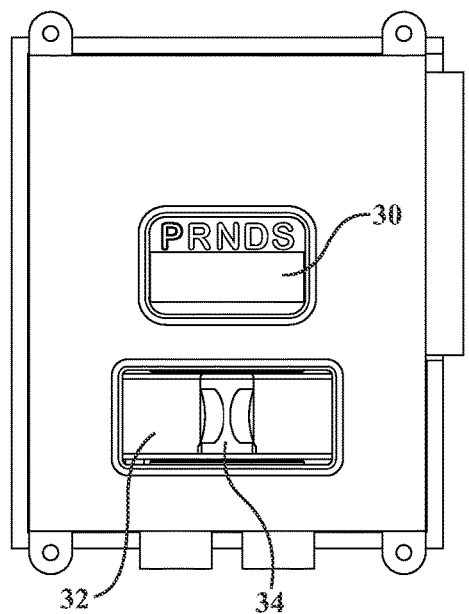 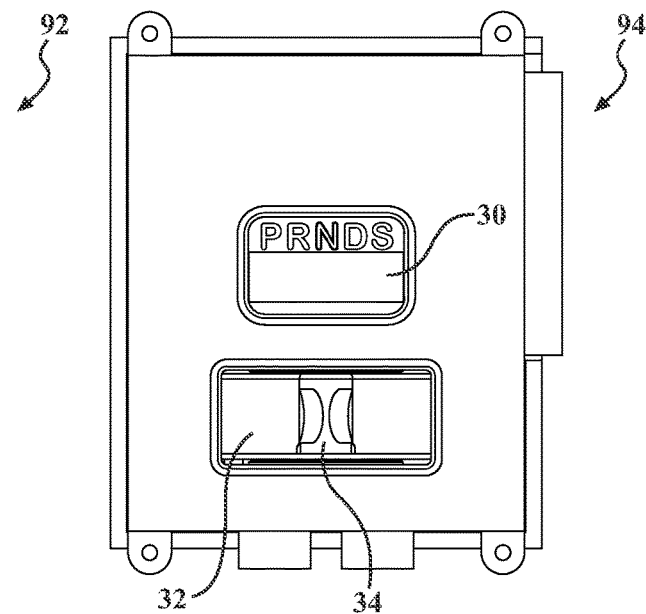
FIG. 14A  FIG. 14B

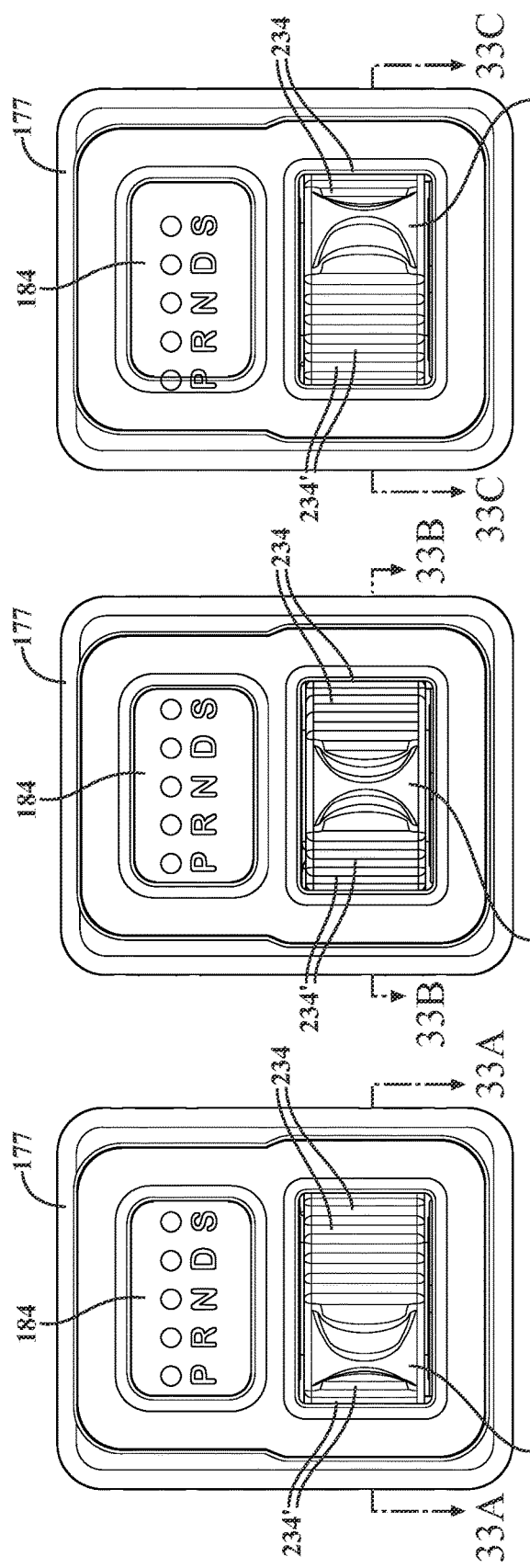
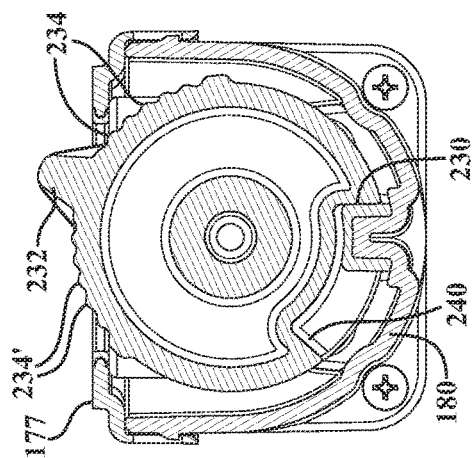
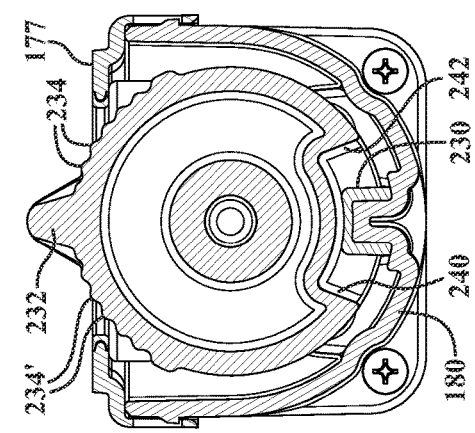
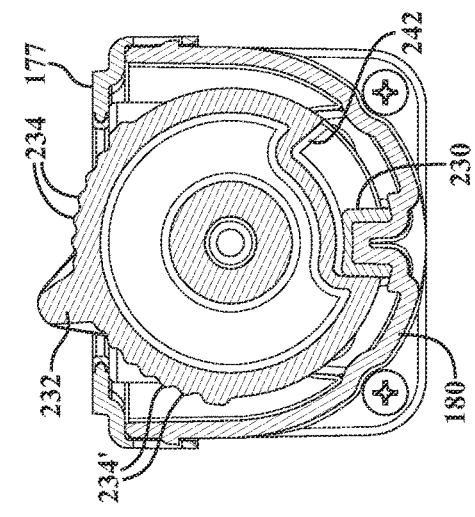

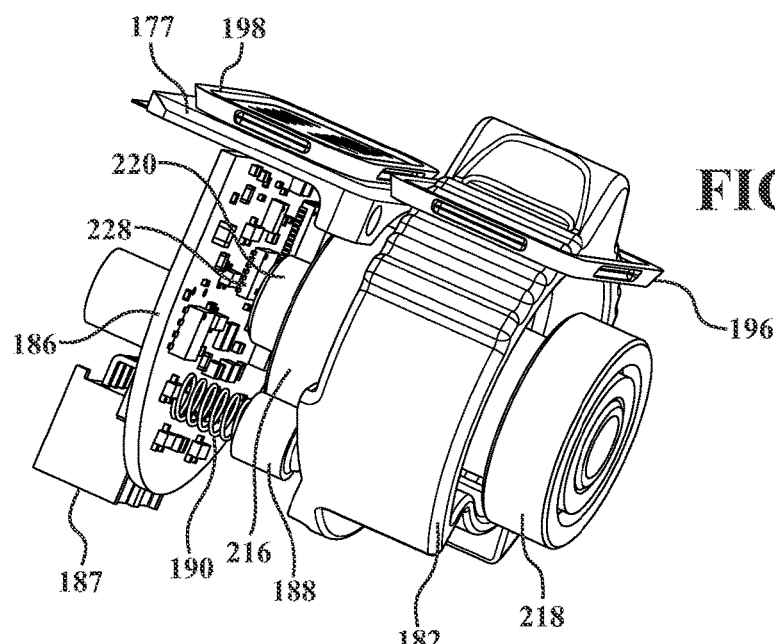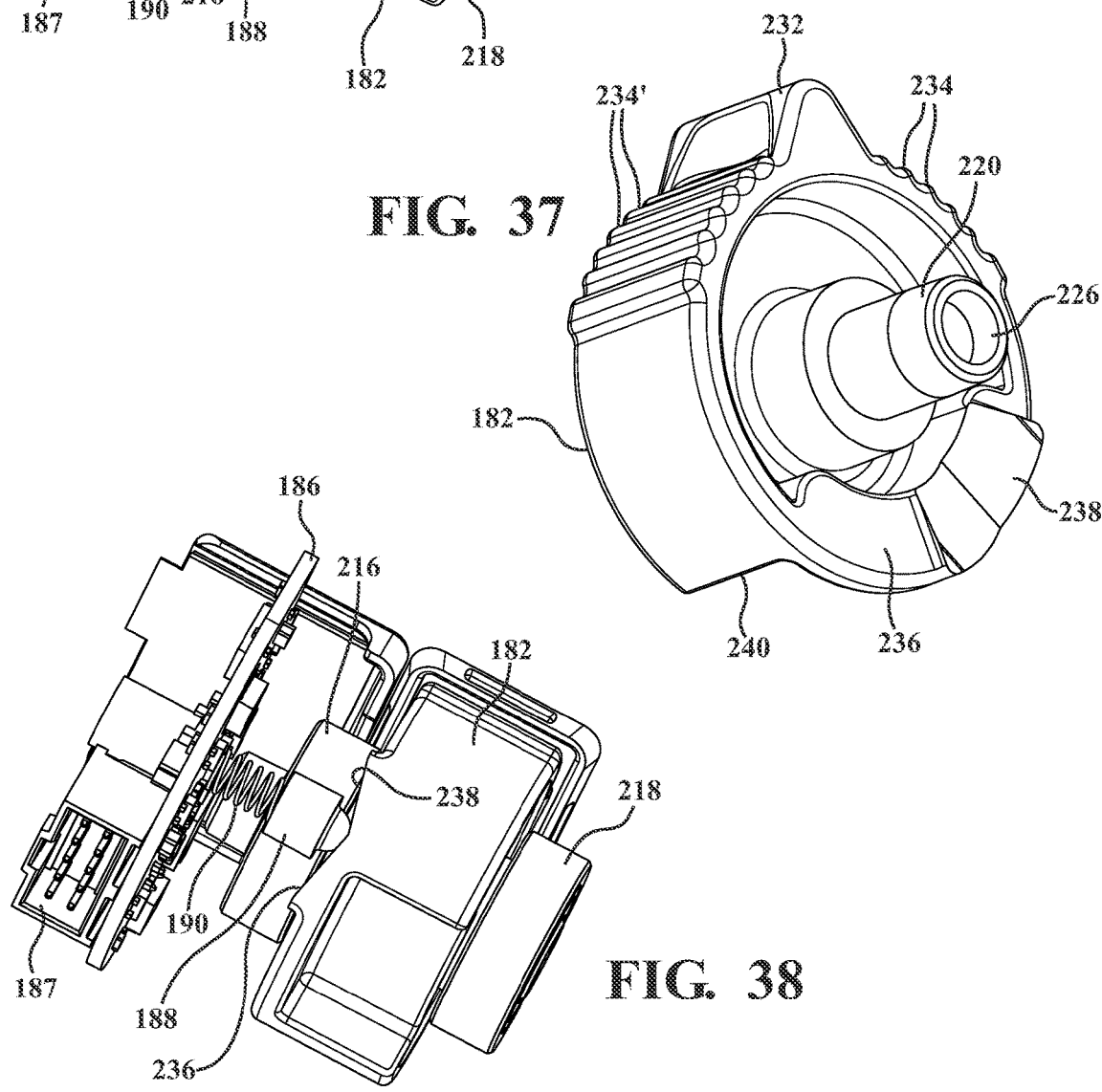

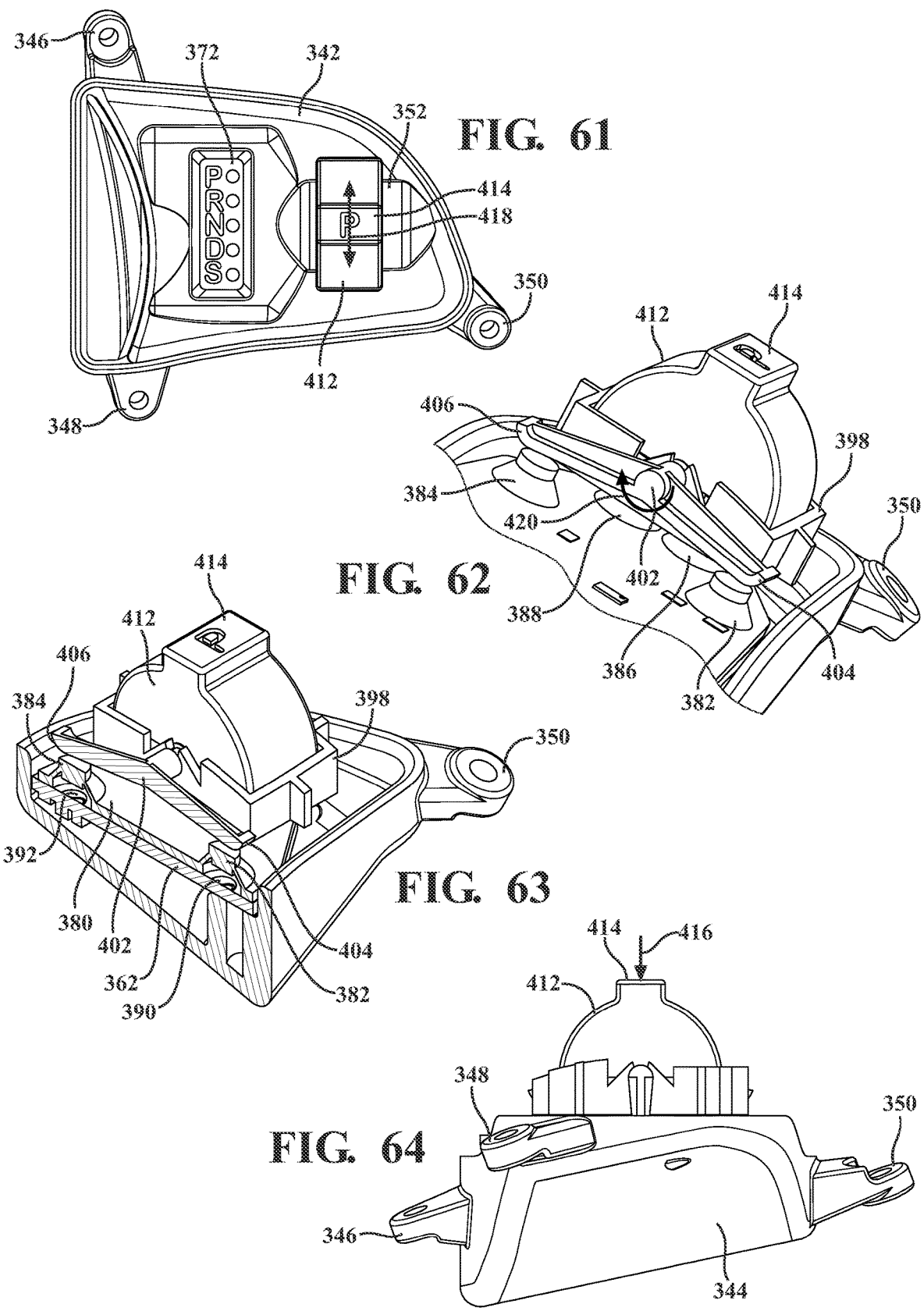

VEHICLE SHIFTER WITH ONE POSITION TOGGLE SWITCH WITH MONOSTABLE/RETURN TO CENTER FUNCTIONALITY

CROSS REFERENCE TO RELATED APPLICATIONS

The present application claims the priority of U.S. Ser. No. 62/979,794 filed Feb. 21, 2020.

FIELD OF THE INVENTION

The present invention relates generally to shifter assemblies. More specifically, the present invention discloses a toggle style shifter adapted to being mounted at varied locations within a vehicle interior according to any desired orientation (steering wheel, stalk, dashboard, IP, etc.). A monostable and return to center toggle switch is integrated into the assembly and which also provides for direct-to-drive and direct-to-park functionality by holding the toggle at an end-stop position for a determined extended time. Shift resistance to the switch is provided by any of a spring and pawl arrangement, torsion or wave spring, or keypad with supporting paddles in order to provide for part count reduction and other advantages in eliminating abrading/rubbing parts.

BACKGROUND OF THE INVENTION

The prior art discloses a variety vehicle shifter designs. A first example of this is disclosed in each of U.S. Pat. Nos. 10,100,919; 10,190,675 and WO 2017/213869 (all to Turney/Kongsberg) and which teach a shifter assembly including a toggle device (see at 52 in exploded FIG. 2) incorporated into a cap aperture situated upon a lever so as to be coupled to a cap 38 and for movement with the cap between first and second orientations. A version of a sensor system is provided for interacting with an element mounted to the toggle device to detect rotation of the cap between the first and second orientations.

Sata US 2014/0116179 teaches a gear change system integrated into such as a vehicle steering wheel or column in the form of a pair of paddle shifters for activating and deactivating a gear change event. A switch includes an activate state and a deactivate state configured to selectively disable operation of the paddle shifters.

Other shifter designs, such as depicted in DeJonge 2004/0226801 (GHSP) or Muraki 2014/0007726 are cumulative of the existing art and disclose other types of vehicle shifter assemblies.

SUMMARY OF THE PRESENT INVENTION

The present invention discloses a toggle shifter assembly having application to any of a gear shifter, windshield wiper control, volume or dimmer control and having a housing rotatably supporting a toggle wheel including an edge protuberance accessible to a vehicle operator. The toggle shifter can be located at any vehicle interior location not limited to a steering wheel, stalk, dashboard, windshield wiper control, volume or dimmer control or other location within a vehicle instrument panel.

In any embodiment, the assembly includes a housing incorporating a monostable toggle switch or component. A number of embodiments provide for detent profiles configured upon the toggle wheel, with a magnet being positioned in proximity to a sensor mounted to a printed circuit board (PCBA) within the housing, such that the magnet displaces relative to the sensor in response to rotation of the toggle wheel. A display component is mounted in proximity to the PCBA.

At least one pawl is supported within the housing and biases against the detent profile such that, and upon the operator actuating the toggle wheel, the pawl is caused to displace relative to the profile in order to rotate the wheel until the accessible edge protuberance abuts a location of the housing, the magnet rotating relative to the PCBA sensor to electronically instruct a shift change by a processor associated with the PCBA. Alternate variants include any of a torsion spring, wave spring, or biasing plunger and key pad paddles for providing the necessary haptic effect upon actuating the toggle in either of opposite monostable directions.

The housing further includes a variety of shaped housings for incorporating into the desired vehicle location with an attachable bottom cover. Any arrangement of plates or bushings can be provided for rotatably supporting the toggle knob or wheel, along with any arrangement of biasing pawls or wave springs within the housing. Other features include a pair of windows defined in an upper face of the main housing for seating each of the toggle knob or wheel and the display component.

The display component further includes any of a thin film transistor, organic light emitting diode or segmented display. A pair of windows are defined in an upper face of the main housing for seating each of the toggle wheel and the display component.

A return to park function provides for the PCBA resetting the shifter to Park in response to a determined external input. Each of a Park Lock and Neutral Lock function is provided for preventing rotation of the toggle wheel to effectuate a gear change unless the PCBA determines a necessary condition for providing electronic shifting. Other features include a direct shift function which, upon toggling the handle in either of opposite directions and holding for a predetermined period of time (such as greater than 2 seconds in one non-limiting variant) results in the PCBA supported microprocessor to shift directly between Park to Drive, Reverse to Drive, Drive to Park or Manual to Park positions.

The housing can also be located into any of a steering wheel, steering column, dash board, console or other location within the instrument panel. In a number of variants, a magnet is secured to the toggle knob or wheel in proximity to the sensor. Alternate variants include an underside arrangement of sensor switches integrated into a paddle and keypad configuration for determining with the toggle knob has been actuated in order for the PCBA to instruct the desired gear position.

In additional variants, the toggle shifter assembly can be incorporated into the steering wheel, and such that rotation of the wheel is complemented by concurrent rotation of the assembly in a manner which maintains upright orientation relative to the operator for ease of access. The assembly can be interconnected mechanically to a central gear or support of the steering wheel in either of a gear train or pulley system.

In a third electrically driven option, a sensor arrangement is employed for converting rotation of the steering wheel into corresponding rotation of the rotary switching element. In a further non-limiting option an electronic adjusting sensor system is provided, such including a steering wheel angle sensor, for continuously reorienting the toggle assembly to an upright position. Other variants include substituting the mechanical or electrical options for physically reorienting the combined display and toggle shifter, and in favor of reorienting a combination display portion of the toggle shifter assembly, in such instance including any type of capacitive or other touch screen display positioned upon the steering wheel.

BRIEF DESCRIPTION OF THE DRAWINGS

Reference will now be made to the attached drawings, when read in combination with the following detailed description, wherein like reference numerals refer to like parts throughout the several views, and in which:

FIG. 2 is an assembled perspective of the toggle switch style shifter assembly of FIG. 1;

FIG. 3 is a rotated and cutaway of FIG. 2 and depicting the rotatable toggle switch component, support bearings and mounting plate components in combination with the outer housing and display components;

FIG. 4 is a perspective of the inner components of the toggle shifter with the rectangular three dimensional housing removed for clarify of illustration;

FIG. 5 is an enlarged perspective of the rotatable toggle switch and depicting a non-limiting representation of an annular profile associated with a wheel shaped portion of the switch and which further depicts a central protuberance for engagement by a user s thumb or fingers, this in combination with opposite end stop configurations for defining an extent of monostable rotation in either of first or second directions;

FIGS. 13A and 13B depict a pair of illustrations relating to an electronic return to park condition in which the shifter provides for returning to park from any gear upon command by the processor;

FIGS. 14A and 14B further illustrate a pair of views of an electronic park lock or neutral lock condition associated with the toggle shifter;

FIG. 32A is a plan view illustration of the toggle shifter assembly of FIG. 30 with the toggle element depicted in a monostable left side and one bump end stop position;

FIG. 32B is a succeeding plan view illustration of the toggle shifter assembly of FIG. 32A with the toggle element depicted in return to center stable position;

FIG. 32C is a further succeeding plan view illustration of the toggle shifter assembly of FIG. 32A with the toggle element depicted in a monostable right side and one bump end stop position;

FIG. 33A is a cutaway view taken along line 33A-33A of FIG. 32A and showing the toggle knob in the left side mono stable end position, corresponding to contraction of the interior spring biased pawl as it displaces along a first side disposed ramp portion of the knob;

FIG. 33B is a cutaway view taken along line 33B-33B of FIG. 32B and illustrating the toggle knob in the center stable position;

FIG. 33C is a cutaway view taken along line 33C-33C of FIG. 32C and showing the toggle knob in the right side monostable end position, corresponding to contraction of the interior spring biased pawl as it displaces along a second interconnected and side disposed ramp portion of the knob;

FIG. 36 is a perspective of the toggle knob, PCBA and spring loaded detent pawl viewed from a different orientation;

FIG. 37 is perspective of the toggle knob and illustrating the configuration of the first and second interconnected and side disposed ramps which illustrate a generally ꞌVꞌ shaped profile against which the spring loaded pawl is biased;

FIG. 38 is a rotated side plan view of FIG. 36 and better showing the pawl and compression spring in biasing contact with the detent profile defining side ramps configured in the toggle knob;

FIG. 61 is an illustration similar to FIG. 56 and depicting the bi-directional motion of the toggle knob;

FIG. 62 is a substantial repeat view of FIG. 58 and depicting the rotational direction of the elongated paddle in contact with the resistance inducing keypad buttons;

FIG. 63 is a further rotated and perspective cutaway view of the toggle assembly of FIG. 55 and depicting the toggle element rotatably supported paddles, keypad, PCBA and sensor switches;

FIG. 64 is an illustration similar of FIG. 60 depicting an inward push to park condition in which depressing of the toggle knob causes the keypad buttons located underneath the inner knob housing to descend into contact with the underside located sensor switches;

DETAILED DESCRIPTION OF THE PREFERRED EMBODIMENTS

With reference to the attached illustrations, the present invention discloses a number of variants of a toggle switch style vehicle shifter assembly, such as shown in each of FIGS. 1, 29, 39, 55, and 69, and which are amenable for configuring at different locations of a vehicle interior including again any of a console, dashboard, steering wheel or steering wheel stalk. As previously described, the toggle shifter is adapted to being mounted within a vehicle interior according to any desired orientation. The assembly further provides both of return to park on command from any gear, as well as electronic park and neutral lock and direct shift functionality upon holding down the toggle knob for a predetermined time interval.

As will be further described in each of the succeeding embodiments, the toggle shifter assembly provides a number of functions including each of providing operator interface for transmission gear selection. Additional functionality includes the ability to orient the assembly for up/down or left/right toggling for gear selection, as well as design flexibility for reduction in size for incorporation into varying locations including steering wheel, steering wheel stalk and any other instrument panel or dashboard location.

Figure 1:
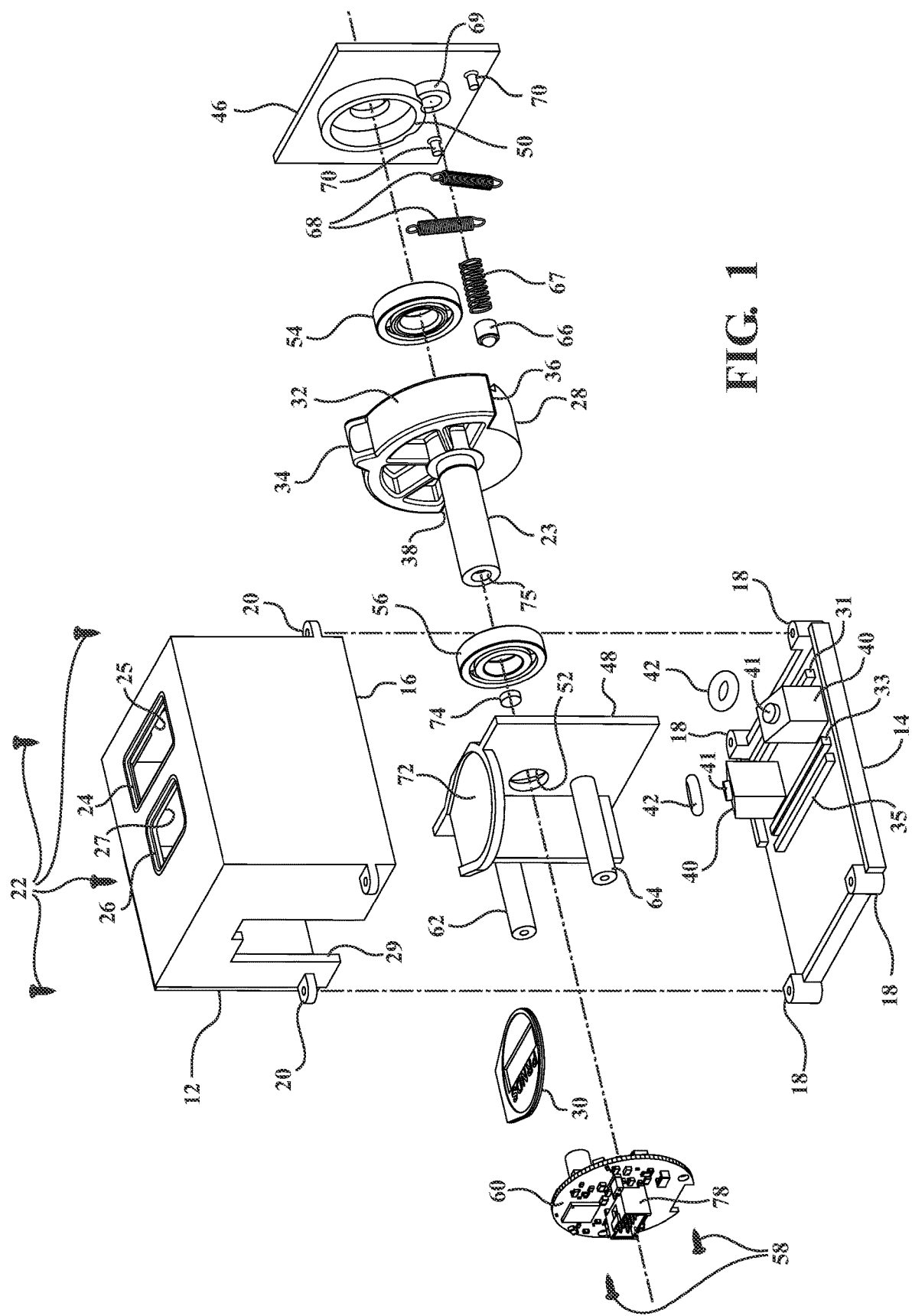
FIG. 1 is an exploded view of a toggle style shifter assembly according to a non-limited embodiment of the present invention and illustrating the combination of housing, rotatable toggle switch, right and left support plates, detent pawls and supporting compression springs, PCBA and TFT/OLED/Segmented display.

With reference initially to FIG. 1, an exploded view is shown of the toggle shifter assembly according to a non-limited embodiment, and which is generally represented by designation of the assembly at 10 in the assembled perspective of FIG. 2. As previously described, the shifter is adapted to being mounted within a vehicle interior according to any desired orientation and includes a monostable and return to center toggle switch integrated into the assembly which also provides for direct-to-drive and direct-to-park functionality by holding the toggle at an end-stop position for a determined extended time. As will be further described, shifter resistance to the switch is provided by any of a spring and pawl arrangement or with a torsion spring, wave spring or other paddle/keypad button arrangement in order to provide for part count reduction and other advantages in eliminating abrading/rubbing parts.

With reference again to FIG. 1, an exploded view is shown of the toggle style shifter assembly according to a non-limited embodiment and includes a main housing 12. The housing can be constructed of any suitable material, not limited to a finished metal and/or a rigid plastic composite. The housing 12 as shown exhibits a three dimensional rectangular interior however can likewise be reconfigured with any other package space defining interior for supporting the various components of the toggle switch style assembly.

A bottom cover is shown at 14 and is secured to an open bottom rim 16 of the main housing 12 via pairs of mating screw receiving portions 18 located at the corners of the bottom cover which align with collars 20 arranged at edge or corner locations about the open bottom rim of the main housing 12 which, upon positioning the main housing 12 over the bottom cover 14, align the collars with the screw receiving portions. Screws 22 are provided for securing the housing 12 and bottom cover 14 together.

A pair of apertures, such as rectangular shaped, are configured within a top face of the main housing 12 and are shown by interconnecting rim edges 24 and 26, the respectively revealing each of the outer annular projecting profile of a toggle switch 28 and a display component 30, this as will be further described including any PCBA and TFT/OLED/Segmented display and which, by non-limiting example, includes each of PRNDS shifter position indicators corresponding to each of Park, Reverse, Neutral, Drive and Sport gears.

The window apertures can include individual bezel displays shown at 25 and 27 seated over the rim defining edges 24 and 26 configured within the housing body 12. The main housing 12 also includes a notched side location 29 and through which exterior wire or cable connectors (such as can be associated with the return to park functionality) can extend to the interior located PCBA (described below at 60). Other features include elongated locating embossments 31, 33 and 35 positioned upon the interior of the bottom cover 14, and which provide location and holding support to the plates 46 and 48 as further described below.

The toggle switch 28 includes each of an extending handle or circular shaft 23 and an annular disk or wheel shaped portion 32. As further best shown in FIG. 5, the wheel shaped portion of the switch further depicts a protuberance or peak 34, for engagement by a user's thumb or fingers, in combination with opposite end stop shoulder configurations 36 and 38 (see also FIG. 5) associated with an outer diameter part of the wheel shaped portion, this defining an extent of monostable rotation in either of first or second directions (further reference being had to FIGS. 7A-7C). The end stops 36/38 are further shown as ledges which are depicted at opposite sides of the wheel shaped portion 32.

Figure 6A:
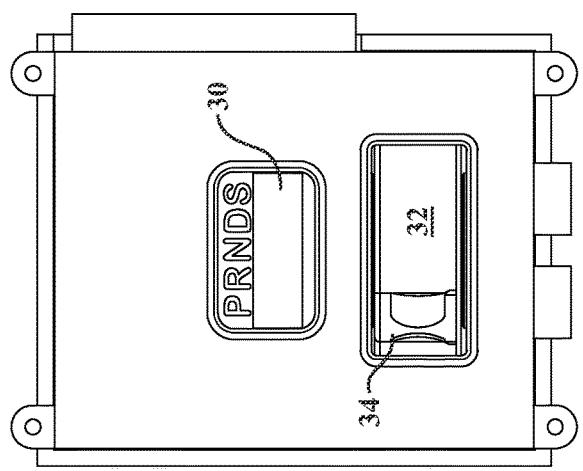
FIGS. 6A-6C depict a series of front plan views of the assembly and with the mono stable toggle switch being depicted in any of left end stop, centered and right end stop positions.
Figure 7A:
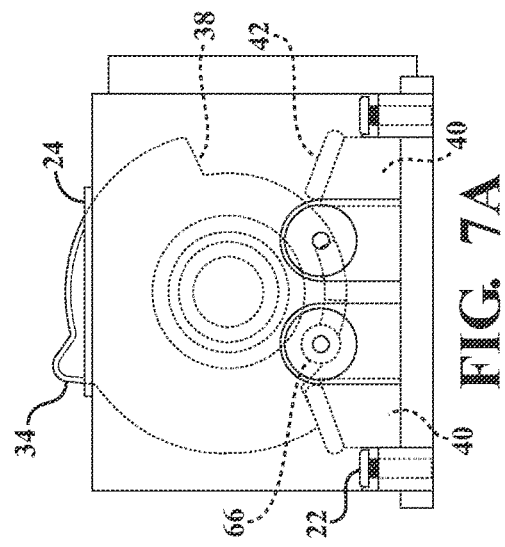
FIGS. 7A-7C correspond with FIGS. 6A-6C and depict a series of ninety degree rotated views of the assembly with the housing depicted in partial transparency in order to show the corresponding positions of the toggle switch relative to opposing support ledges associated with the bottom cover, along with the dampener elements for providing a degree of cushioning contact between the end stop configurations on the toggle switch wheel upon abutting the opposing support ledges of the cover.
Figure 7B:
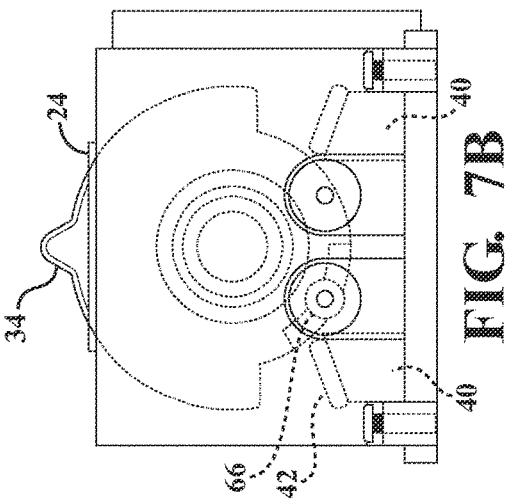
Figure 6C:
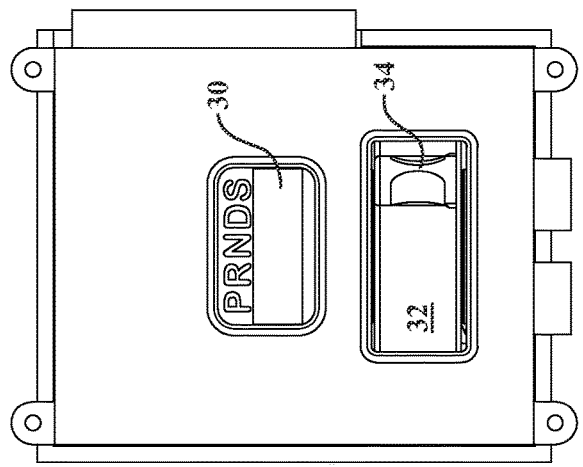
Figure 7C:
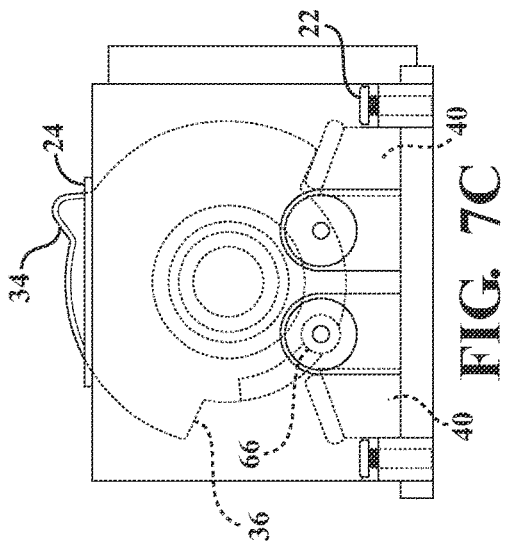

The bottom cover 14 further includes a pair of support ledges, at 40 and as further shown in each of FIGS. 7A-7C, along with the dampener elements (depicted by ring or doughnut shaped portions 42 which respectively seat upon upper angled receiving locations 41 of the support ledges 40) for providing a degree of cushioning and dampening contact between the end stop configurations 36/38 on the toggle switch wheel, and upon these abutting the opposing support ledges 40 of the bottom cover. The wheel portion 32 of the toggle switch further includes a separate detent profile which is referenced by a pair of arcuate and opposite extending ramps (see as shown at 44 and 44' configured upon a side face of the toggle element 28 again in FIG. 5). The pair of opposite increasing ramps 44/44', as will be further described in reference to the associated pawl and detent spring components, provides for an increased resistance (haptic) upon rotating the toggle switch to either of the maximum rotated and monostable end stop positions shown in FIGS. 6A and 6C.

A pair of first (or right) 46 and second (or left) 48 plates are mounted within the interior of the main housing 12 and which include opposing annular recess defining collars (see at 50 and 52) for rotatably seating opposite ends of the toggle switch handle or shaft 23 (this further including opposite extending end portion 23' as shown in FIG. 5). A pair of collar shaped ball bearing components, at 54 and 56, are positioned at supporting locations of the shaft 23/23' on opposite ends of the toggle wheel portion 32 and relative to the plates 46/48 to permit the toggle wheel 32 to be rotated about the shaft 23. Additional fastener screws 58 are also depicted in FIG. 1 and which secure the printed circuit board (or PCBA) 60 to rearward projecting support locations 62 and 64 of the selected left plate 48.

A pawl element 66 and corresponding detent (or compression) spring 67 is supported at an additional seating location or pocket 69 of the right plate 46 (see also FIG. 8) in a manner to bias the pawl element against the ramped portions of the detent profile 44/44' in order to provide a tactile interface with the operator. The tactile or haptic effort/effect can vary depending upon factors such as height of the detent peaks 44/44', the depth of them middle interconnecting trench, the angle between the detent peaks and trench, the surface shape/roughness/material selection of the detent pawl and detent profile, or the associated spring rating of the compression spring 67 or tension springs 68.

In this fashion, and as the toggle switch 28 is rotated in either clockwise or counter clockwise direction, the opposite ramped detent profiles 44/44' (see FIG. 8) alternatively bias against the pawl element 66 and backing compression spring 67 (again supported in seating 69) to generate the necessary haptic resistance. The pair of compression springs 68 can also be alternatively or concurrently employed in order to establish the desired haptic biasing force exerted on the toggle in response to rotation in either direction.

The invention contemplates either a single pawl or multiple pawls supported against the inside seating locations of the right plate 46. The degree of sensed resistance (also effort) is further defined by any of the height component of the ramps 44/44', their angles relative to the flat end surface of the detent wheel 32, the surface shape/roughness or material of the detent pawl and detent ramps, or the spring rate of the compression spring 67.

Also depicted are a pair of tension coil springs 68, which can be provided in an alternate arrangement in which the pawl 66, compression spring 67 and angled ramps 44/44▯ may not be utilized. The alternate configuration of tension coil spring 68 exhibit opposite curled end locations and connecting to each of lower posts 70 configured upon the inside face of the right plate 46 as well as to locations of the toggle wheel 28 as best additionally shown in FIG. 4. In this manner, the rotation of the toggle wheel 32 in either direction is counteracted by a given tension spring 68 in order to influence the wheel to a return to center position.

Figure 10:
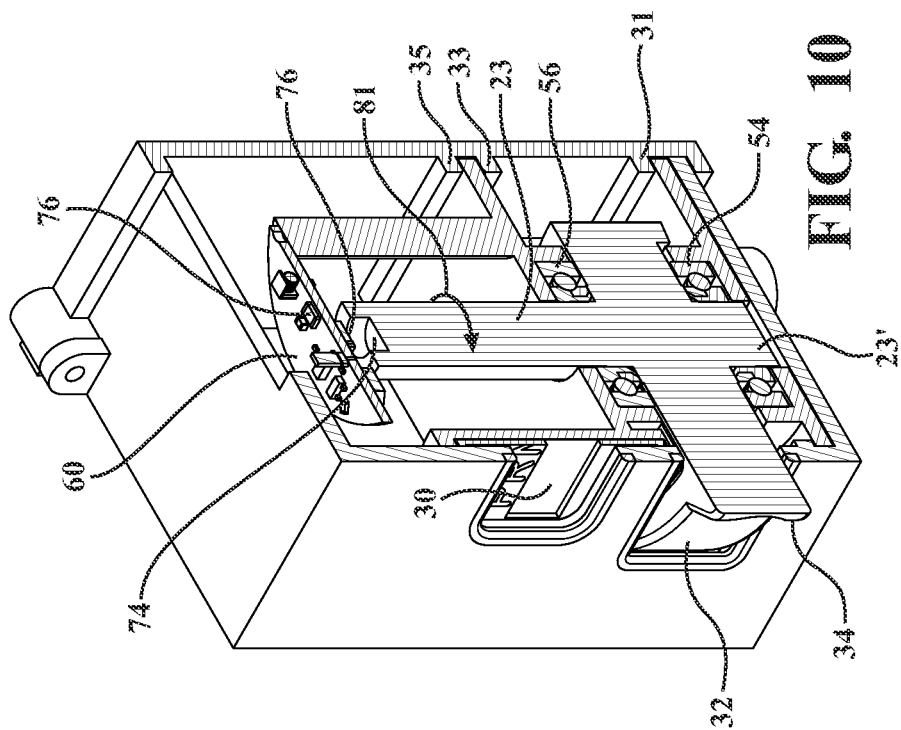

The display component 30 can be mounted atop a flat upper seating location 72 of the left plate 48 (see again FIGS. 1 and 4). A magnet 74 is mounted at a recessed end location 75 of the shaft 30 of the toggle switch and, as best further shown in FIG. 10, is adapted to rotate along with the shaft in proximity to a sensor 76 (see in FIG. 10) located upon a surface of the PCBA 60, the sensor in turn connected to a processor component (not shown) of the PCBA 60 to electronically instruct a change in gear positioning. In an alternate variant, the magnet 74 can be relocated from the toggle switch handle/shaft to another location within the assembly and can be actuated by either of a gear train and/or pulley system (not shown) interconnecting the toggle switch wheel portion 32 with the displacement (rotation) of the magnet 74.

FIG. 2 is an assembled perspective of the toggle shifter assembly of FIG. 1 and depicting the annular surface of the wheel portion 32 of the toggle switch projecting through the selected window 24 of the main housing 12, with the display 30 (TFT/OLED or segmented) likewise projecting through the second annular rim defining window 26. Also depicted is a pin receiving connector 78 associated with the PCBA 60 which is accessible though the cutout location 29 in the housing for receiving a separate connector input (not shown) such as associated with an external wiring harness associated with the vehicle engine control unit and other external sensor inputs (such as associated with triggering a return to park condition).

FIG. 3 is a rotated and cutaway perspective of FIG. 2 and again depicting the toggle switch with integral shaft 30, support bearings 54/56 and left side mounting plate 48 components in combination with the outer housing and display components. FIG. 4 is a further perspective of the inner components of the toggle shifter with the housing removed for clarify of illustration, such including the orientation of the toggle wheel portion 32 sandwiching inner plates 46/48 and display 30. The PCBA 60 and sensor 76 are again shown, as well as the receiving connector location 78 disposed on a reverse underside of the PCBA 60.

Figure 6B:
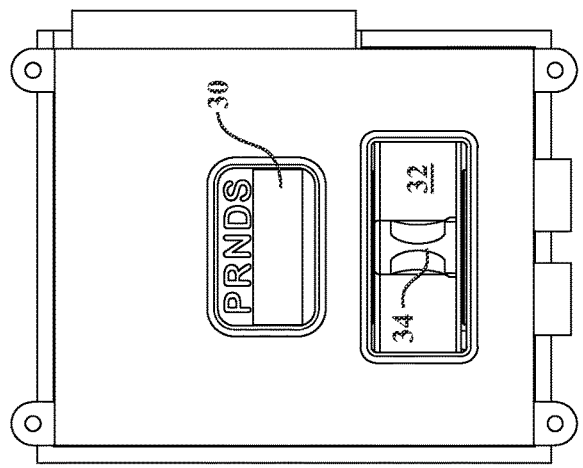

FIGS. 6A-6C depict a series of front plan views of the assembly and with the monostable toggle switch 32 being depicted in any of left end stop (FIG. 6A), centered (also non-actuated as in FIG. 6B) and right end stop (FIG. 6C) positions. FIGS. 7A-7C correspond with FIGS. 6A-6C and depict a series of ninety degree rotated views of the assembly with the housing depicted in partial transparency in order to show the corresponding positions of the toggle switch, by virtue of its end stops 36/38 positioned relative to opposing support ledges 40 associated with the bottom cover, along with the dampener elements 42 for providing a degree of cushioning contact between the end stop configurations on the toggle switch wheel portion 32 upon abutting the opposing support ledges of the cover.

In this fashion, the driver can toggle the switch in either or up/down or left/right directions depending upon the desired orientation of the assembly within the vehicle. The detent profile, pawl/detent materials, and spring rate collectively define the ability of the toggle switch to return to center (monostable) position, following the driver releasing the toggle switch. The toggle shifter accordingly provides one bump gear shifting in any of direction corresponding to Park to Reverse, Reverse to Neutral, Neutral to Drive and Drive to Sport (or reverse order).

Figure 7D:
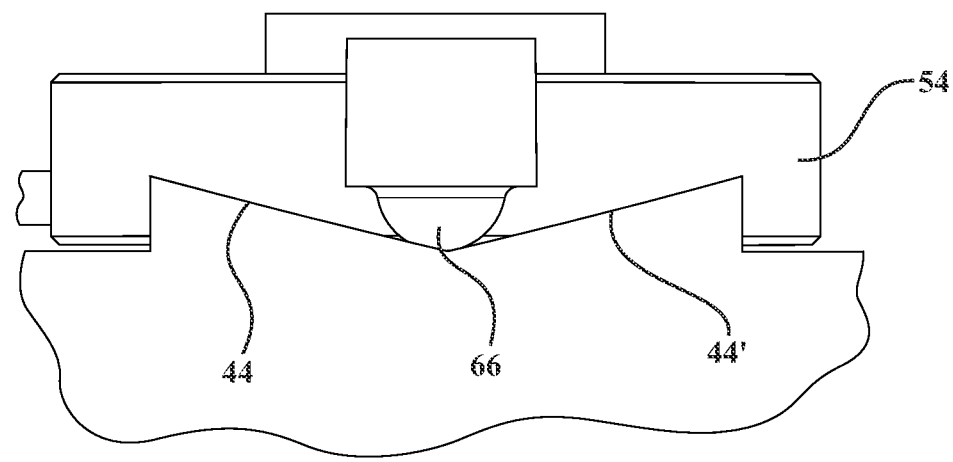
FIG. 7D is a partial view depicting the interface of the spring compressible pawl relative to the toggle switch ramps for imparting haptic resistance as the switch is toggled to either of the positions of FIGS. 7A and 7C.

FIG. 7D provides a partial view depicting the interface of the spring compressible pawl 66 relative to the toggle switch ramps, again at 44, for imparting haptic resistance as the switch is toggled to either of the positions of FIGS. 7A and 7C. The pawl 66 is further depicted in the stabile mono center position centrally located between the outward progressing ramps 44/44‖.

Figure 8:
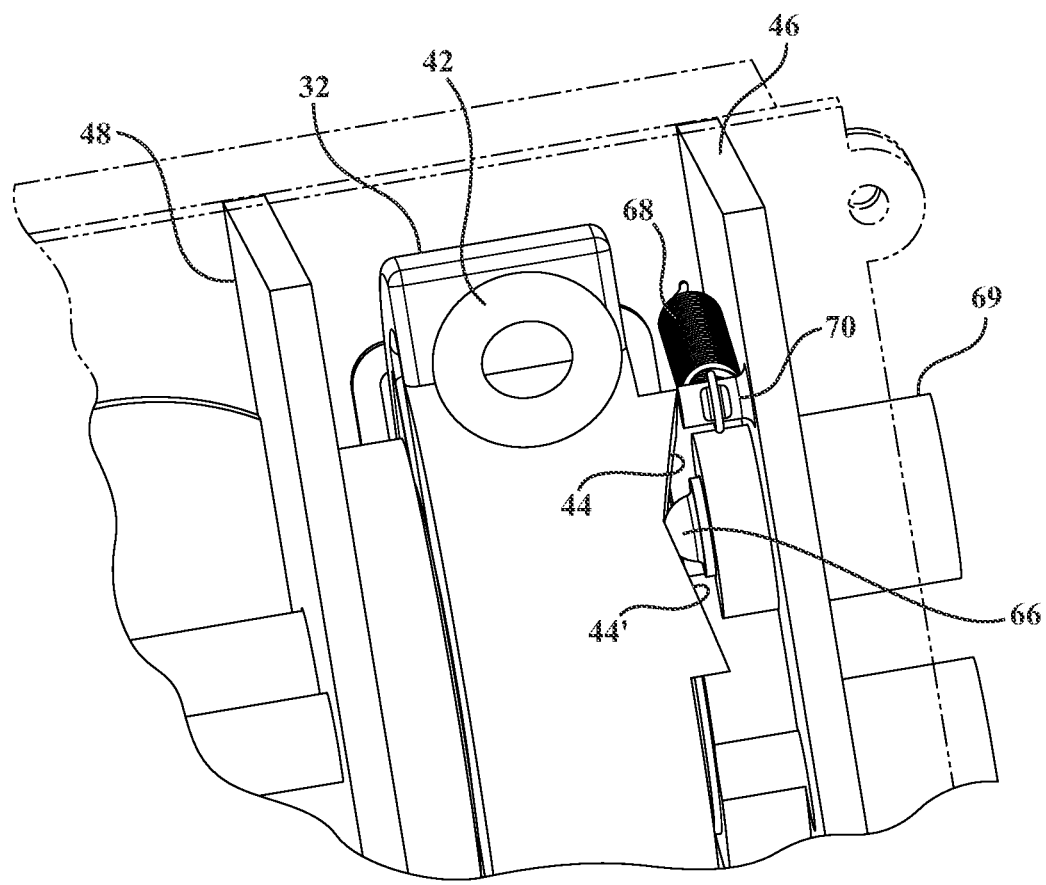
FIG. 8 is a partially transparent view of the toggle switch with wheel and further depicting the arrangement of a detent pawl and backing spring for biasing the pawls against a ramped detent profile configured upon an opposing end surface of the wheel, and in order to vary a compressive force exerted against the toggle wheel as the switch is monostable rotated in either of the first or second directions and the pawl progressively displaces along the ramped detent profile thereby increasing haptic resistance to the point of end stop contact, with subsequent release of the toggle switch resulting in it returning to a center position (FIG. 6B)

FIG. 8 is a partially transparent view of the toggle switch 28 with wheel 32 and further depicting the arrangement of a detent pawl 66 and backing compression spring 67 for biasing the pawl against the ramped detent profile (again angled portions 44/44▯) configured upon an opposing end surface of the wheel 32. This is again accomplished in order to vary a compressive force exerted against the toggle wheel as the switch is monostable rotated in either of the first or second directions and the pawl 66 progressively caused to displace in a compressive fashion against the spring 67 along the ramped profile 44 (again FIG. 5) thereby increasing haptic resistance to the point of end stop contact as depicted in each of FIGS. 7A and 7C, with subsequent release of the toggle switch resulting in a counter bias of the ramp exerted against the pawl 66 causing the toggle wheel to rotate back to its un-deflected center position (again FIGS. 6B and 7B).

As the toggle switch 28 is rotated, the magnet 74 rotates relative to the sensor 76 at designated angular movements, such that the associated processor instructs the change in gear position which is communicated to the vehicle engine control unit (ECU).

Figure 9:
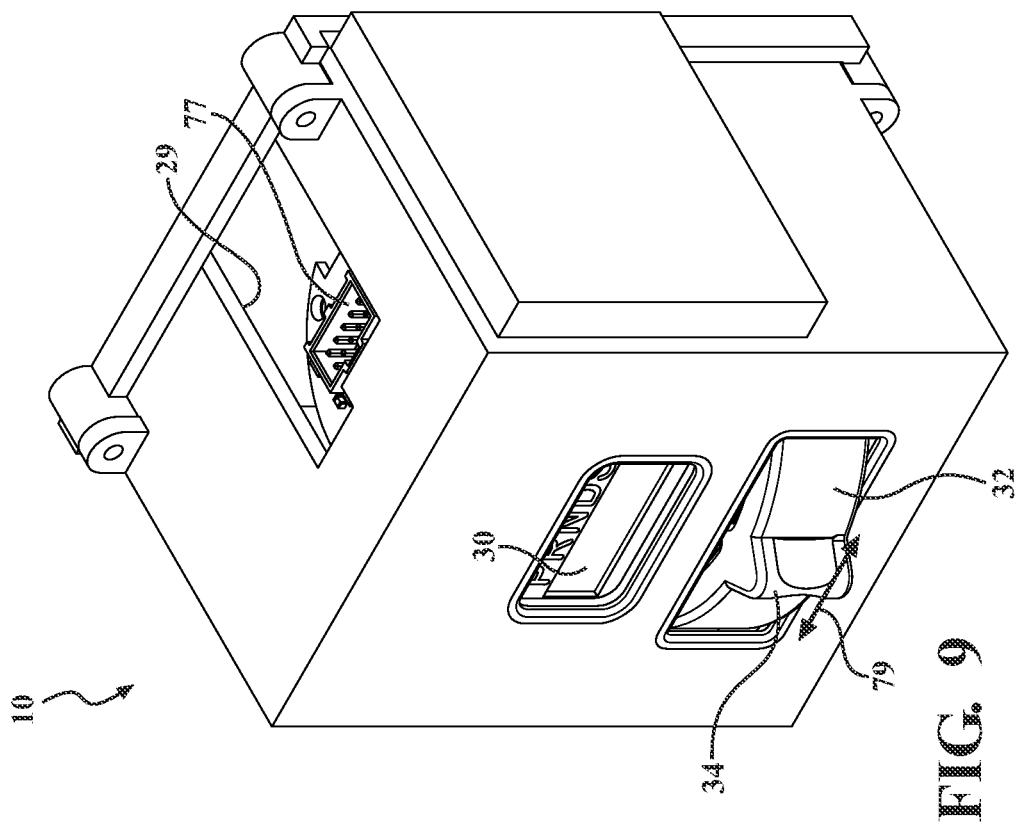
FIG. 9 is a substantial repeat of the illustration of FIG. 2 and FIG. 10 likewise being a substantial repeat of the illustration of FIG. 3 and better depicting the features of the toggle switch and wheel along with end supported magnet which, upon rotation in proximity to a PCBA mounted sensor, signals the associated processor to instruct a gear shift condition.

FIG. 9 is a substantial repeat of the illustration of FIG. 2 and illustrating the bi-directional toggling (see arrow 79) and FIG. 10 likewise provides a substantial repeat of the illustration of FIG. 3 depicting the bi-directional rotation of the toggle wheel shaft (arrow 81) with end supported magnet 74 relative to the PCBA sensor 76, with each better depicting the features of the toggle switch and wheel along with end supported magnet which, upon rotation in proximity to a PCBA mounted sensor, signals the associated processor to instruct a gear shift condition.

Figure 11A:
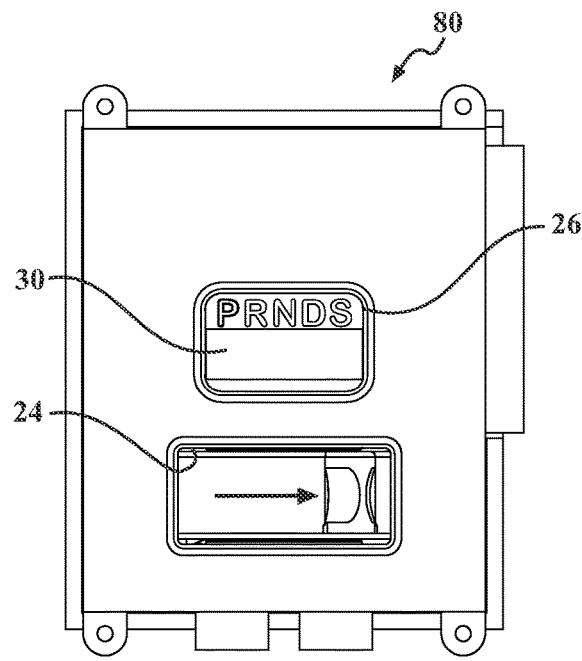
FIGS. 11A and 11B illustrate a pair of views of a direct shift operation, with FIG. 11A instructing a motion for holding the toggle switch in the position also shown in FIG. 6C in order to shift directly to a Drive gear position from either of Park or Reverse, upon which the toggle switch is released to return to a center position of FIG. 11B (also FIG. 6B)
Figure 11B:
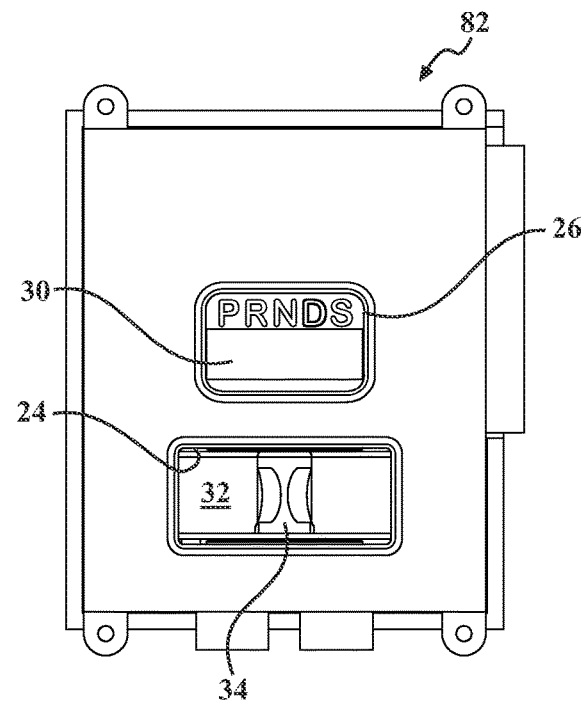

FIGS. 11A and 11B illustrate a pair of views, generally at 80 and 82, respectively, of a direct shift operation, with FIG. 11A instructing a motion for holding the toggle switch in the position also shown in FIG. 6C (such as for any period of time not limited to greater than two seconds) in order to shift directly from Park (see as highlighted in FIG. 11A) to a Drive gear position (see as highlighted in FIG. 11B), as well as from either of Park or Reverse, upon which the toggle switch is released to return to a center position of FIG. 11B (also FIG. 6B). Without limitation, this can occur upon holding the toggle switch to an end-most abutting location on either side of the window rim perimeter 24 for a determined time period such as greater than two seconds.

Figure 12A:
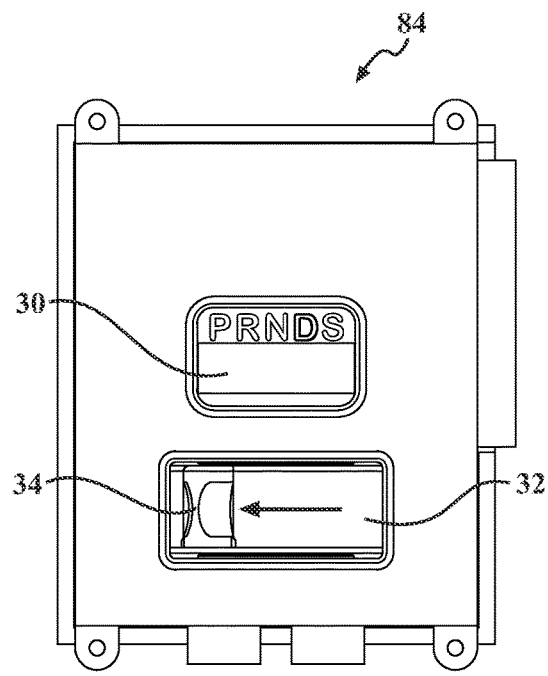
FIGS. 12A and 12B illustrate a pair of views of another function of the direct shift operation, with FIG. 12A instructing a motion for holding the toggle switch in the position also shown in FIG. 6A in order to shift directly to a Park gear position from any of Sport, Drive or Neutral, upon which the toggle switch is released to return to a center position (also FIG. 6B)
Figure 12B:
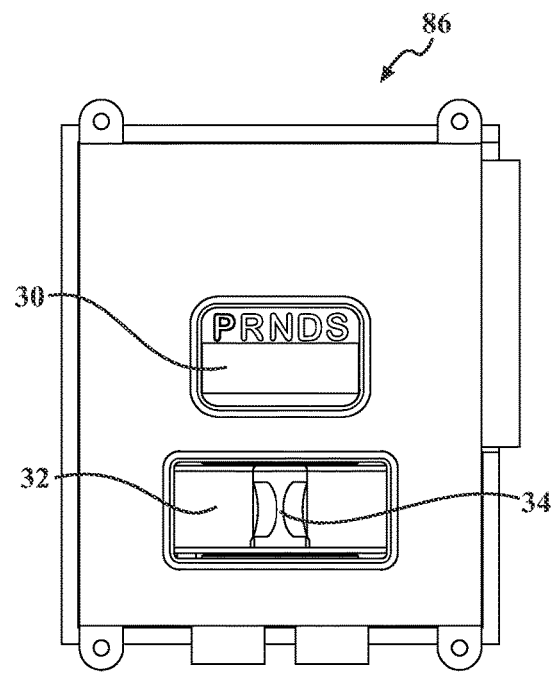

FIGS. 12A and 12B illustrate a pair of views, generally at 84 and 86, of another function of the direct shift operation, with FIG. 12A instructing a motion for holding the toggle switch in the position also shown in FIG. 6A in order to shift directly from such as Drive (as shown) in FIG. 12A) to a Park gear position (see as highlighted in FIG. 12B), as well as from any of Sport, Drive or Neutral, upon which the toggle switch is released to return to a center position (also FIG. 6B). This can again occur by holding the toggle switch to an end-abutting location for a determined period of time (e.g. for greater than two seconds according to one non-limiting processor enabled protocol by which the inter-rotation of the magnet via the PCBA sensor for that period of time will instruct a progressive shift change through the range of gears between the Park and Drive positions).

FIGS. 13A and 13B depict a pair of illustrations, generally at 88 and 90, relating to an electronic return to park condition in which the shifter provides for returning to park (see in FIG. 13A) from any gear (such as Drive as highlighted in FIG. 13B) upon command by the processor. Without limitation, this protocol is enabled by a remote sensor (not shown) which can be communicated with the PCBA via its processor in order to instruct the occurrence of a return to park event. This can include, by non-limiting example, a sensor determining if a vehicle door is open.

FIGS. 14A and 14B further illustrate a pair of views, generally at 92 and 94, of an electronic park lock (FIG. 14A) or neutral lock (FIG. 14B) condition associated with the toggle shifter. In the instance of a Park Lock event, the operator will be required to depress the brake pedal (not shown) in order for the PCBA 60 to instruct the shifter to be released from the Park position. Otherwise, the toggle switch 28 can be displaced within its range of rotation however the gear position will remain in Park. In the further instance of the Neutral Lock, the shifter will maintain the Neutral gear upon command given by the operator, with the toggle switch 32 again being displaced within its range of rotation with the gear position remaining in neutral.

Figure 16:
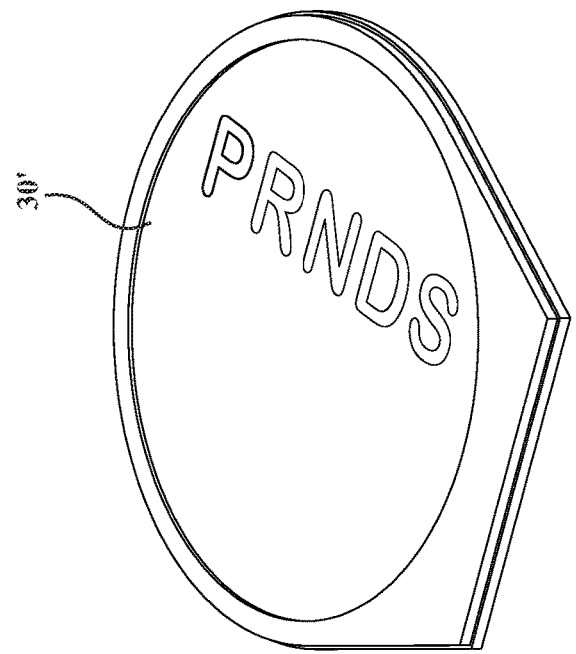
FIG. 16 is a view of a related graphic display illustrating a varied depiction such as which can be accomplished without etching or other customizing processes.
Figure 15:
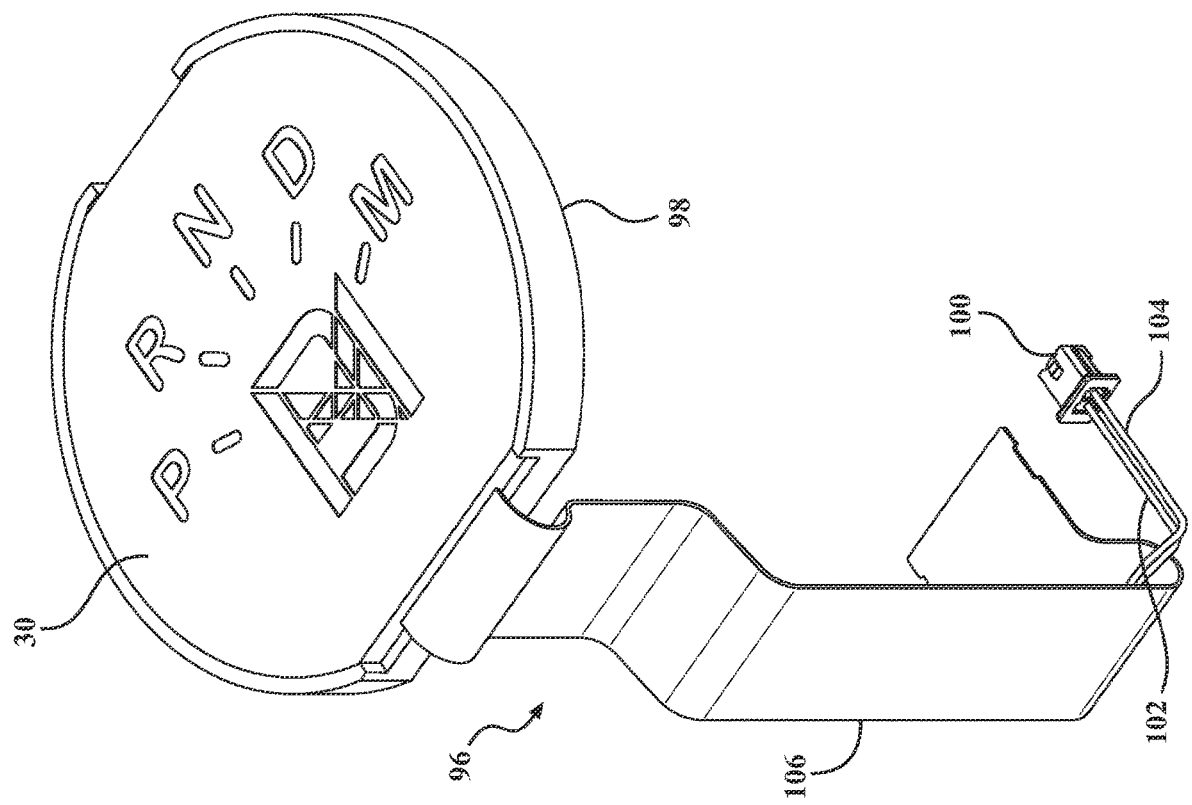
FIG. 15 is an illustration of a graphic display component associated with the shifter assembly and including any of TFT/OLED or segmented display variants.

FIG. 15 is an illustration of a graphic display component, generally at 96 associated with the shifter assembly and including any of TFT/OLED or segmented display variants, again at 30. FIG. 16 further depicts a related graphic display illustrating a varied depiction, see at 30ǁ, such as which can be accomplished without etching or other customizing processes. In each instance, a customized depiction is provided of a plurality of shifter positions PRNDM or PRNDS and by which any of a pixelated or segmented image can be provided on a non-etched (e.g. thin film transistor or organic LED display).

The present invention discloses the display component 30 as being not limited to any improved graphical display for incorporating into a shifter assembly for providing identification of a shifter position. The improved display can again incorporate any of thin film display (TFT), transistor LCD, or organic LED (OLED) display variants and which allows for any representation not limited to color, pattern or intensity to be created within a display surface geometry (again such as not limited to either of a round display in a rotary shifter or a rectangular display associated with a linear gate shifter or the like). The present invention further allows for the use of a clear display surface (not having any painting or etching associated with known shifter position indications PNRDS) and which is only limited by operating software communicated from the associated circuit board and microcontroller.

In each variant, a display housing 98 (see again FIG. 15) is located remote from the PCBA 60 shown in FIGS. 1 and 4 and can incorporate a plurality of LED or suitable illuminating components (not shown). An end connector 100 provides LED backlight power for the segmented display variant. Also shown are connecting wire leads 102/104, each extend from the surface display housing to connect to the PCBA, with the surface display in one variant being generically provided without any specific etched or painted representations and which is modifiable in both color and intensity based upon the inputs received from the PCBA to achieve a desired illumination scheme.

A connector (ribbon shaped) 106 provides LCD (liquid crystal) communication for the segmented display variant as well as providing LED power for the TFT and OLED display versions, and by which individual wires within the ribbon illuminate are communicated to selected segments of the display surface. In this manner, and based upon the collection of individual inputs communicated from the main microcontroller located on the PCBA, a desired illumination scheme is achieved.

Additional features include the programmed surface display (such as associated with OLED/TFT variants) depicting a current selected gear shown in enlarged depiction in the center of the graphical display (such as Drive gear position shown in enlarged fashion in FIG. 15 in a center of the display). The PCBA board again may further include a main microcontroller with a serial communication protocol not limited to any of LIN, SPI, and I2C. Other features include the PCBA board exhibiting the main microcontroller with a serial communication protocol not limited to any parallel interface established between the main microcontroller and the graphic display.

Figure 17A:
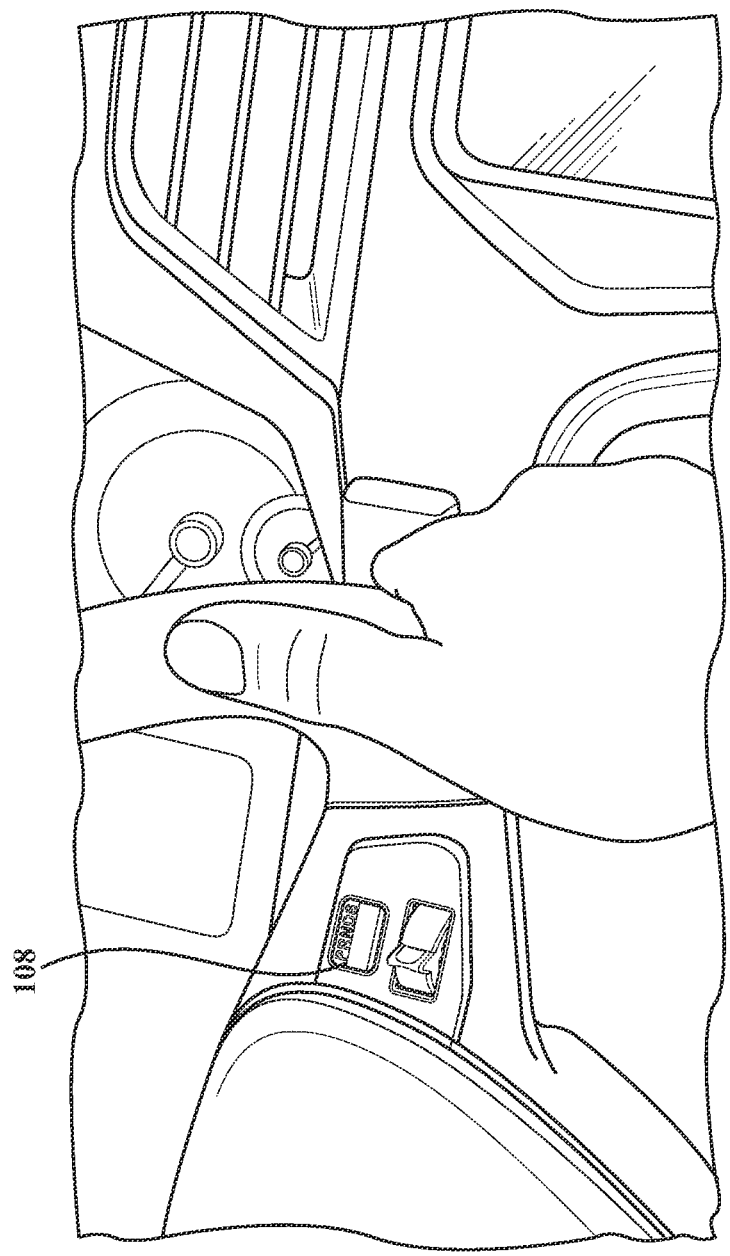
FIGS. 17A-17C depict a series of environmental views illustrating the ability to integrate the shifter assembly to a variety of locations within the vehicle interior not limited to any of the steering wheel, steering wheel stalk, column or dashboard/instrument panel, and by which the PRNDS display can be arranged in either up/down or left/right orientation without limitation.
Figure 17B:
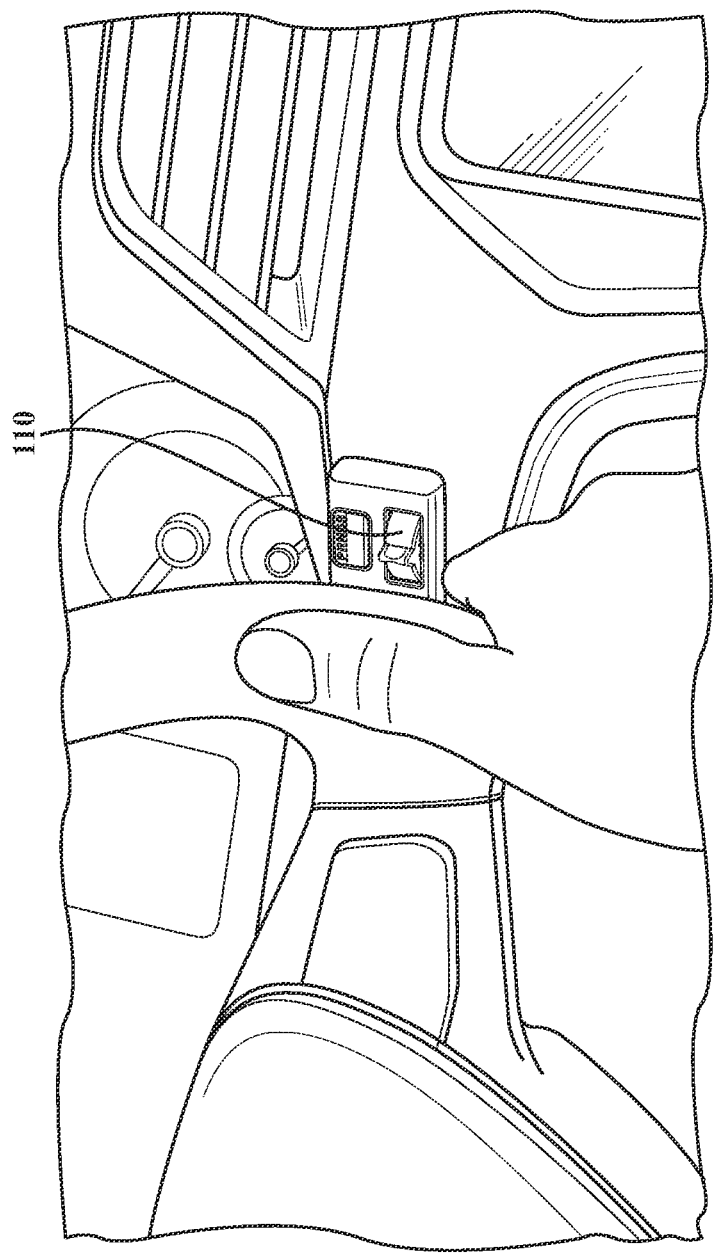
Figure 17C:
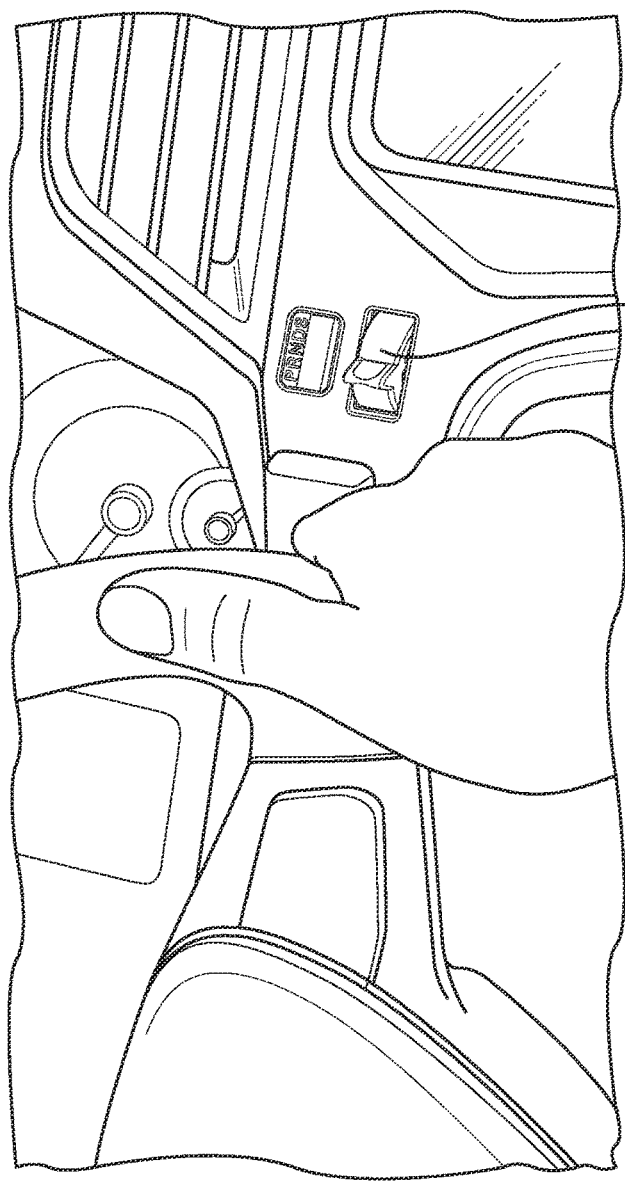
Figure 18:
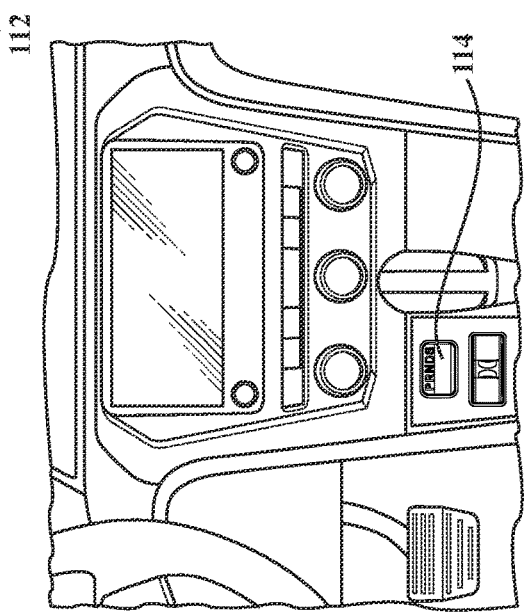
FIG. 18 presents a further environmental view of a toggle shifter incorporated into a center console.

FIGS. 17A-17C depict a series of environmental views illustrating the ability to integrate the shifter assembly to a variety of locations within the vehicle interior, as further shown being not limited to any of the steering wheel (at 108 in FIG. 17A), steering column (at 110 in FIG. 17B), and dashboard/instrument panel or console (at 112 in FIG. 17C). FIG. 18 depicts a further variant of one potential mounting configuration for the toggle shifter assembly associated with the vehicle center console (at 114), such intended to represent the ability to modify the package size and location of the assembly depending upon the mounting environment (i.e. within the steering wheel or column and as opposed to incorporating into the vehicle dash, IP or console). Without limitation, the PRNDS display can extend in either of horizontal or vertical fashion at any installed location, not limited to the steering wheel, stalk, column, IP panel or console.

Figure 19:
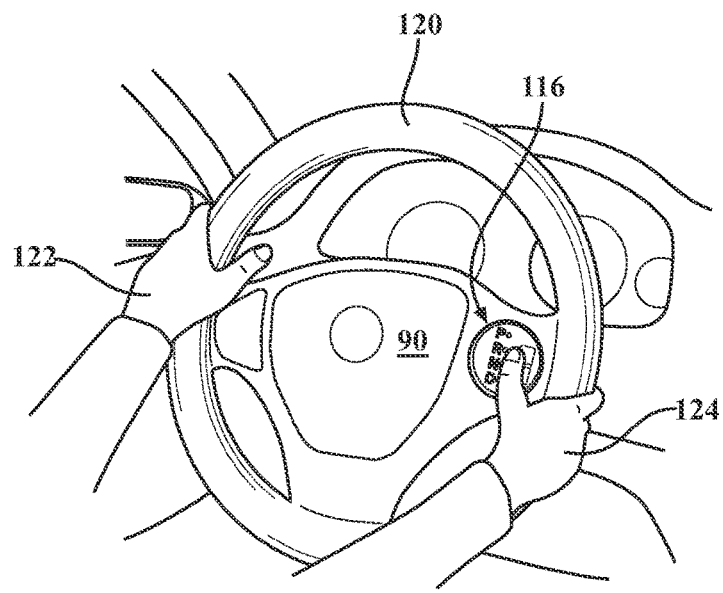
FIG. 19 is an illustration of an alternate mounting arrangement in which the toggle shifter assembly is located upon the steering wheel for ease of access by a user's digit when the hand is supported upon the wheel.

FIG. 19 is an illustration of an alternate mounting arrangement in which a non-limited variant of a toggle shifter assembly is provided and which can exhibit a redesigned rotary shaped housing (referenced overall at 116), such as which is incorporated into a central exposed location 118 of the vehicle steering wheel 120, and for ease of access by a userǁs digit when the users hands (at 122 and 124) are supported upon the wheel 120. As will be described, the redesign of the toggle assembly again includes both the display (at 126 in FIG. 20) and toggle knob or wheel (further at 128) along with all of the other interior components as previously described in the corresponding assembly 10, while also allowing for concurrent rotation/reorientation in response to rotation of the steering wheel 120, this in order to maintain an upright orientation of the assembly at all times.

Figure 20:
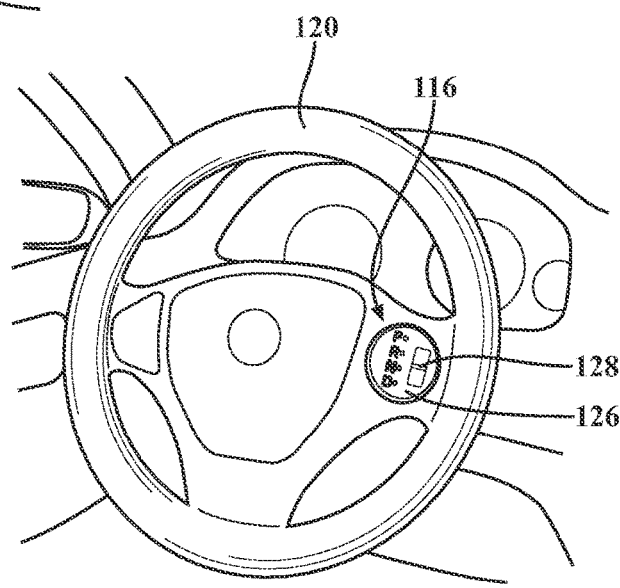
FIG. 20 is a similar illustration to FIG. 19 and with the wheel in a straightened and initial upright orientation.
Figure 21:
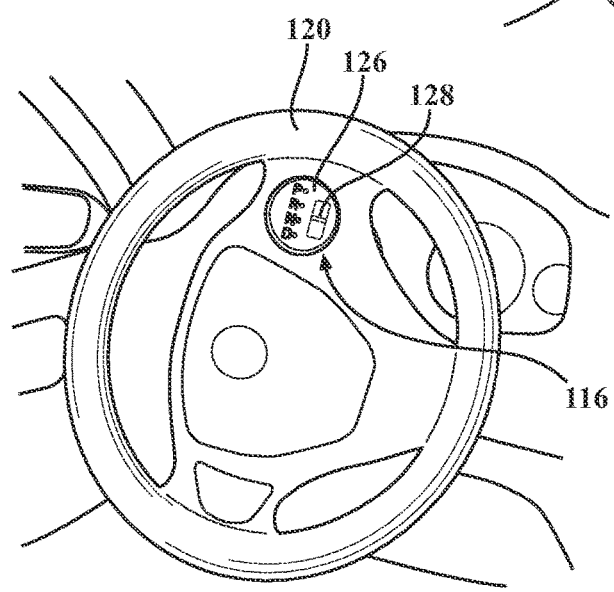
FIG. 21 is a succeeding illustration to FIG. 20 in which the wheel is rotated approximately ninety degrees counter-clockwise, with the toggle shifter being likewise cooperatively rotated within the steering wheel and in order to maintain a continuous upright orientation regardless of the rotational position of the wheel.

FIG. 20 is a similar illustration to FIG. 19 and with the wheel in a straightened and initial upright orientation. FIG. 21 is a succeeding illustration to FIG. 20 in which the wheel is rotated approximately ninety degrees in a counter-clockwise direction, with the toggle shifter assembly being likewise cooperatively rotated within the steering wheel 120, again in order to maintain a continuous upright orientation regardless of the rotational position of the wheel.

Figure 22:
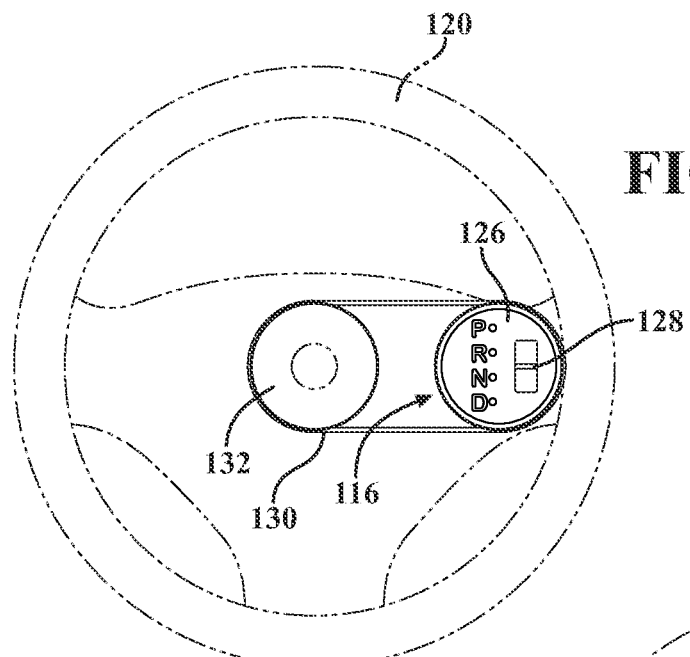
FIG. 22 illustrates a first alternate variant for cooperatively rotating the toggle shifter assembly along with the operator rotation of the steering wheel and which includes a toothed or other frictional engaging drive belt interconnecting the rotary shaped toggle shifter with a central supporting gear incorporated into the steering wheel.

FIG. 22 illustrates a first alternate variant for cooperatively rotating the toggle shifter assembly 116 along with operator rotation of the steering wheel 120, and which includes a toothed or other frictional engaging drive belt 130 interconnecting either of a toothed or frictionally engaging outer circular circumference associated with the rotary shaped toggle shifter assembly 116 and a central supporting gear or like support 132 incorporated into the steering wheel. This mechanical embodiment contemplates a number of sub-variants, including the central located gear or support 132 defining a central rotational axis of the steering wheel 120 and which, upon being rotated by the operator, can in turn be rotated in unison to impart a continuous upright orientation to the circular cross sectional shifter assembly 116. This can further envision the steering wheel supported assembly being supported within a bearing ring or like arrangement (not shown) to allow free rotation in response to being acted upon by the drive belt 130.

Figure 23:
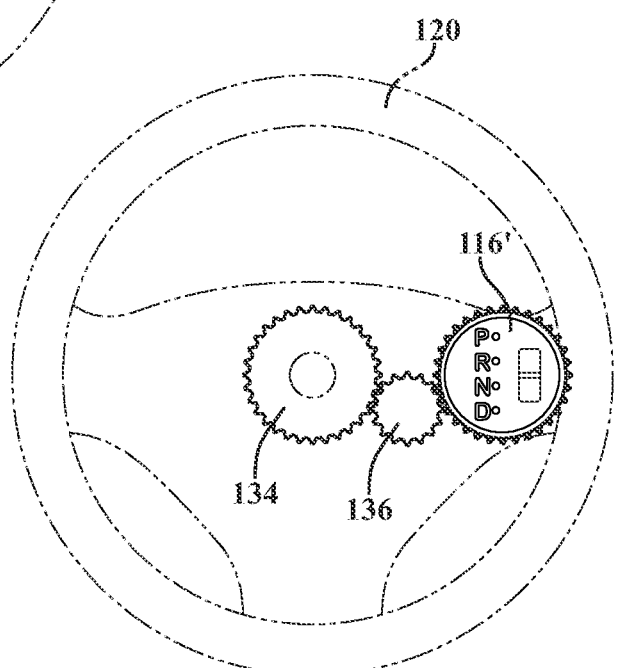
FIG. 23 illustrates a second alternate mechanical variant to FIG. 19 in which a series of interconnected gearwheels are provided for cooperatively rotating the rotary shaped toggle shifter in response to rotation of the steering wheel.

Proceeding to FIG. 23, a second alternate mechanical variant to FIG. 22 is illustrated in which a series of interconnected gearwheels are provided for cooperatively rotating a reconfiguration 116☐ of the toggle shifter in response to rotation of the steering wheel 120. The central gear or support is reconfigured, as shown at 134, and exhibits a toothed outer profile. An intermediate gear 136 is provided and translates the rotation of the central axis defined gear 134 to a toothed exterior of the reconfigured toggle shifter 116☐ in order to effectuate a similar upright maintaining orientation of the assembly.

Figure 24:
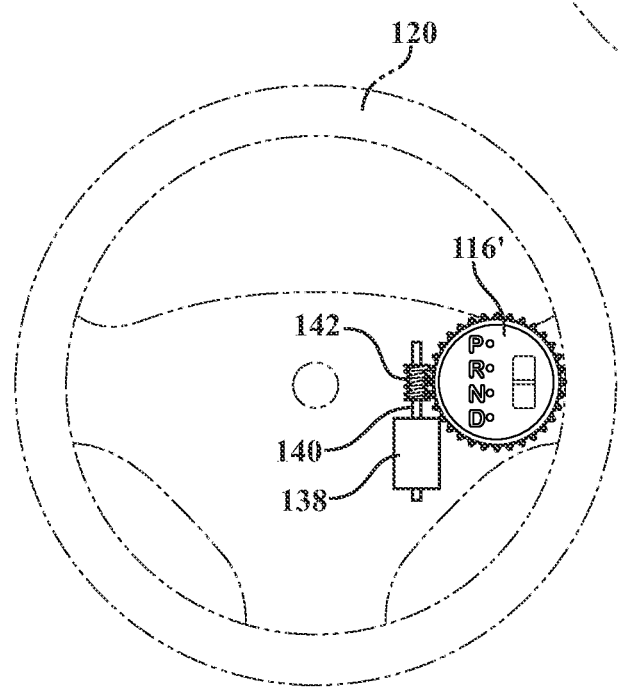
FIG. 24 illustrates a third electrically driven option in which a sensor arrangement is employed for converting rotation of the steering wheel into corresponding rotation of the rotary switching element.

FIG. 24 illustrates a third electrically driven option in which a sensor arrangement is employed for converting rotation of the steering wheel 120 into corresponding actuation and rotation of an electric motor 138 operating as a powered switching element. As shown, an output shaft 140 of the motor incorporates a bevel gear portion 142 which is in turn in contact with the exterior toothed profile of the shifter 116☐ and, upon actuation of the motor by the separate sensor (not shown) translates the degree of rotation of the steering wheel into real-time rotation of the shifter in order to maintain its upright orientation.

Figure 25:
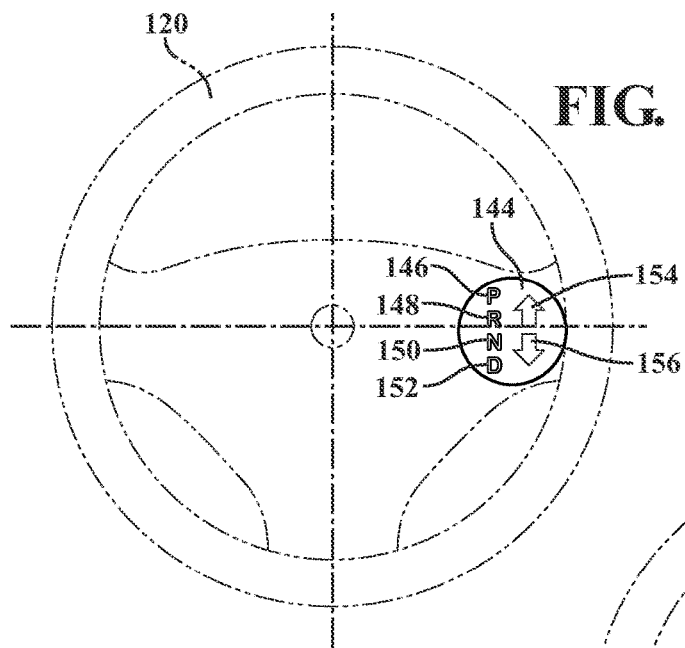
FIG. 25 illustrates a further electronically reorienting variant of a toggle shifter assembly and by which the steering wheel angle is measured with a sensor system for continuously reorienting to an upright viewed position any type of capacitive or other touch screen display positioned upon the steering wheel.

Proceeding to FIG. 25, a further electronically reorienting variant 144 is illustrated of a toggle shifter assembly and by which the steering wheel angle is measured with a similar sensor system (not shown) for continuously reorienting the assembly to an upright viewed position. Without limitation, the assembly 144 incorporates any type of capacitive or other touch screen display including both PRND designations (areas 146, 148, 150 and 152). The toggle element in this specific variant is substituted by an up arrow 154 and down arrow 156 for switching through the gear positions, again through the use of any type of capacitive touch or other touch screen functionality.

Figure 26:
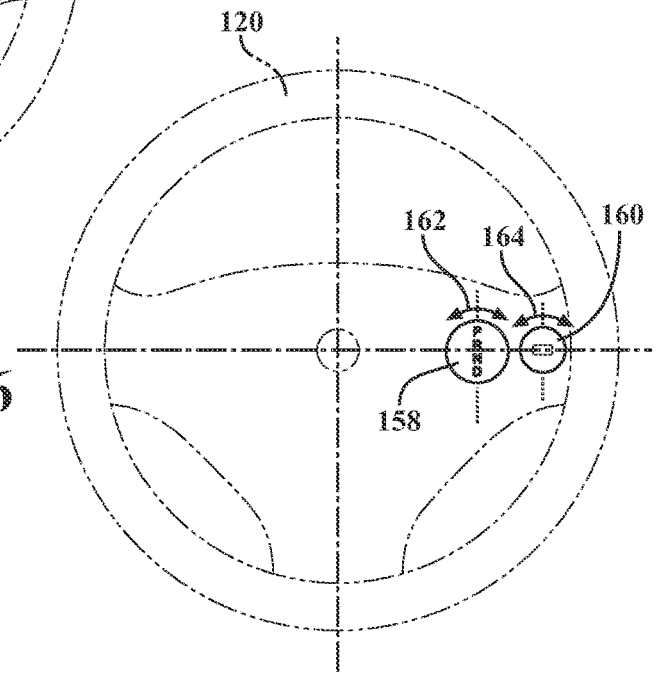
FIG. 26 provides a further variant in which an electronically reorienting display is provided separately along with a separate and likewise reorienting toggle component.

FIG. 26 provides a further variant in which an electronically reorienting display 158 is provided separately along with a likewise rotating/reorienting toggle element 160 (similar to as shown in any of FIGS. 19-24). The individual elements cooperatively rotate (see arrows 162 and 164) in response to any mechanical or electronic input not limited to those described herein and in order to maintain both the toggle element 160 and communicated display 158 in the upright orientation.

Figure 27:
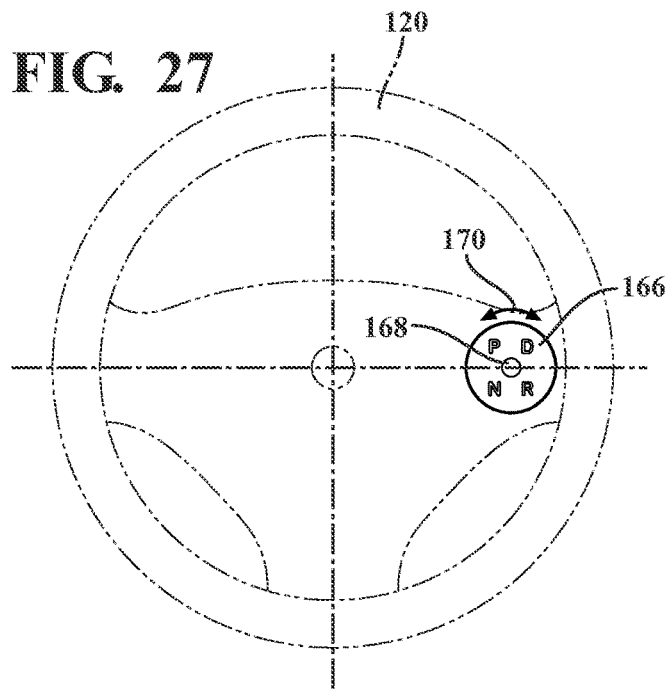
FIG. 27 illustrates a yet further variant of a rotationally adjusting/reorienting display by which a central joystick is incorporated into a redesigned orienting display.

FIG. 27 illustrates a yet further variant of a rotationally adjusting/reorienting display, see at 166, and by which a central joystick or toggle portion 168 is incorporated into a redesigned orienting display. As in previous embodiments, rotation of the steering wheel 120 results in a sensor or other reorienting causing a rotation (see bi-directional arrow 170) of the display in a responsive manner Subset variants of this configuration can include the central joystick or toggle being either fixed or rotatable along with the concentric outer positioned display portion, with manipulation of the joystick providing for shifting between the positions indicated on the display.

Figure 28:
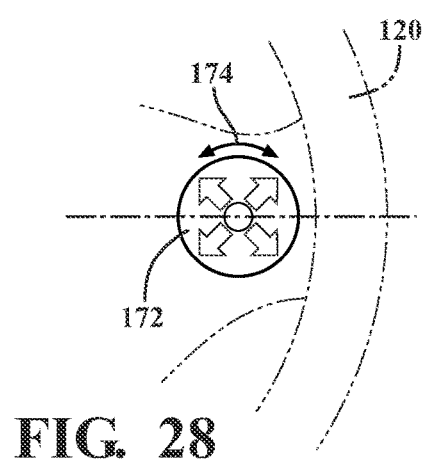
FIG. 28 is a subset variant including an auto-reorienting XY toggle incorporated into a rotatable display.

FIG. 28 further illustrates a subset variant including an auto-reorienting XY toggle 172 (see as further rotatably actuated bi-directionally by arrow 174). In this instance, a separate display (not shown) can optionally be provided at another location of the vehicle (such as fixed) for providing a readout display of a selected shifter position.

Figure 29:
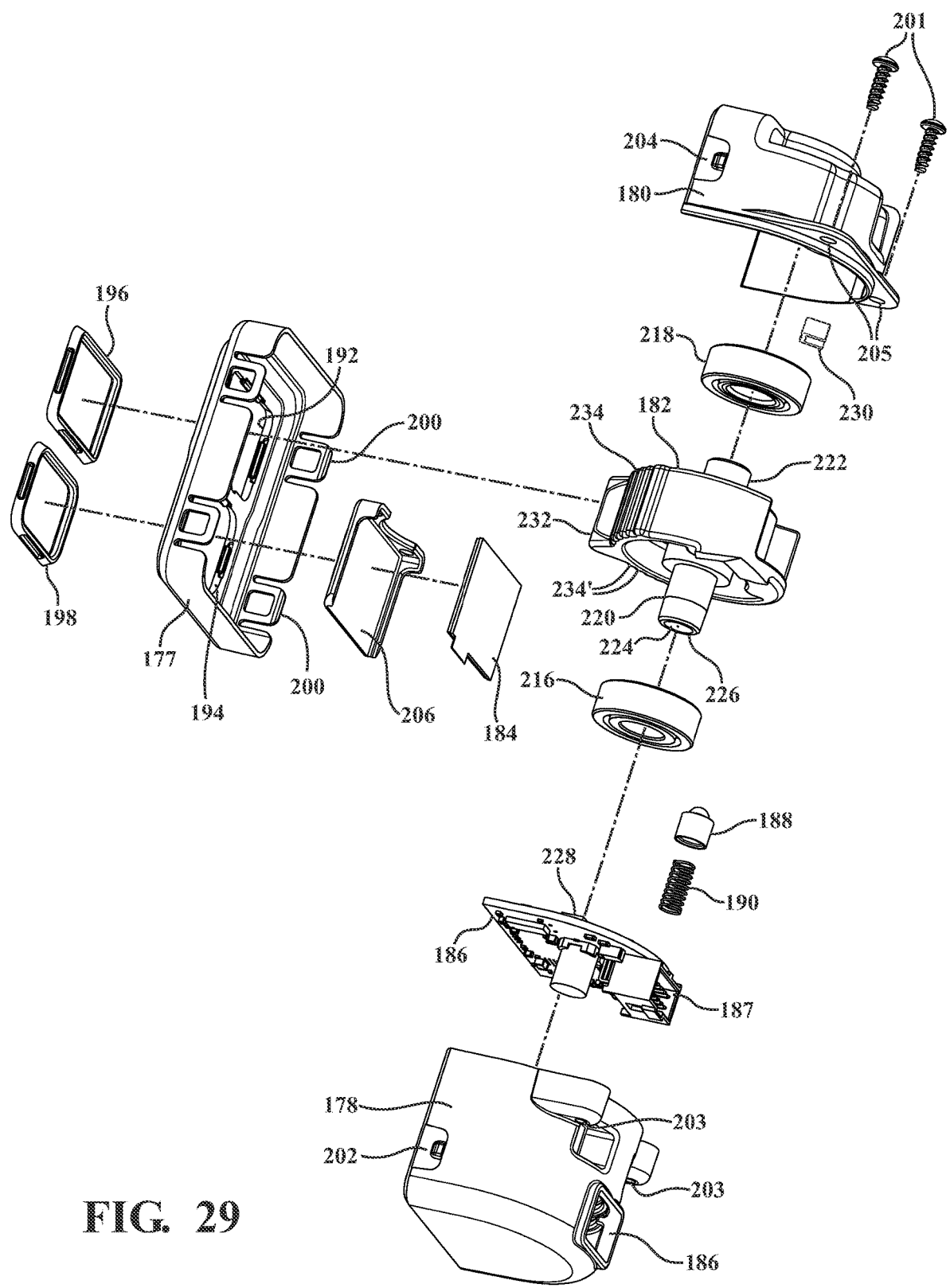
FIG. 29 is an exploded view of a toggle shifter assembly according to a further non-limited embodiment of the present invention and illustrating redesigned upper and split lower housing portions for housing a toggle wheel or knob, along with a TFT/OLED/segmented display, PCBA, detent pawls and supporting compression springs.
Figure 30:
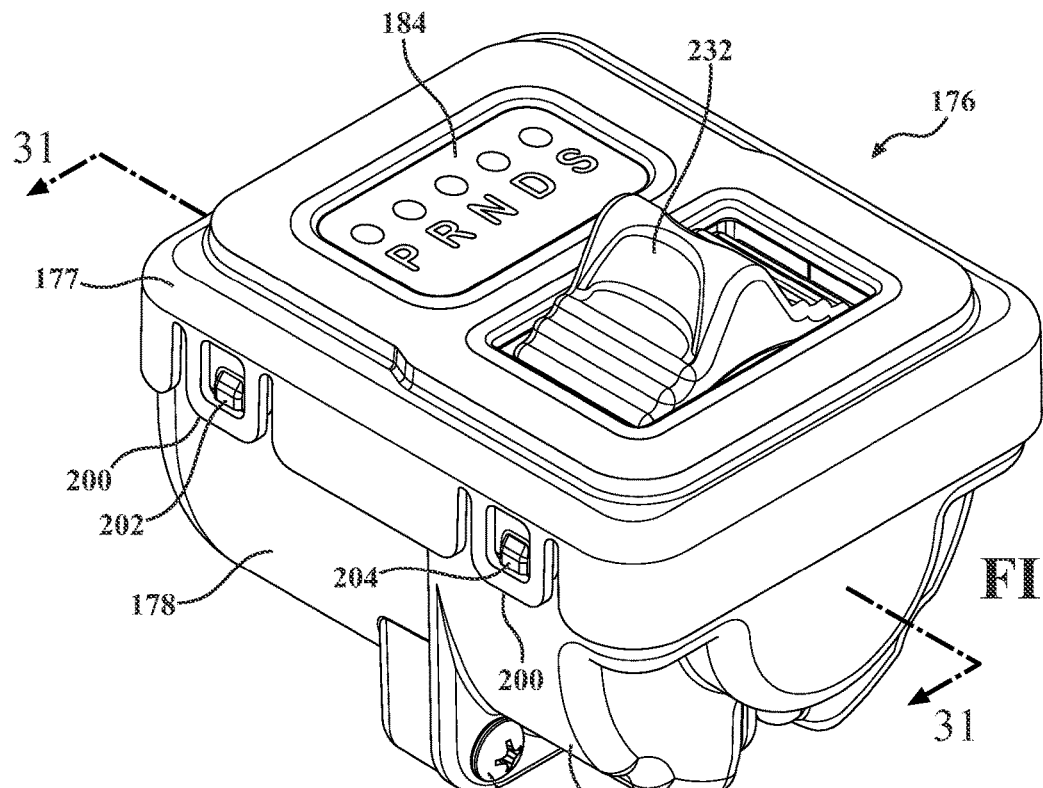
FIG. 30 is a perspective assembled view of the toggle shifter assembly of FIG. 29.

Proceeding now to FIG. 29 is an exploded view is shown of a toggle shifter assembly (see also generally at 176 in the perspective assembled view of FIG. 30) and according to a further non-limited embodiment of the present invention for incorporation into any of dash mount, instrument panel mount, console mount applications. The toggle shifter illustrates an upper housing 177 and redesigned split housing portions (right hand 178 and left hand 180) for defining a package interior and housing a toggle wheel or knob 182, along with a TFT/OLED/segmented display 184, PCBA 186, detent pawl 188 and supporting compression spring 190.

The upper housing 177 includes a pair of apertures or cutouts defined by perimeter rim edges 192 and 194, these respectively receiving window shaped bezels 196 and 198 for each of the toggle knob 182 and display 184. Interassembly of the upper housing 177 to the joined lower housings 178/180 include apertured edge tabs (a pair of which are shown at 200) in the upper housing which engage aligning upper side projections (further at 202 and 204) associated with the assembled lower housings 178/180. Additional mounting screws 201 are provided for securing the split lower housing portions together via aligning pairs of apertures 203 and 205 formed in the housing portions 178 and 180.

A lens 206 seats against an underside of the upper housing 177 surrounding its rim defining cutout location 194, the lens optionally including a central upper embossed area which seats within the cutout and mates with the associated bezel. The lower housing split portions 178/180 can include any arrangement of interior walls or supports (see wall 207 along with supports at 208 and 210 in FIG. 31 cutaway) for locating and securing the PCBA 186 relative the toggle element 182. Although not clearly shown, one or more annular collar shaped supports (see further at 212 and 214 in FIG. 31) can be located within each of the lower split housing portions 178/180 with the collar shaped support 212 being configured upon a face of the interior wall 207 opposite the PCBA 186 and the collar support 214 configured upon an opposing inner end wall of the other lower split housing 180.

A pair of ball bearing style bushings 216 and 218 are provided which seat within the annular interior of the collar shaped supports 212/214 and which are supported opposite extending shaft portions 220 and 222 of the toggle knob 182. End magnet 224 is secured (such as by end molding) into a receiving end location 226 of the shaft portion 220 and so that, upon assembly, the magnet is located in proximity to the PCBA mounted sensor (see at 228 in FIG. 31). As further shown, the PBA 186 includes a separate harness receiving connector 187 which, upon installation, is revealed through a cutout 189 in the right side spilt housing 178.

As further shown in FIG. 29, a curved or clip shaped overmold portion is depicted at 230, and which can be formed either initially with the left side split housing 180 or can be formed in a second shot injection over-molding step into the open facing cavity interior of the left side housing 180 (see also as shown in each of FIGS. 33A-33C). The toggle knob 182 is constructed similar to that correspondingly depicted at 28 in FIG. 1 and, as further shown in FIG. 37, includes an annular outer profile including a finger or thumb peak 232, along with corresponding and proximate located knurled or roughened features 234 and 234ʹ proximate to either side of the peak 232, and to facilitate gripping during toggling actuation of the knob.

As further shown in the perspective of the toggle knob in FIG. 37, a side profile (such being arranged perpendicular to the annular outer profile) can further be illustrated by first and second interconnected and side disposed ramps, see at 236 and 238, which illustrate a generally ꞌVꞌ shaped profile against which the spring loaded pawl 188 is biased. The toggle knob further exhibits an arcuate recess configured into its annular side wall (see as further collectively represented by recessed end walls 240 and 242 in FIGS. 33A-33C), such that the toggle knob 182 is positioned within the left side housing 180 in a manner which causes the interior positioned over mold portion 230 to seat within the arcuate slot in a fashion which limits either of bi-directional rotation, and until the opposite end walls 240/242 come into contact with the over mold portion 230 (this further corresponding to the spring loaded pawl 188 in contact with the opposing angled ramps 236/238 (FIG. 37) during either or bi-directional limited rotation of the toggle knob in a monostable (see again FIG. 32A/FIG. 33A and FIG. 32C/FIG. 33C) and return to center (FIG. 32B/FIG. 33B) fashion.

Figure 31:
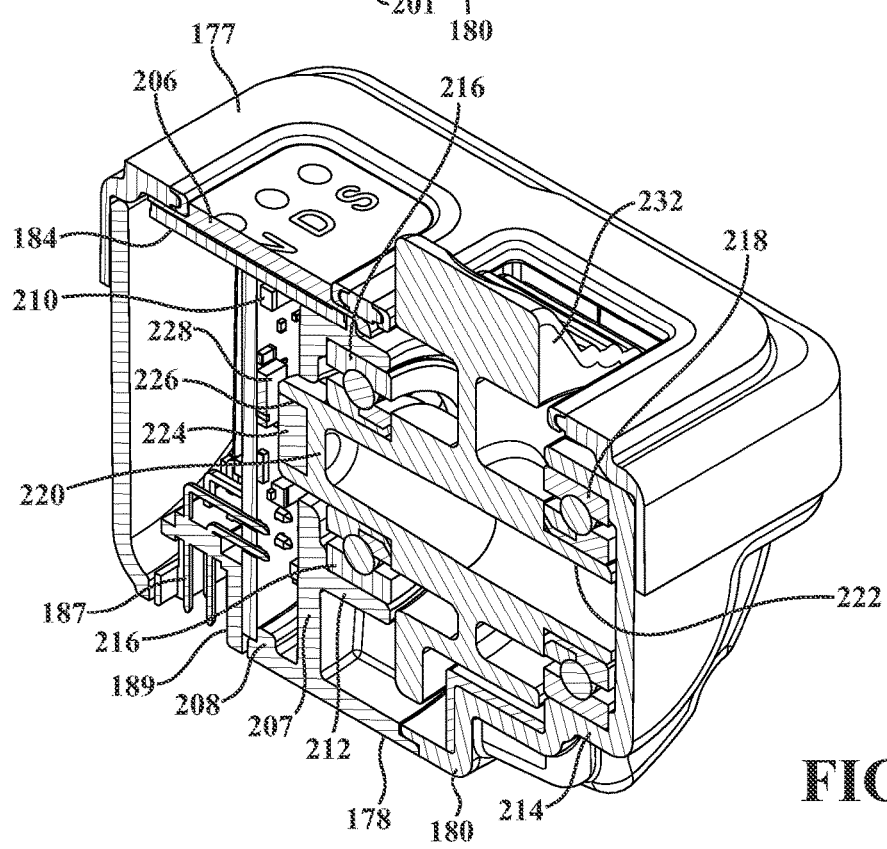
FIG. 31 is a cutaway view taken along line 31-31 of FIG. 30 and showing the interior assembled configuration of the toggle shifter assembly with the toggle element or knob over-molded onto a shaft end supported magnet positioned in relation to the PCBA mounted sensor.

FIG. 30 is a perspective assembled view of the toggle shifter assembly of FIG. 29 and with the toggle knob shown in the center (non-actuated) position. FIG. 31 is a cutaway view taken along line 31-31 of FIG. 30 and showing the interior assembled configuration of the toggle shifter assembly with the toggle element or knob over-molded onto the shaft end supported magnet 224 positioned in relation to the PCBA mounted sensor 228.

FIG. 32A is a plan view illustration of the toggle shifter assembly of FIG. 30 with the toggle element depicted in a monostable left side and one bump end stop position (see as represented by overmold portion 230 contacting first end stop 240). FIG. 32B is a succeeding plan view illustration of the toggle shifter assembly of FIG. 32A, with the toggle element depicted in return to center stable position. FIG. 32C is a further succeeding plan view illustration of the toggle shifter assembly of FIG. 32A with the toggle element depicted in a monostable right side and one bump end stop position (overmold portion 230 in contact with second end stop 242).

FIG. 33A is a cutaway view taken along line 33A-33A of FIG. 32A and showing the toggle knob in the left side monostable end position, corresponding to contraction of the interior spring biased pawl 188 as it displaces along the first side disposed ramp portion (236) of the knob. FIG. 33B is a cutaway view taken along line 33B-33B of FIG. 32B and illustrating the toggle knob in the center stable position, with FIG. 33C providing a further a cutaway view taken along line 33C-33C of FIG. 32C and showing the toggle knob in the right side monostable end position, corresponding to contraction of the interior spring biased pawl 188 as it displaces along the second interconnected and side disposed ramp portion (238) of the knob. The interface between the over mold portion 230 and the opposite end stops 240/242 provides for dampening to reduce noise when the toggle switch is at full travel (end stop contacting in FIGS. 33A and 33C), along with the dampener interfacing with the features on the toggle knob to prevent over travel of the device.

Figure 34:
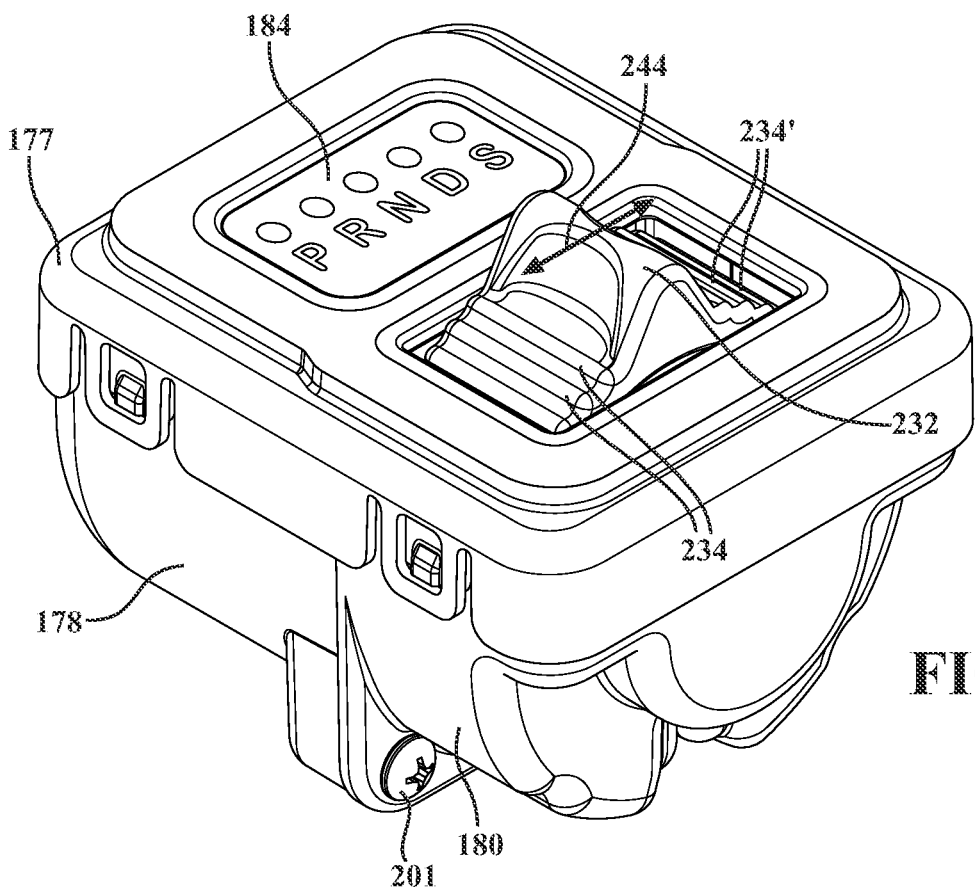
FIG. 34 is a substantial repeat of the toggle shifter of FIG. 30 and illustrating the bi-directional mono stable end rotating aspect of the toggle knob and end supported magnet relative to the PCBA and mounted sensor.
Figure 35:
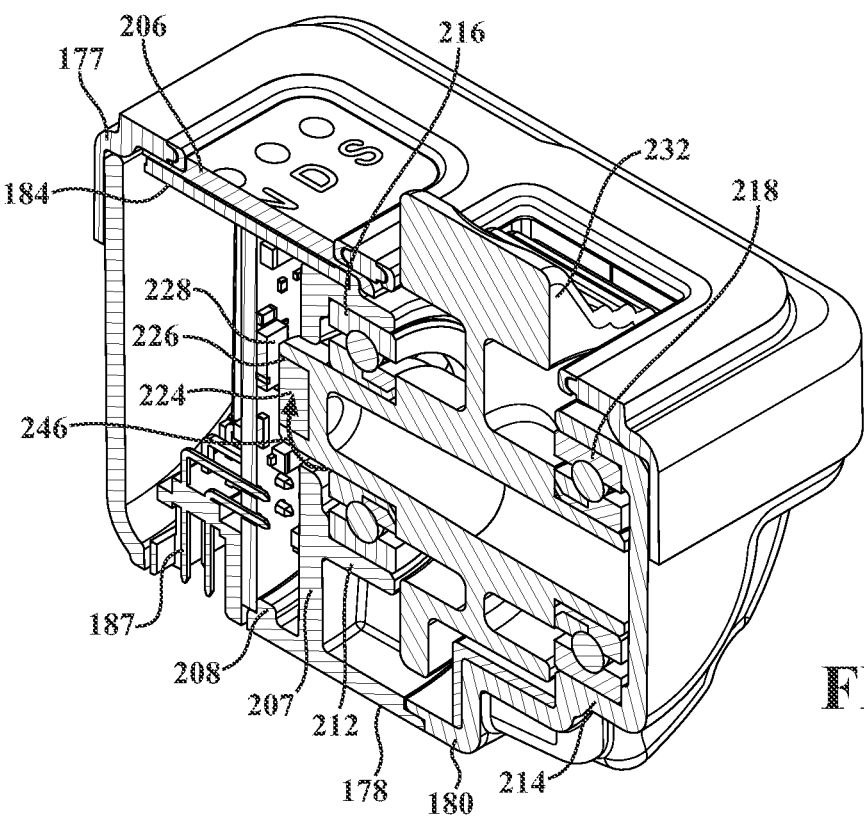
FIG. 35 is a substantial repeat of the cutaway of FIG. 31 and illustrating the rotation of the toggle knob and end supported magnet relative to the opposing PCBA mounted sensor and which results in the PCBA signaling the desired new gear to the engine control unit/module.

FIG. 34 is a substantial repeat of the toggle shifter of FIG. 30 and illustrating the bi-directional mono stable end rotating aspect of the toggle knob and end supported magnet relative to the PCBA and mounted sensor (see bi-directional arrow 244). FIG. 35 is a substantial repeat of the cutaway of FIG. 31 and illustrating the rotation of the toggle knob and end supported magnet relative to the opposing PCBA mounted sensor (see bidirectional arrow 246), and which results in the PCBA signaling the desired new gear to the engine control unit/module.

In this manner, the operator can toggle the switch up/down or left/right depending on the desired orientation of the device in the vehicle. The detent profile, pawl/detent materials, and spring rate define the ability of the toggle switch to return to center position after the driver has released the toggle switch. The one bump motion of the toggle provides for moving the gear position incrementally between each of PRNDS positions (P=>R, R=>N, N=>D, D=>S, or vice versa).

FIG. 36 is a perspective of a subset assembly of the toggle knob 182, PCBA 186 and spring loaded detent pawl 188 viewed from a different orientation and with the housing portions removed. FIG. 38 is a rotated side plan view of FIG. 36 and better showing the pawl 188 and compression spring 190 in biasing contact with the detent profile defining side ramps (again 236 and 238) configured in the toggle knob 182.

As previously described, and upon the driver pressing the toggle switch using any of the finger, thumb or other means, the toggle is rotated with the detent profile (ramps 236/238). The profile ramps 236/238 interface with the detent pawl 188 which is backed by the compression spring 190. As the pawl 188 moves along/up the monostable detent (either of ramps 236/238) the spring is compressed and the related effort is felt by the operator. This effort is again defined by any of the height of the detent peaks, the depth of the detent trenches, the angle between the peaks and trench, the surface shape and roughness of the material of the detent pawl and ramp profiles and the spring rate.

The gear selection is further based on the specified rotational distance of the toggle knob and end supported magnet 224 relative to the PCBA mounted sensor 228. At this point, the associated processor for the PCBA instructs the change in gear position which is communicated to the vehicle ECU unit. The Park Lock and Neutral Lock functions further operate in similar fashion as described in the initial embodiment, the direct to Park or Drive shift function again operating by the operator holding down the toggle knob in a selected monostable end stop position for a selected time interval (e.g. >2.0 seconds) in order advance the gear selection from Park to Drive and vice versa.

Figure 39:
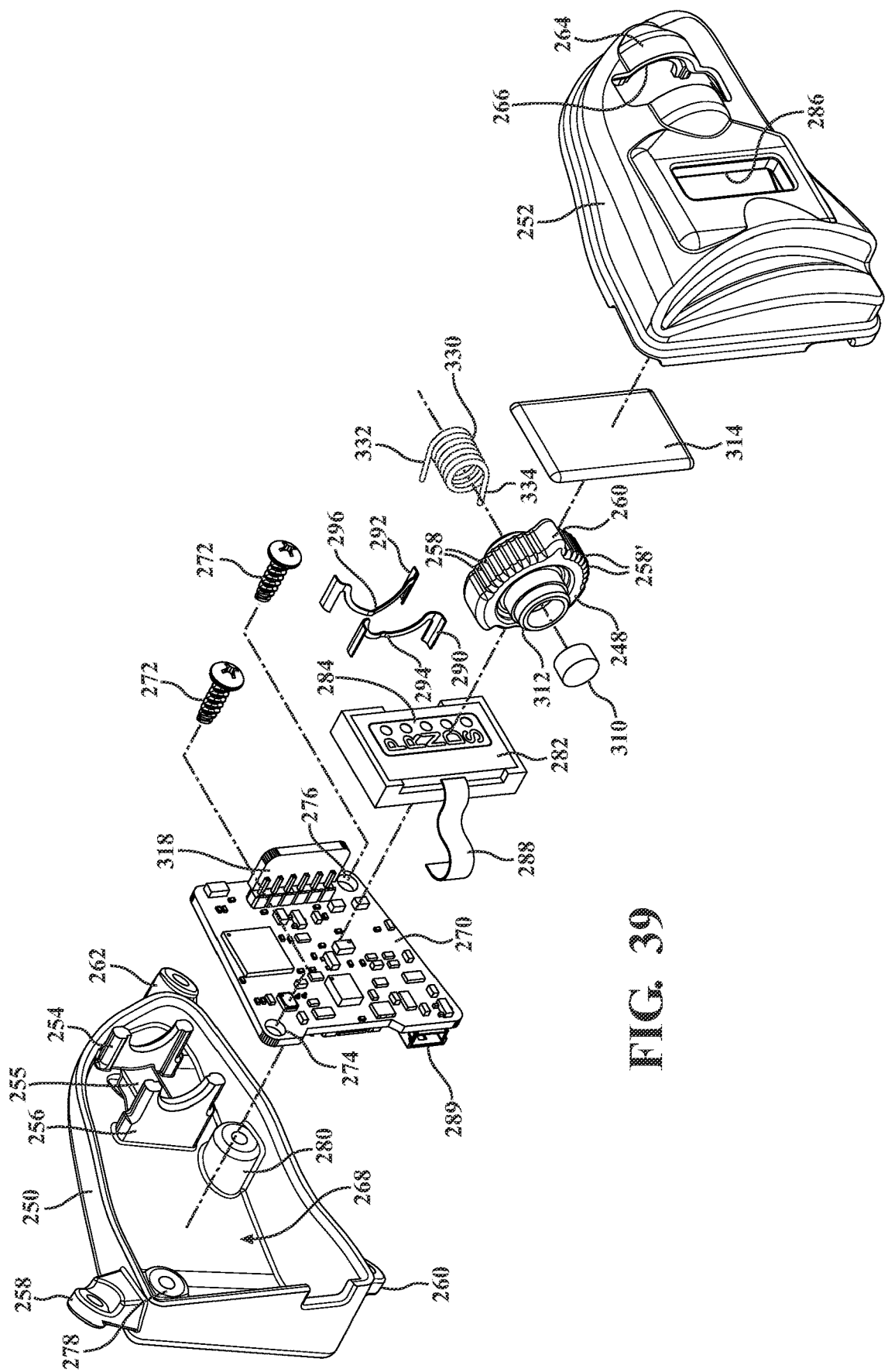
FIG. 39 is an exploded view of a toggle shifter assembly according to a further non-limiting embodiment for a steering wheel mount application and which illustrates both of wave spring and torsion spring sub-variants for providing the desired haptic and monostable one bump shifting functionality.

Proceeding to FIG. 39 is an exploded view of a toggle shifter assembly according to a further non-limiting embodiment for a steering wheel mount application, and which illustrates both of wave spring and torsion spring subvariants for providing the desired haptic and monostable one bump shifting functionality. A reconfigured lower housing 250 and upper housing 252 is provided, with the lower housing including a pair of integrated cradle locations 254/256, and between which is configured an in-molded portion 255 which defines the monostable end stop locations for the rotating toggle wheel, further shown at 248. The reconfiguration of the toggle wheel 248 again includes an outer annular gripping surface (knurled portions 258/258ʹ and interposed peak 260 for providing the desired gripping profile when engaged by the users finger or thumb.

The lower housing 250 also includes edge extending ear locations 258, 260, 262 for mounting to a desired support, such as which can further include a side location of a steering wheel. The upper housing 252 further includes a raised forward facing location 264, within which is configured a slot shaped aperture (see interconnecting rim edge 266) for receiving and partially protruding the knurled outer profile of the toggle wheel 248.

Figure 41:
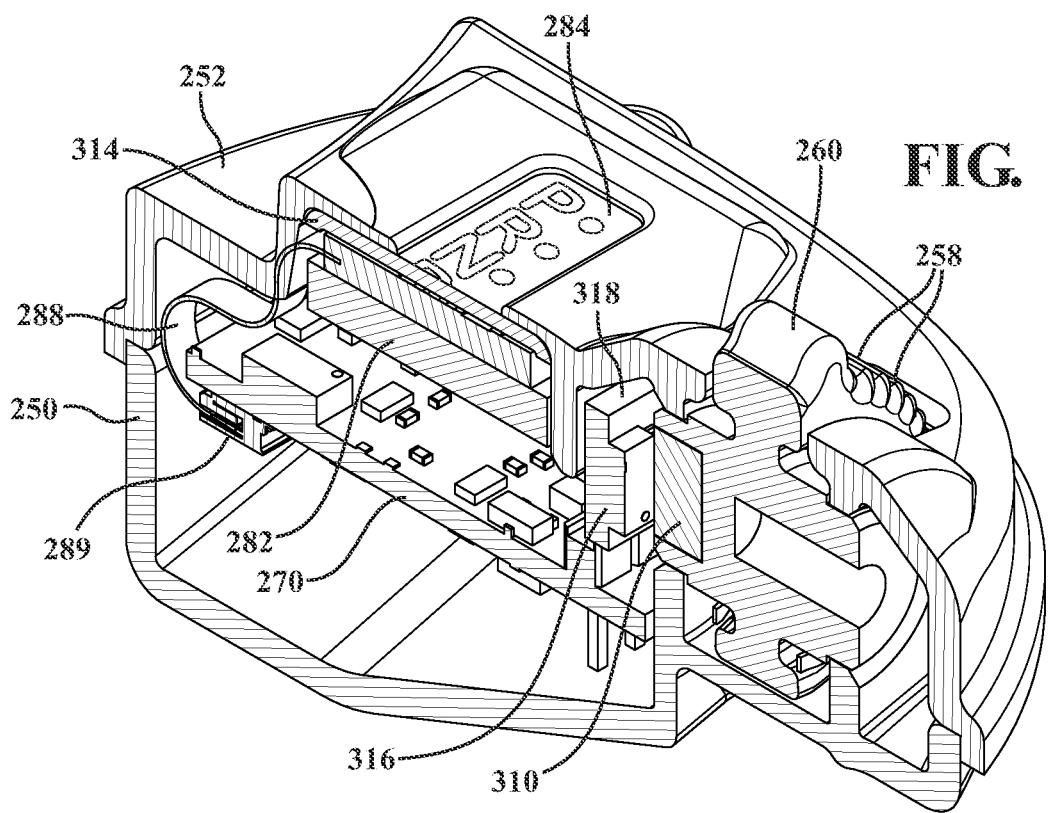
FIG. 41 is a cross sectional cutaway perspective of FIG. 40 and showing the interior assembled configuration of the toggle shifter assembly with the toggle element or knob over-molded onto a shaft end supported magnet positioned in relation to the PCBA mounted sensor.

The lower housing 250 further includes an open interior area (generally at 268) within which is supported a PCBA 270. A pair of mounting screws 272 are provided for installing the PCBA 270 via edge defined apertures 274/276 which align with apertured mounting posts 278/280 defined in the lower housing 250. A display component 282 (again including without limitation any of TFT, OLED or segmented variants) is supported within the upper housing 252 and so that an illuminating screen portion 284 of the display is evident through a further window 286 in the upper housing. A connector ribbon 288 associated with the display (such as corresponding to segmented display) extends from the component 282 to connect to the PCBA 270 (see receiving location 289 as also shown in FIG. 41).

Figure 46:
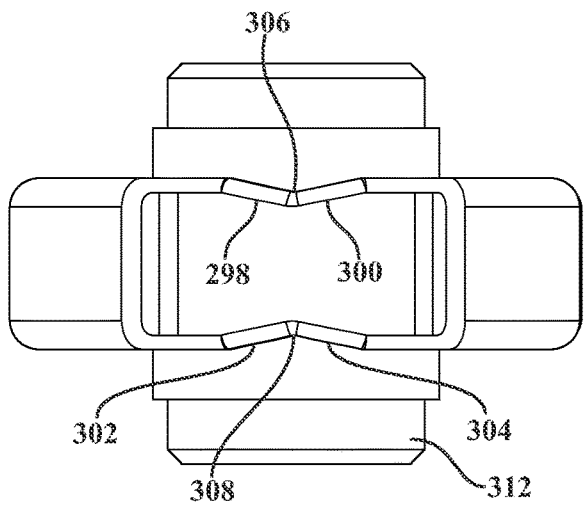
FIG. 46 is a rotated side plan view of the toggle knob illustrating detent profiles on each of opposite side disposed surfaces, against which is biased the pair of wave springs supported on the opposite shaft portions of the knob.
Figure 47:
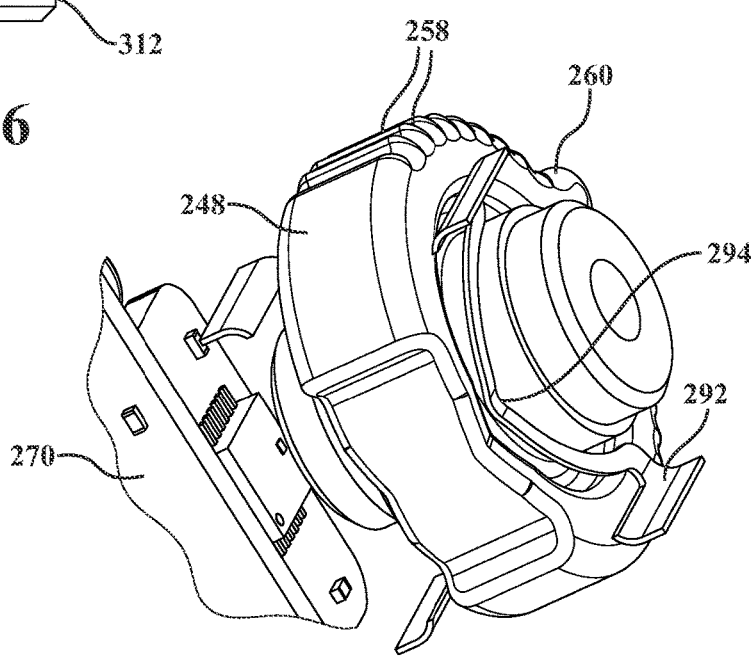
FIG. 47 is a perspective of the toggle knob, PCBA and spring loaded wave springs viewed from a different orientation.

A pair of wave springs 290 and 292 are provided which align with opposite sides of the toggle knob or wheel 248 and which, as will be further described, include central arcuate protruding locations 294 and 296 which bias against opposing side detent profiles (see as shown by ramps at 298/300 and 302/304 in each of FIGS. 46 and 48) of the toggle wheel 248. The ramps define the opposing peaks, with a trench defined by the innermost recess location 306 and 308 (see FIG. 46) established between each pair 298/300 and 302/304 of ramps.

A round magnet 310 is integrated into a recessed side location of a spindle or shaft support 312 of the toggle wheel 248. This can include without limitation over-molding the toggle wheel in its entirety around the magnet. A lens 314 is also shown which can seat against an inside of the upper housing 252 for covering the illuminating portion 284 of the display component 282.

Figure 40:
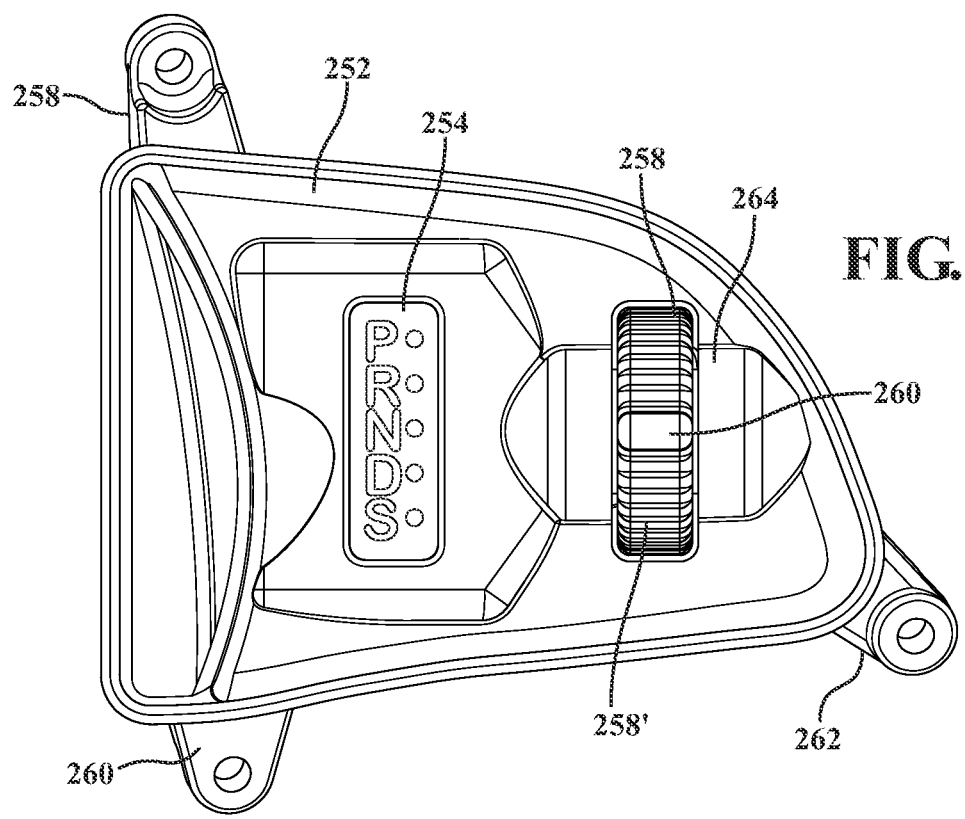
FIG. 40 is a front plan view of the toggle shifter assembly of FIG. 39.

FIG. 40 is a front plan view of the toggle shifter assembly of FIG. 39 with the toggle wheel and display assembled within the sandwiched upper and lower housing portions. FIG. 41 is a cross sectional cutaway perspective of FIG. 40 and showing the interior assembled configuration of the toggle shifter assembly with the toggle element or knob 248 over-molded onto the shaft end supported magnet 310 positioned in relation to the PCBA mounted sensor, shown further at 316 and which can include without limitation any inductive or Hall effect sensor.

Given the orientation of the PCBA 270 relative to the shaft end mounted magnet 310, the sensor 316 can be mounted upon a perpendicular extending shelf 318 of the PCBA in order for the sensor to be appropriately positioned in a closely spaced and opposing manner to the magnet. As previously described, and upon the driver pressing the toggle switch by any of a finger, thumb or other means, the toggle switch is rotated causing the magnet 310 to be rotated over the sensor 316, with the gear position being changed and communicated (such as via a PCBA operating processor) to the vehicle engine control unit (ECU).

Figure 42A:
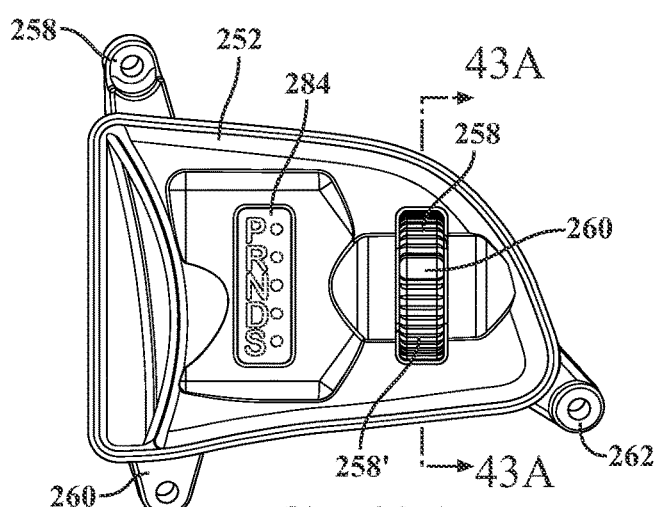
FIG. 42A is a plan view illustration of a wave spring variant of the toggle shifter assembly of FIG. 39 with the toggle element depicted in a monostable upper and one bump end stop position.
Figure 42B:
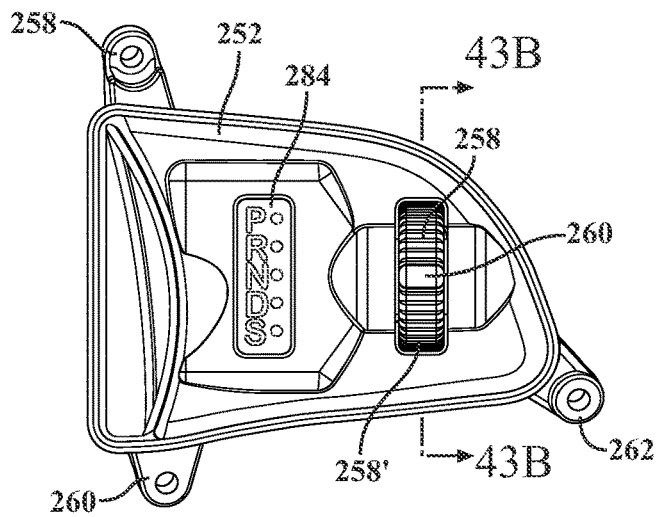
FIG. 42B is a succeeding plan view illustration of the toggle shifter assembly of FIG. 42A with the toggle element depicted in return to center stable position.

FIG. 42A is a plan view illustration of the wave spring variant of the toggle shifter assembly of FIG. 39, with the toggle element (represented by toggle knob with peak location 260) depicted in a monostable upper and one bump end stop position. FIG. 42B is a succeeding plan view illustration of the toggle shifter assembly of FIG. 42A with the toggle element depicted in return to center stable position and FIG. 42C is a further succeeding plan view illustration of the toggle shifter assembly FIG. 42A, with the toggle element depicted in a monostable lower and one bump end stop position.

Figure 43A:
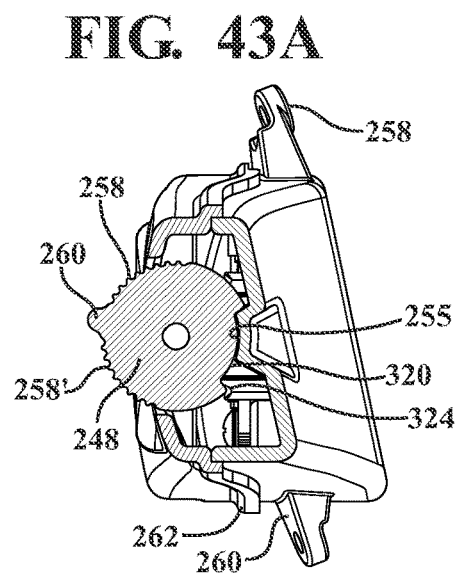
FIG. 43A is a cutaway view taken along line 43A-43A of FIG. 42A and showing the toggle knob in the upper monostable end position, corresponding to contraction of the wave springs along first side disposed ramp portions of the knob.
Figure 48:
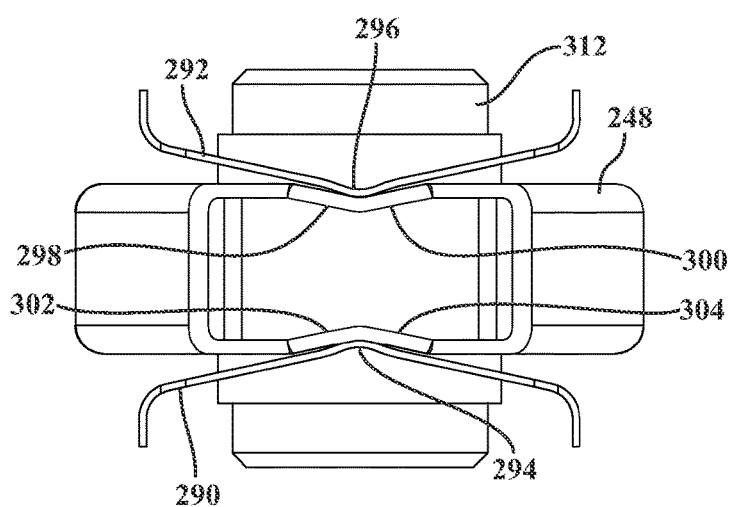
FIG. 48 is a succeeding illustration to FIG. 46 and illustrating the wave springs positioned against the opposite facing detent side profiles associated with the toggle knob.

FIG. 43A is a cutaway, view taken along line 43A-43A of FIG. 42A, and showing the toggle knob in the upper monostable end position, corresponding to contraction of the wave springs 290/292 along first side disposed ramp portions of the knob (see again 298/302 in FIG. 48). Further shown in FIG. 43A is the in-molded portion 255 of the lower housing 250 which seats within the annular recess channel or track, see at 320 with arcuate spaced opposite end stops 322 and 324, defined in the toggle knob 248.

Figure 43B:
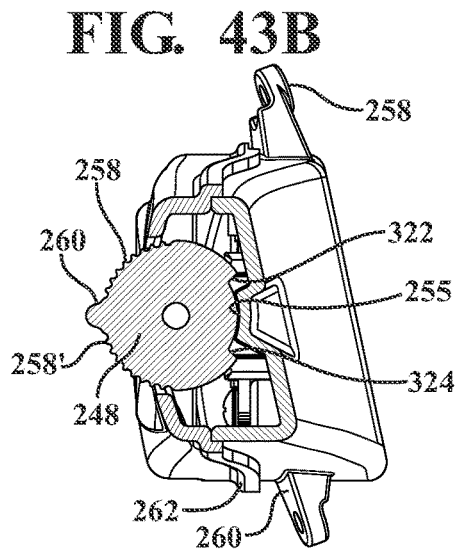
FIG. 43B is a cutaway view taken along line 43B-43B of FIG. 42B and illustrating the toggle knob in the center stable position.
Figure 42C:
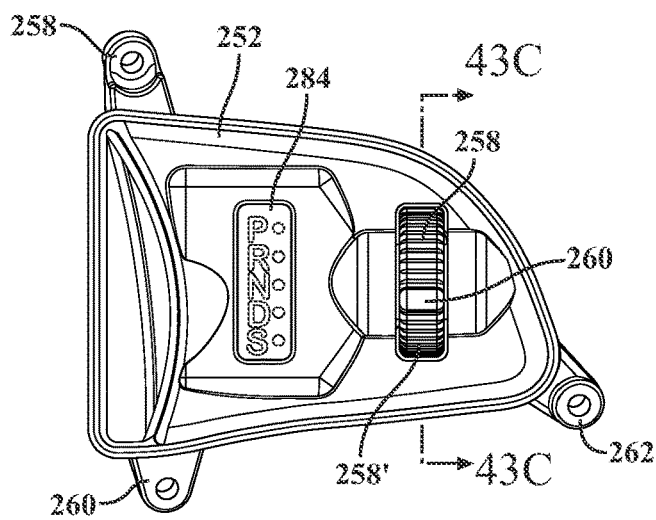
FIG. 42C is a further succeeding plan view illustration of the toggle shifter assembly FIG. 42A with the toggle element depicted in a monostable lower and one bump end stop position.
Figure 43C:
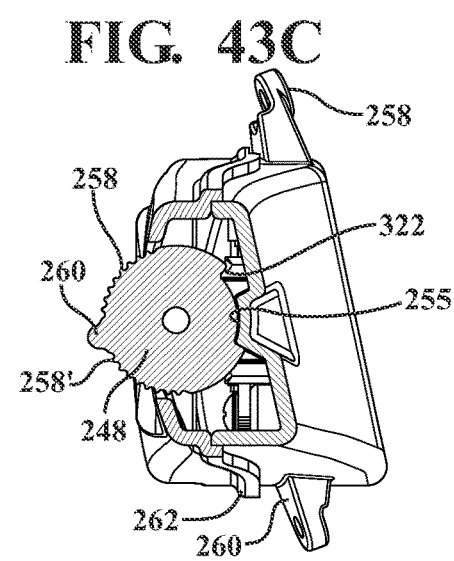
FIG. 43C is a cutaway view taken along line 43C-43C of FIG. 42C and showing the toggle knob in the lower monostable end position, corresponding to contraction of the wave springs along second interconnected and side disposed ramp portions of the knob.

FIG. 43B is a cutaway view taken along line 43B-43B of FIG. 42B and illustrating the toggle knob in the center stable position, with FIG. 43C providing a cutaway view taken along line 43C-43C of FIG. 42C, and showing the toggle knob in the lower monostable end position, corresponding to contraction of the wave springs 290 and 292 along second interconnected and side disposed ramp portions (further at 300/304 in FIG. 48) of the toggle knob 248.

In this fashion, the driver can toggle the switch up/down or left/right depending on the desired orientation of the device in the vehicle. The detent profile, wave spring/detent materials, and wave spring stiffness define the ability of the toggle switch to return to center after the operator has released the toggle switch. The assembly further provides one bump monostable gear shifting in any direction by incremental positions (again P=>R, R=>N, N=>D, D=>S, or vice versa). Concurrently, the wave spring inner bends 294/296 alternately ride along either of the opposite directed detent ramps 298/302 and 300/304 of the wave springs 292/290, with the monostable center position defined by the middle trench 306/308 of each opposing wave spring.

Figure 44:
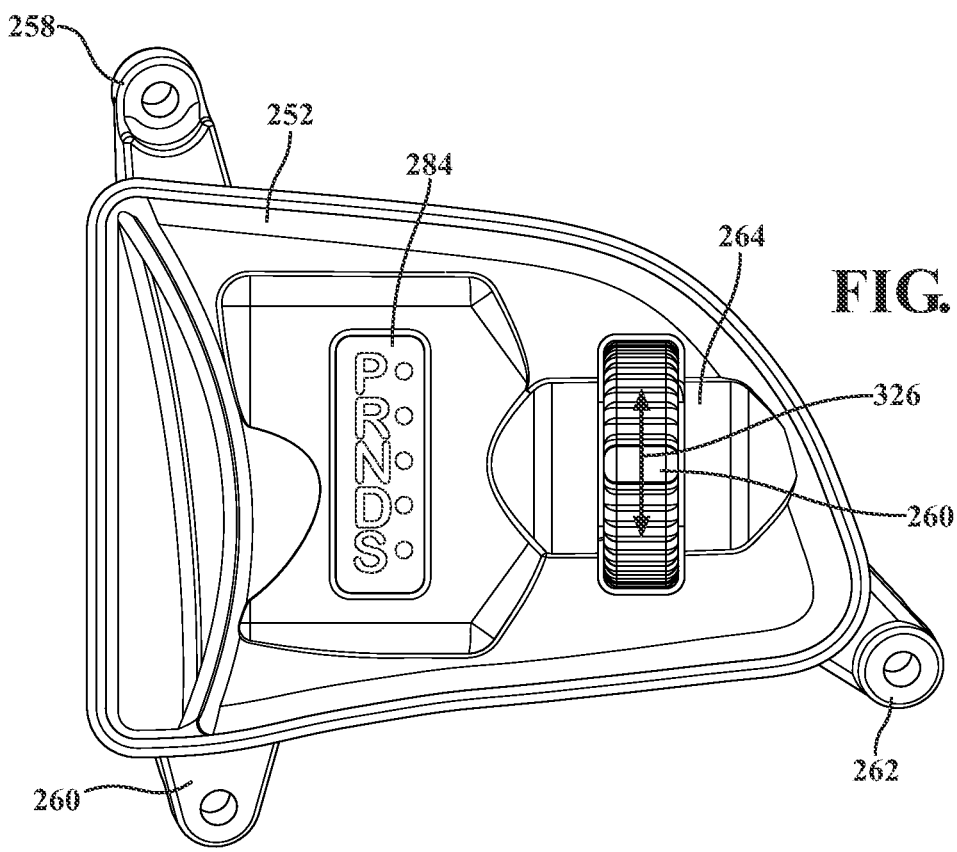
FIG. 44 is a substantial repeat of the toggle shifter of FIG. 40 and illustrating the bi-directional mono stable end rotating aspect of the toggle knob and end supported magnet relative to the PCBA and mounted sensor.
Figure 45:
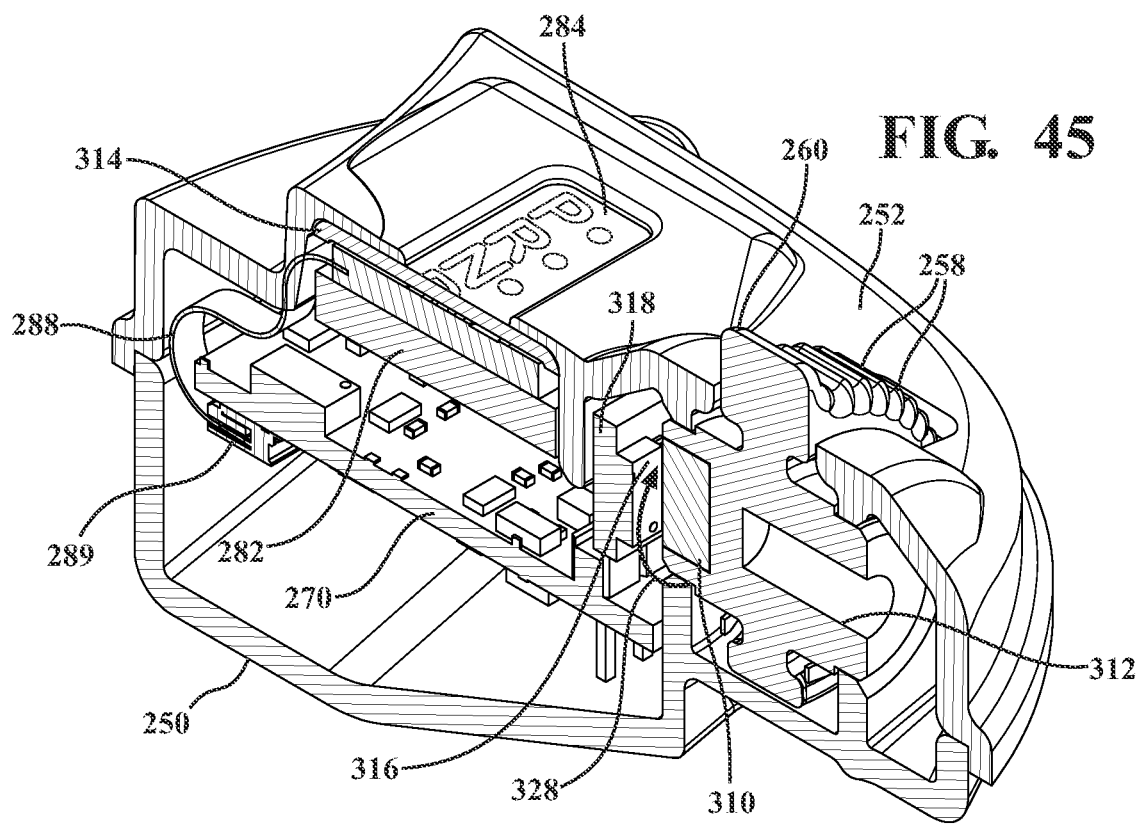
FIG. 45 is a substantial repeat of the cutaway of FIG. 41 and illustrating the rotation of the toggle knob and end supported magnet relative to the opposing PCBA mounted sensor and which results in the PCBA signaling the desired new gear to the engine control unit/module.

FIG. 44 is a substantial repeat of the toggle shifter of FIG. 40 and illustrating the bi-directional monostable end rotating aspect of the toggle knob (see bi-directional arrow 326) and end supported magnet relative to the PCBA and mounted sensor. FIG. 45 is a substantial repeat of the cutaway of FIG. 41 and illustrating the rotation of the toggle knob and end supported magnet (bi-directional arrow 328) relative to the opposing PCBA mounted sensor and which results in the PCBA, this signaling the desired new gear to the engine control unit/module.

Figure 49A:
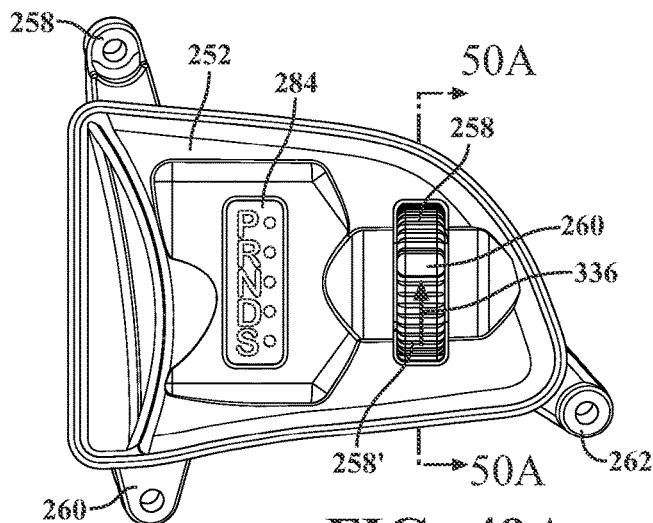
FIG. 49A is a plan view illustration of a torsion spring variant of the toggle shifter assembly of FIG. 39 with the toggle element depicted in a monostable upper and one bump end stop position.
Figure 49B:
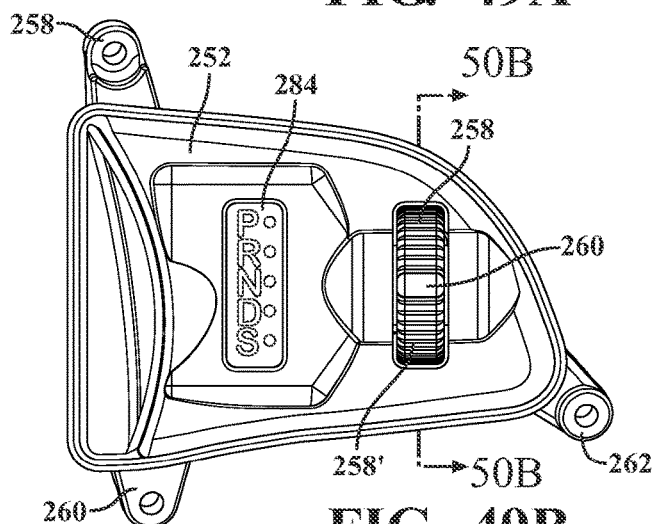
FIG. 49B is a succeeding plan view illustration of the toggle shifter assembly of FIG. 49A with the toggle element depicted in return to center stable position.
Figure 49C:
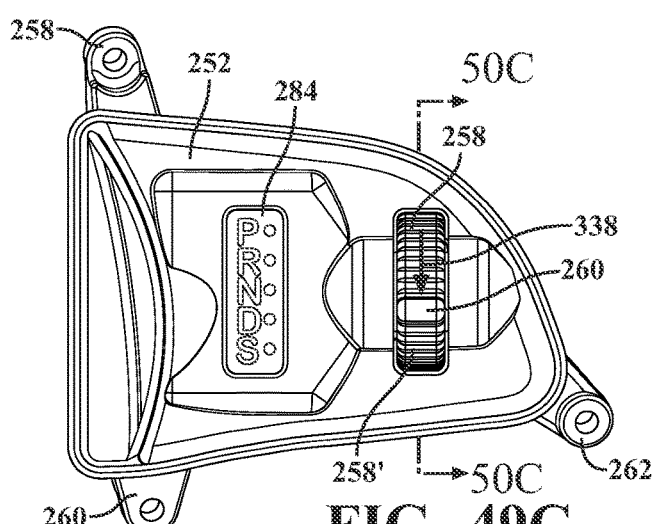
FIG. 49C is a further succeeding plan view illustration of the toggle shifter assembly FIG. 49A with the toggle element depicted in a monostable lower and one bump end stop position.

FIGS. 49A-49C generally correspond to FIGS. 42A-43C and depict corresponding operation of an alternate toggle knob variant each of mono stable upper end stop position (arrow 336 in FIGS. 49A/50A), return to center position and lower end stop position (reverse direction arrow 338 in FIGS. 49C/50C). The over mold portion 255 positioned between the toggle wheel supporting cradles 254/256 provides the necessary dampening effect in order to reduce noise when the toggle switch is actuated at full travel (at upper and lower end stops). The dampener also interfaces with the features of the toggle switch to prevent over travel of the device. The alternate variants incorporates a torsion spring 330 (see again FIG. 39) in substation of the pair of wave springs 290/292, the torsion spring having opposite extending end legs 332 and 334. The torsion spring 330 seats upon an outer reconfiguration of a toggle wheel shaft depicted at 312☐ (and extending opposite the inner shaft portion 312 as shown in FIG. 52).

Figure 50A:
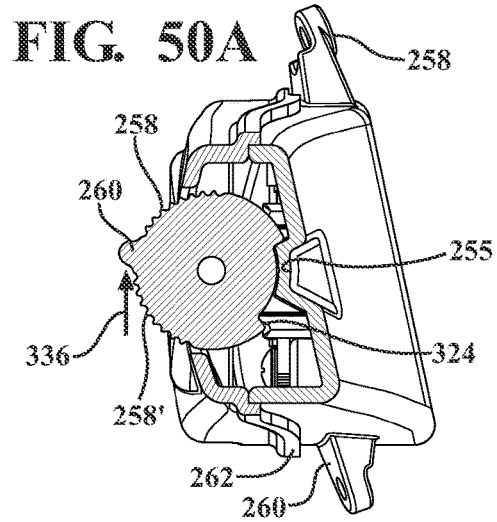
FIG. 50A is a cutaway view taken along line 50A-50A of FIG. 49A and showing the toggle knob in the upper monostable end position, corresponding to contraction of the torsion spring as it displaces along a first side disposed ramp portion of the knob.
Figure 50B:
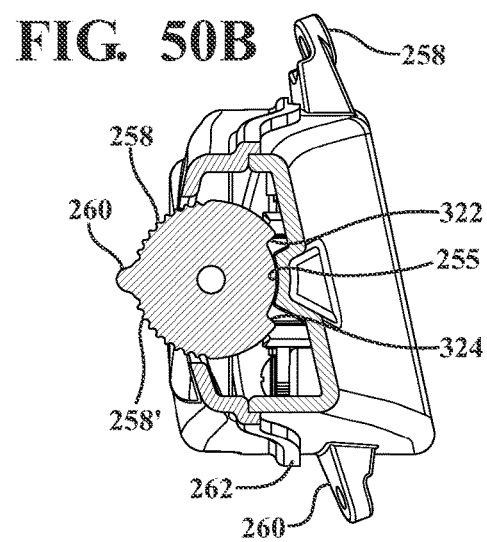
FIG. 50B is a cutaway view taken along line 50B-50B of FIG. 49B and illustrating the toggle knob in the center stable position.
Figure 50C:
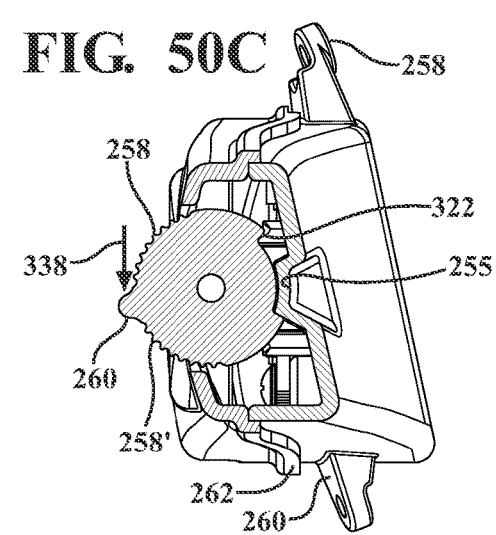
FIG. 50C is a cutaway view taken along line 50C-50C of FIG. 49C and showing the toggle knob in the lower monostable end position, corresponding to contraction of the torsion spring as it displaces along a second interconnected and side disposed ramp portion of the knob.

FIG. 50A is a cutaway view taken along line 50A-50A of FIG. 49A and showing the toggle knob in the upper monostable end position, corresponding to contraction of the torsion spring 330 as it displaces along a first side disposed ramp portion of the knob (such as again at 298/302 for opposite detent ramps in FIG. 48). FIG. 50B is a cutaway view taken along line 50B-50B of FIG. 49B and illustrating the toggle knob in the center stable position (corresponding to the inner bends 294/296 of the wave springs 290/292 seating within the central trenches 306/308 shown in FIG. 46. FIG. 50C is a cutaway view taken along line 50C-50C of FIG. 49C and showing the toggle knob in the lower monostable end position, corresponding to contraction of the torsion spring 330 as it displaces along a second interconnected and side disposed ramp portions (300/304 of the knob).

Figure 51:
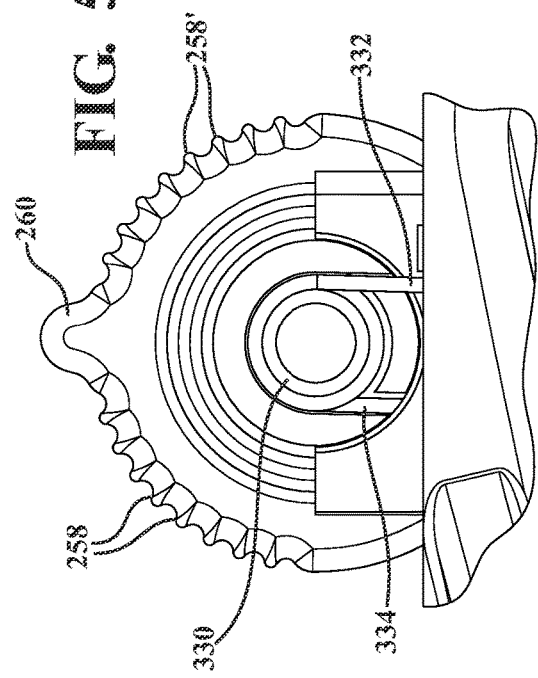
FIG. 51 is a partial side plan view of the toggle knob with side supported torsion spring which, in response to rotation of the knob, twists the spring in order to increase its torsion rate in reaction to the induced load with increase in resistance of the knob.

FIG. 51 is a partial side plan view of the toggle knob with the side supported torsion spring 330 which, in response to rotation of the knob 248, twists the spring (via opposite end biasing legs 332/334) in order to increase its torsion rate in reaction to the induced load, and with increase in resistance of the knob. The torsion spring effort is further defined by any one or more parameters including material, wire geometry, coil count, and spring diameters. The torsion spring can further be configured with desired pre-load, such as when in an assembled/center position (FIGS. 49B/50B).

Figure 52:
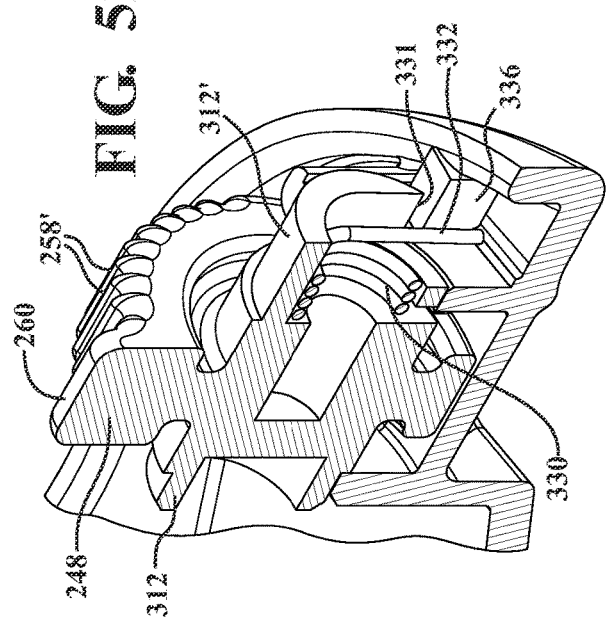
FIG. 52 presents a side cutaway perspective of the toggle knob with side supported torsion spring including opposite extending legs which, in response to rotation of the toggle knob in either direction from center, creates a resistance load.

FIG. 52 presents a side cutaway perspective of the toggle knob with side supported torsion spring 330, and again depicting the opposite extending legs (the outer of which is shown at 332 in contact with a fixed abutment location 336 within the housing interior) and which, in response to rotation of the toggle knob in either direction from center, creates a resistance load on the toggle wheel once it exerts against a selected inner 334 or outer 336 leg of the torsion spring. A biasing force is exerted on the toggle knob in response to its rotation in either direction, resulting in either of spaced and opposing arcuate edges 331 and 333 configured along opposing cutout locations of the toggle knob shaft portion 311 biasing against a selected extending and fixed abutment supported leg 332 or 334 of the torsion spring.

Figure 53:
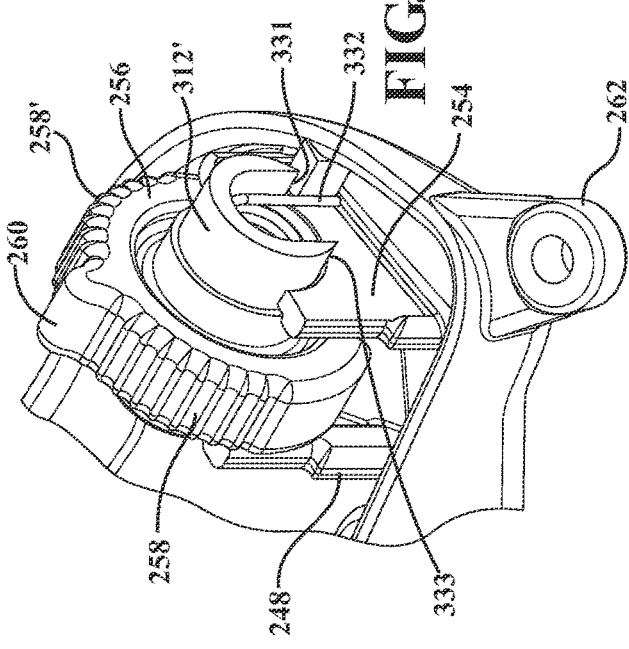
FIG. 53 is a view similar to FIG. 52 depicting the toggle knob supported upon the cradle portions of the lower housing in a non-cutaway fashion and depicting the mounting arrangement of the torsion spring within toggle knob shaft portion.
Figure 54:
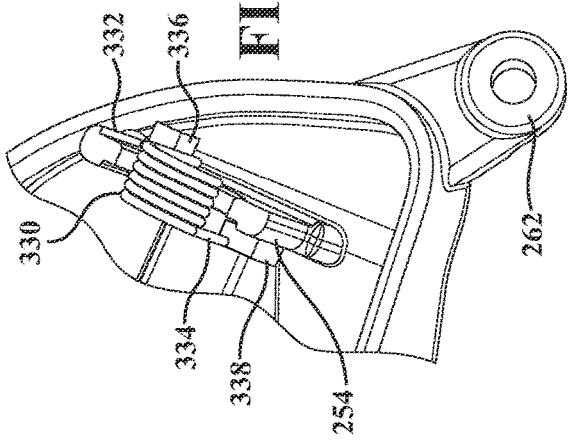
FIG. 54 is a further partial perspective showing the torsion spring without the toggle knob.

FIG. 53 is a view similar to FIG. 52 depicting the toggle knob 248 supported upon the cradle portions 254/256 of the lower housing 250 in a non-cutaway fashion and depicting the mounting arrangement of the torsion spring 330 within the reconfigured toggle knob shaft portion 312□, this again exhibiting an aperture annular interior along with a lower cutout profile which reveals the spaced and opposing abutment edges 331/333. FIG. 54 is a further partial perspective showing the torsion spring 330 without the toggle knob and depicting the inner curled leg 334 of the spring 330 in contact with the further located fixed abutment, shown at 338, and positioned on an opposite inner side of the cradle portion 254 relative to the outer positioned abutment 336. In this fashion, rotation of the toggle knob in either direction is opposed and counter-biased by either of the extending legs 334 or 336 in contact with opposing edges 331/333 of the knob, and in a manner which influences the toggle knob to return to the center position as shown in FIG. 51.

Figure 55:
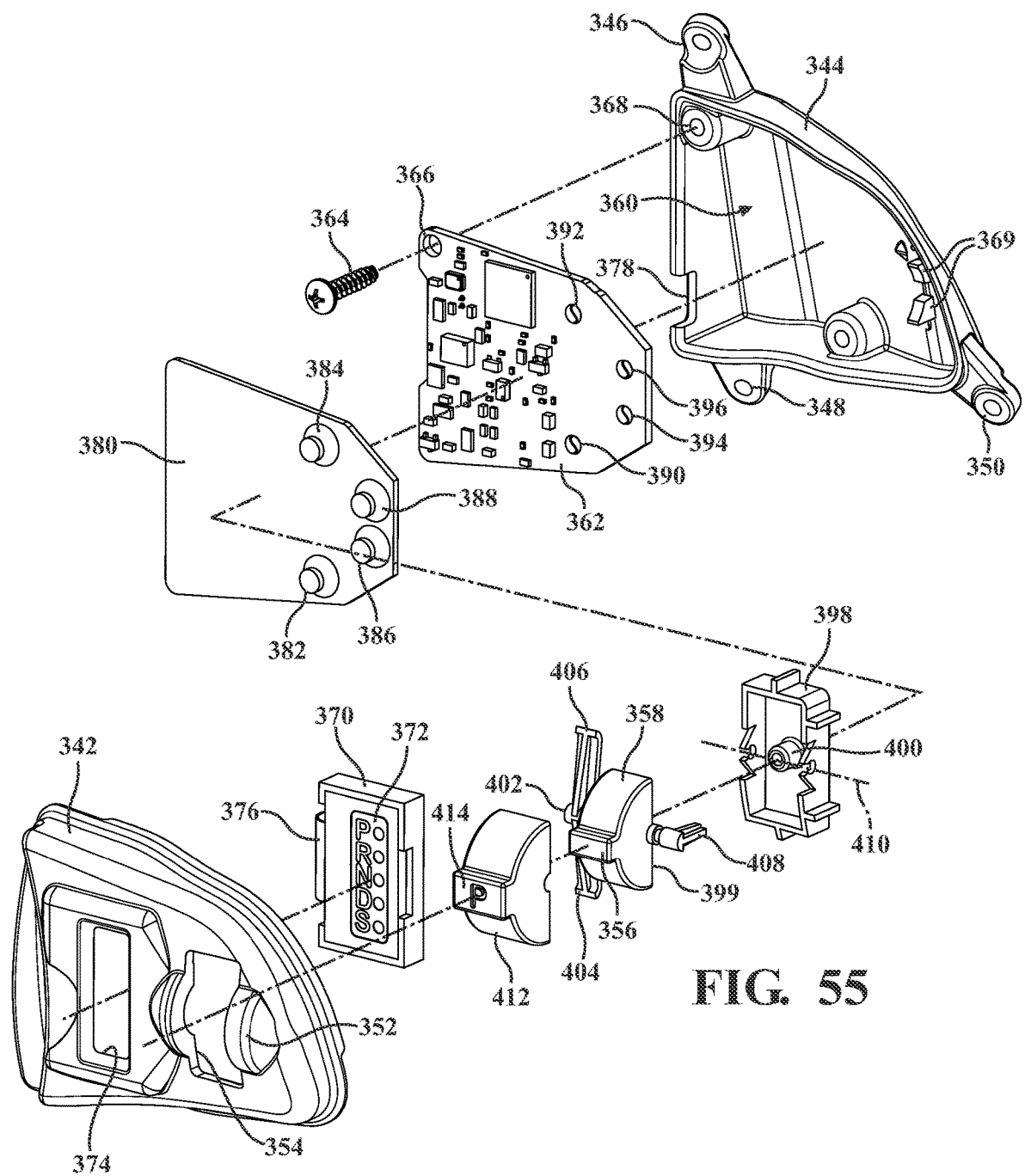
FIG. 55 is an exploded view of a toggle shifter assembly according to a further non-limiting embodiment for a steering wheel mount application and which illustrates a paddle and keypad arrangement associated with the toggle knob for providing the desired haptic and monostable one bump shifting functionality.

Proceeding to FIG. 55, an exploded view of a toggle shifter assembly (see also assembled perspective 340 in FIG. 56) according to a further non-limiting embodiment for a steering wheel mount application. Similar to prior embodiments, an upper housing 342 and a lower housing 344 is provided which sandwich together to define a package receiving space.

The lower housing 344 also includes edge extending ear locations 346, 348, 350 for mounting to a desired support, such as which can again further include a side location of a steering wheel. The upper housing 342 further includes a raised forward facing location 352, within which is configured a slot shaped aperture (see interconnecting rim edge 354) for receiving and partially protruding outer portion 356 of a further reconfiguration of a toggle wheel or knob 358.

The lower housing 344 further includes an open interior area (generally at 360) within which is supported a PCBA 362. One more mounting screws (such as which is shown at 364) is provided for installing the PCBA 362 via rim edge defined aperture 366 which aligns with an apertured mounting post 368 defined in the lower housing 344. Additional interior support features (see at 369) are configured within the upper housing 344 in order to receive and position an upper edge location of the PCBA 362.

A display component 370 (again including without limitation any of TFT, OLED or segmented variants) is supported within the upper housing 342 and so that an illuminating screen portion 372 of the display is evident through a further window 374 in the upper housing. A connector ribbon 376 associated with the display (such as corresponding to segmented display) extends from the component 370 to connect to the PCBA 362 (see edge proximate cutout profile 378 in the lower housing 344 which aligns with an underside located receiving connector (not shown) for connecting to the harness 376.

A keypad 380 is provided which generally matches the outline of the PCBA 362 so that the keypad is positioned atop the PCBA when installed within the lower housing 344. A plurality of keypad buttons, including outer subset pair 382/384 and inner subset pair 386/388 are incorporated into the keypad 380 and align with contact locations (outer subset 390/392 and inner subset 394/396) in the PCBA 362. As will be further described, the keypad arrangement substitutes for any of the spring loaded pawls, wave springs or torsional spring of the prior embodiments for providing the desired resistance (haptic effect) during toggling of the knob 358 during shifting.

An inner knob housing 398 exhibits a generally rectangular (pseudo shoebox) shape and exhibiting recessed interior for seating an opposing rectangular end face profile 399 defining a half-knob shape of the toggle knob 358. A central interior support post 400 is shown associated with the inner knob housing 398 which seats and underside located portion (see at 401 in FIG. 59 cutaway) of the toggle knob 358 in a fashion which permits the knob a limited degree of bi-directional toggling motion.

Figure 58:
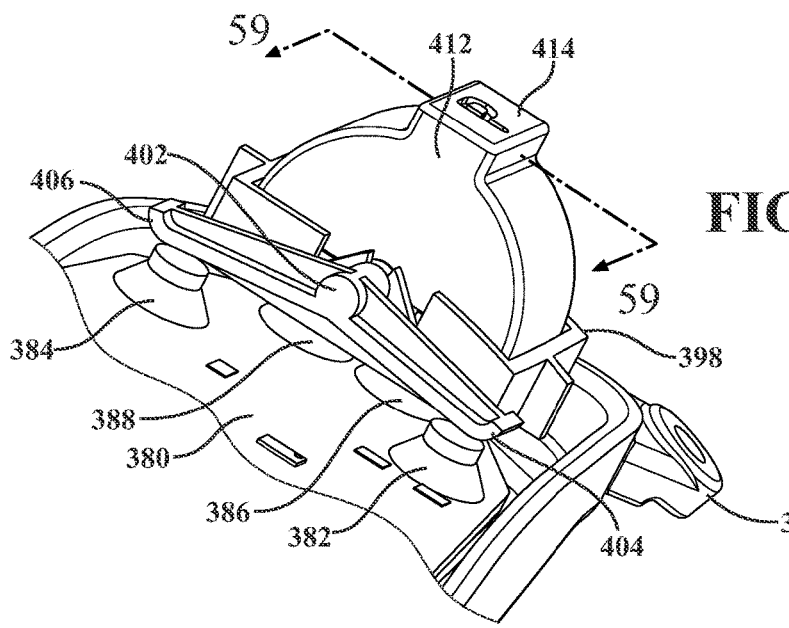
FIG. 58 is a sectional perspective of the toggle knob, over mold, paddle, keypad and keypad buttons for providing monostable toggling in either of first or second directions.

A paddle 402 is rotatably secured to a central side location of the toggle knob 358, the paddle including opposite end locations 404 and 406 which align with the outer pair of keypad buttons 382/384 (see also FIG. 58). The inner pair 386/388 of sensors/switches on the PCBA alternately contact the underside of the inner knob housing 398 (see FIG. 59) to define a limited range of pivoting of the toggle knob and inner knob housing relative to the PCBA as enabled by the side supported paddle 402. The toggle knob 358 also includes a further side extending portion 408 on a side opposite the paddle 402 which overlaps a supporting edge of the inner knob housing 398. Cutouts in the sides of the inner knob housing define a central axis 410 and which seat the central shaft support of the paddle 402 and the opposite side extending portion 408 in a manner to block the rotation of the knob, such as in the instance of the operator pressing the button down to depress the inner pair of sensor switches 388/386, and also to prevent pressing down, in the instance that the toggle is rotated up or down, depressing the keypad buttons 384 or 382 (in this instance the side walls of the interior support feature 369 providing the respective restriction, and depending upon either of a press/no rotation or rotation/no press condition being established.

Additional features include a knob over-mold 412 generally matching in configuration the toggle knob 358. As will be further described with reference to FIG. 64, a central projection 414 of the knob over-mold 412, upon installation, can be depressed downwardly to displace the inner knob housing 398, such as in one non-limiting configuration into contact with the inner keypad buttons 394/396 and aligned sensor switches 394/396, this in order to initiate a return to park condition by the PCBA 380.

Figure 56:
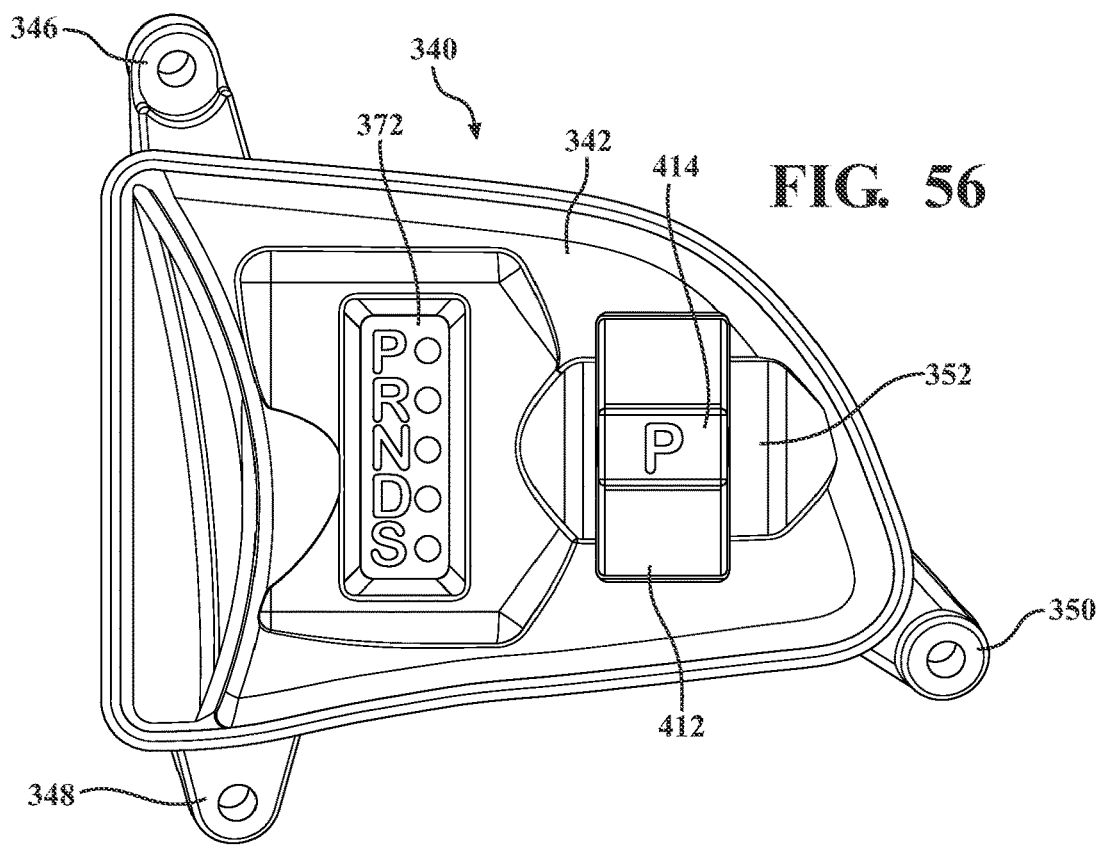
FIG. 56 is a front plan view of the toggle shifter assembly of FIG. 55.
Figure 57:
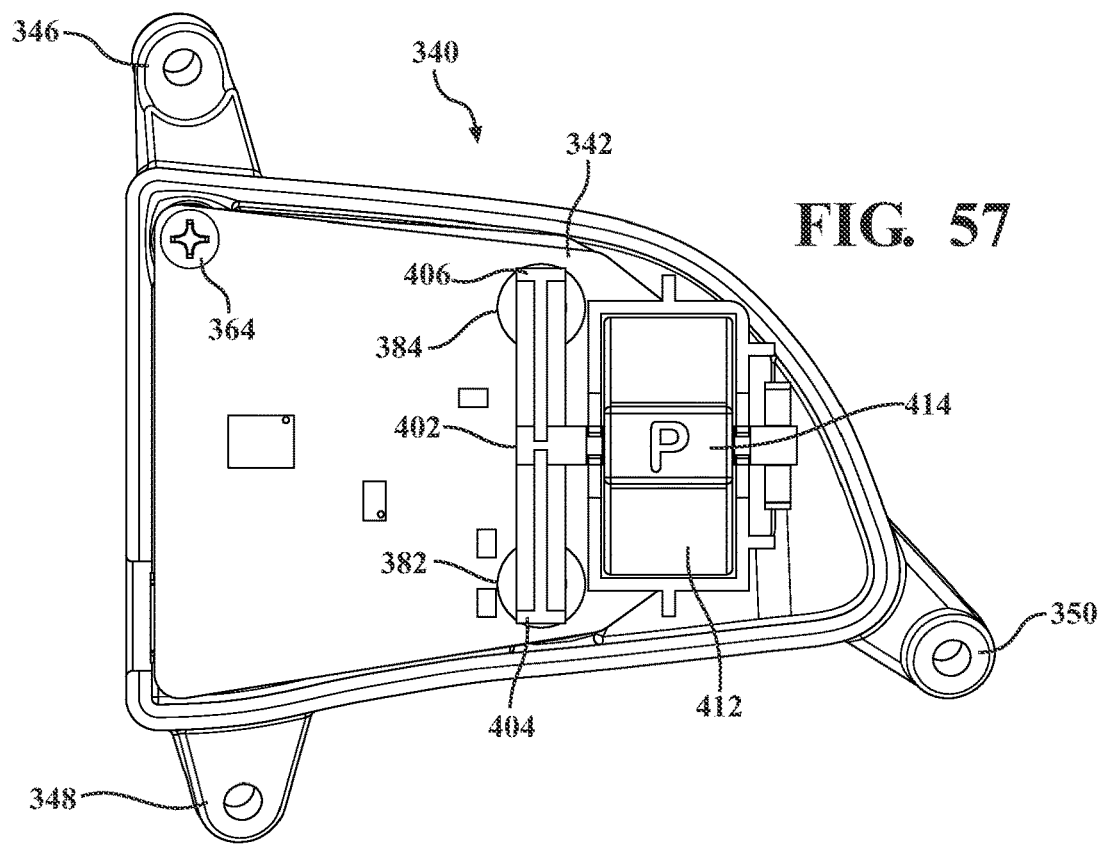
FIG. 57 is an illustration similar to FIG. 56 with the upper housing removed to better depict the inner knob housing, paddle and keypad buttons for providing the necessary shifter resistance during monostable toggling of the knob in either direction.

FIG. 56 is a front plan view of the toggle shifter assembly of FIG. 55, with FIG. 57 providing an illustration similar to FIG. 56 with the upper housing removed to better depict the inner knob housing 344, and paddle 402 with opposite contact ends 404/406 and keypad buttons 382/384 for providing the necessary shifter resistance during monostable toggling of the knob 358 in either direction. FIG. 58 is a sectional perspective of the toggle knob with over-mold 412, paddle 402, keypad 380 and keypad buttons (outer) 382/384 and (inner) 386/388 for providing monostable toggling in either of first or second directions.

In operation, and as the toggle knob or switch is rotated, the end locations 404/406 of the paddle 402 extending from the knob axis 410 (again FIG. 55) is also caused to pivot. An upward toggle moves the upper paddle end 406 into downward contact with the opposing keypad 384. Upon the keypad 384 making contact with the underside located switch 392 on the PCBA 362, the circuit is closed to acknowledge that an upward toggle selection was made (such as corresponding to a change in gear position).

An opposing downward toggle moves the corresponding lower paddle end 404 into downward contact with the opposing keypad 382 which, again upon making contact with corresponding switch 390 on the PCBA, closes the circuit acknowledging that a downward toggle selection was made. As previously described, a Park position can be engaged by toggling the knob as described above or by pushing the knob inward (see again as shown by directional arrow 416 in FIG. 64), this resulting in pushing the keypad button or buttons (again 386/388) located underneath the inner knob housing 398 into contact with the underside located PCBA sensor/switch combinations 394/396.

Figure 59:
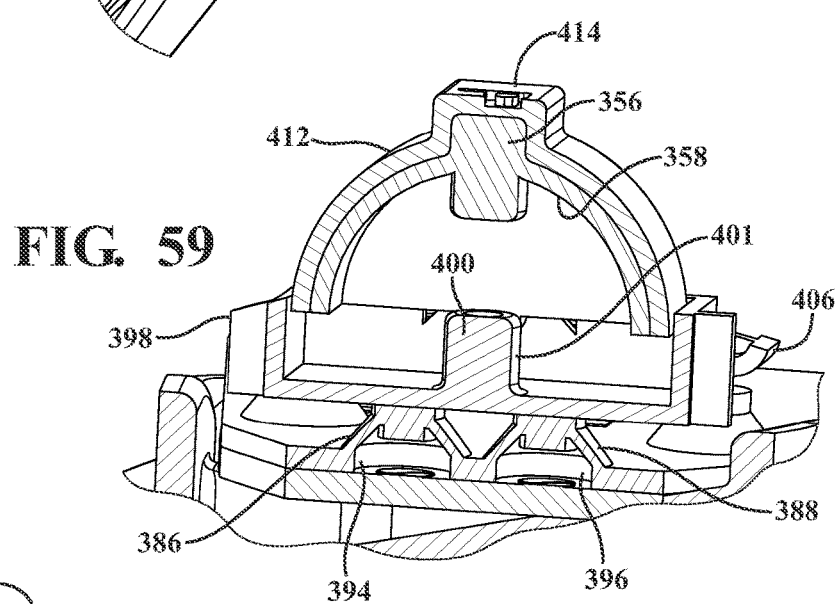
FIG. 59 is a further rotated and cutaway view taken along line 59-59 of FIG. 58 and showing the underside positioned sensor switches configured on the PCBA which alternately interface with the inner knob housing during rotation in either of first or second toggling directions.
Figure 60:
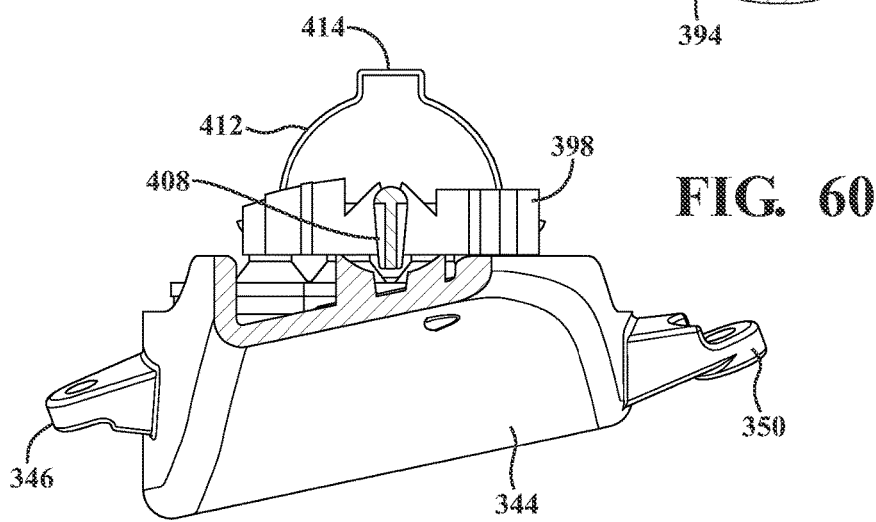
FIG. 60 is a further partial side perspective illustration of the inner toggle knob housing, over mold, and lower housing.

FIG. 59 is a further rotated and cutaway view taken along line 59-59 of FIG. 58 and showing the underside positioned sensor switches 394/396 configured on the PCBA 362, which alternately interface with the underside of the inner knob housing 398 during rotation in either of first or second toggling directions. FIG. 60 is a further partial side perspective illustration of the inner toggle knob housing 398, knob over mold 412, and lower housing 344, this in order to illustrate the toggling motion of the assembly from a different vantage.

FIG. 61 is an illustration similar to FIG. 56 and depicting the bi-directional motion of the toggle knob, as further depicted by arrow 418. FIG. 62 is a substantial repeat view of FIG. 58 and depicting the rotational direction (see rotational arrow 420) of the elongated paddle 402 in contact with the resistance inducing keypad buttons 382/384.

Proceeding to FIG. 63, presented is a further rotated and perspective cutaway of the toggle assembly of FIG. 55, and which depicts the toggle element rotatably supported paddle 402, outer keypad buttons 382/384, PCBA 362 and sensor switches 390/392. FIG. 64 is an illustration similar of FIG. 60 depicting an inward push to park condition (again downward button 416) in which depressing of the toggle knob causes the keypad buttons 386/388 located underneath the inner knob housing to descend into contact with the underside located sensor switches (394/396).

Figure 65:
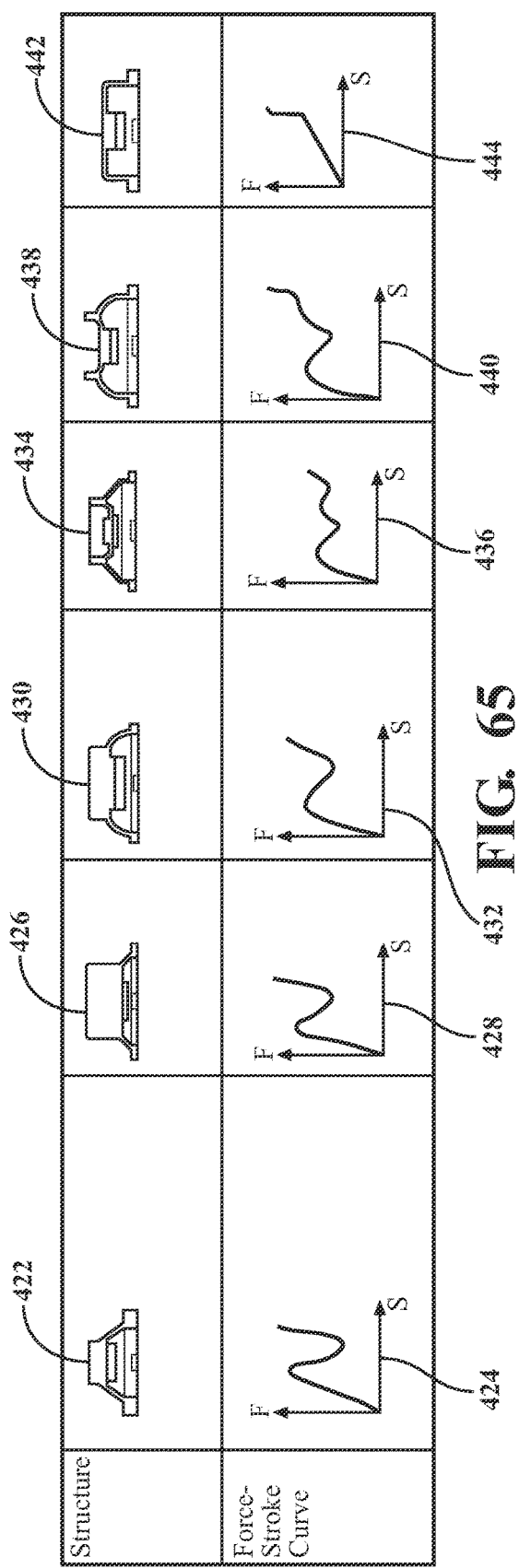
FIG. 65 is a graphical depiction of a variety of force stroke profiles corresponding to different toggle keypad configurations for varying shifter resistance in response to toggling of the knob.

Proceeding to FIG. 65 is a graphical depiction is provided of a variety of force stroke profiles corresponding to different toggle keypad configurations for varying shifter resistance in response to toggling of the knob. This includes a first configuration of a keypad configuration 422 corresponding to a first force-stroke curve 424 resulting from the force graphical profile established by the contacting of the corresponding ends 404/406 of the paddle 402 during the pivoting of the toggle knob 358 and inner housing 398.

Additional pairs of keypad structures and corresponding force-stroke graphical depictions are shown at 426/428, 430/432, 434/436, 438/440, and 442/444. These depictions each represent differences in shift effort resistance in response to downward pivoting actuation of the paddle ends into biasing contact and are intended to substitute for the effect of the spring loaded pawls, wave springs or torsion spring of the earlier embodiments.

Figure 66:
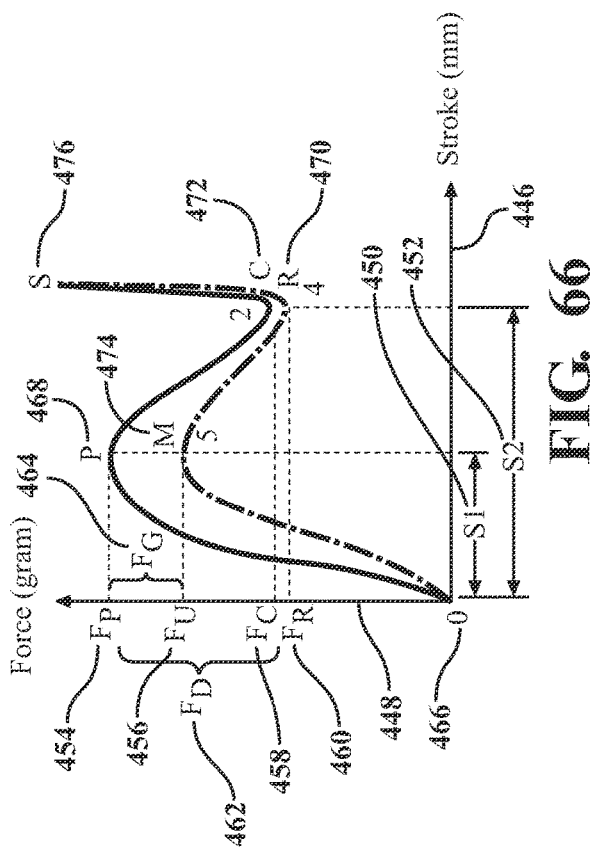
FIG. 66 is a further graphical depiction illustrating the effects of keypad button resistance for varying force profiles versus key stroke.

FIG. 66 is a further graphical depiction illustrating the effects of keypad button resistance for varying force profiles versus key stroke. Consistent with the force-stroke curve profiles presented in FIG. 65, the graphical depiction of FIG. 66 provides an X axis 446 representing stroke distance (in mm), along with a Y axis 448 for force exerted (gram).

Representations for peak stroke S1 (at 450) and contact stroke S2 (at 452) are represented along the X axis 446. Force profile identifiers further include each of peak force (FP) at 454, maximum return force (FU) at 456, contact force (FC) at 458, minimum return force (FR) at 460, drop force FD (FD=FP☐FC) at 462 and related drop force FG (FG=FP☐FM) at 464. Location variables include each of original point (0) 466, peak point (P) 468, return point (R) 470, contact point (C) 472 and maximum return point (M) 474. In each instance, the shift effort and corresponding keypad button resistance is defined by the geometry of the button as well as the selected button material (not limited to varying grades of polymeric or rubberized compositions including composites and the like). A further peak stroke force is further depicted 476 and defines a maximum of the travel and force and force components.

Figure 67:
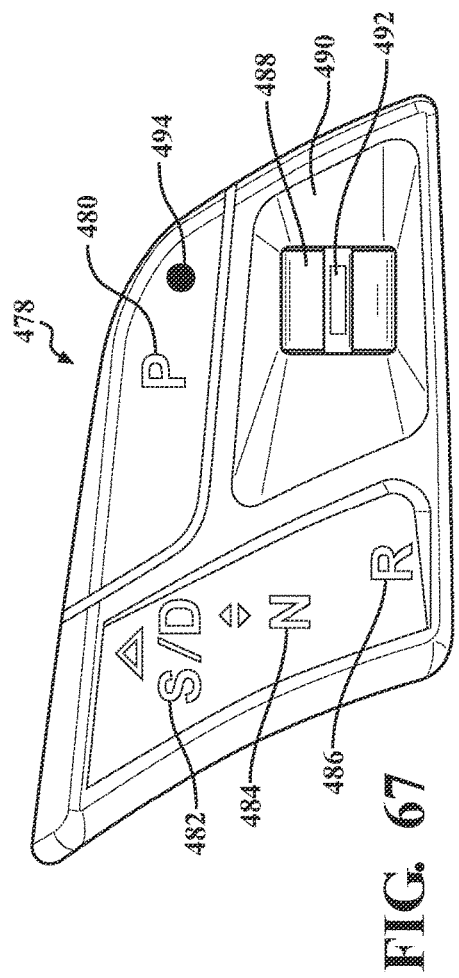
FIG. 67 is a plan view of a toggle shifter according to a further variant and depicting a shift pattern in a reverse order configured into a redesigned upper housing.

FIG. 67 is a plan view of a toggle shifter according to a further variant 478 and depicting a shift pattern in a reverse order configured into a redesigned upper housing. This representation is intended to correspond to any of the previously described toggle shifter assemblies described herein and in which the display is integrated into the upper housing so that individual shifter positions are represented in a reverse order by Park position 480, Sport-Drive (S/D) position 482, Neutral position 484 and Reverse position 486.

A protruding location of a toggle knob is shown at 488 seated within a recessed forward facing portion 490 of the upper housing, with a peak gripping portion 492 amenable to being contacted by the operator in either of upward or downward toggling fashion. An operating button depiction 494 can also be provided in combination with the Park position identifier 480. Without limitation, a functional lighting scheme can include a first coloring (such as without limitation being red) associated with the Park position 480, with a second coloring (not limited to white) corresponding to each of the other S/D 482, N 484 and R 486 positions.

As with the preceding embodiments, each of Park Lock, Neutral Lock and direct shift (e.g. Park to Reverse and Reverse to Park) functionality can be built into the redesigned toggle shifter 478. The toggle button 488 can be actuated in either of an upward direction (see as identified at A1 in FIG. 68 corresponding to a brief or momentary upward actuation) or a downward direction (further represented at B1 and again corresponding to a brief or momentary downward actuation). Succeeding or incrementing upward/downward shifter positions are achieved by holding the toggle knob for a period of time (such as equal or greater than 0.5 seconds) and are identified respectively by toggling actions A2 and B2.

Figure 68:
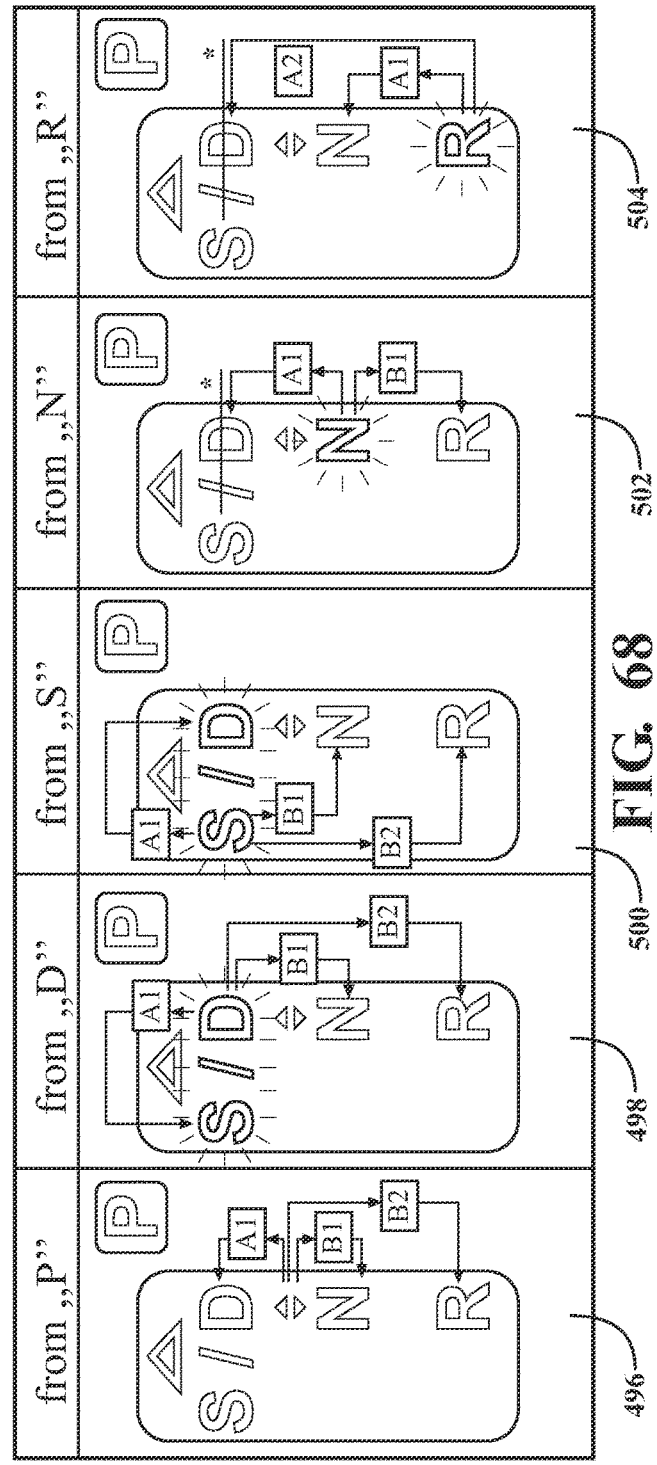
FIG. 68 is a schematic illustration presenting the toggle shifter positions from each of PDSNR positions.

FIG. 68 is a schematic illustration presenting the toggle shifter positions from each of PDSNR positions in the assembly of FIG. 67. These are divided into individual display representations and include a first representation 496 for shifting from Park to each of S/D, N and R positions in which successive momentary upward A1 and downward B1 toggle actions. The downward toggle action B1 can be substituted by a sustained downward toggle motion B2 for switching to the Reverse position.

Display representation 498 corresponds to a shifting scheme from the Drive position and can include an upward toggle A1 to Sport, or either of momentary or sustained downward toggles B1 or B2 from S/D positions in order to switch between Neutral and Reverse.

Display representation 500 corresponds to a shifting scheme from the related Sport position and includes any of an upward toggle A1 or downward toggles B1 or B2 to Neutral or Revers positions.

Display representation 502 illustrates a further depiction of a shifting effort from Neutral to any of S/D (via A1 upward toggles) or Reverse (via downward toggle B1).

Finally, display representation 504 illustrates a further reverse shifter display scheme from Reverse utilizing upward toggle A1 (such as to Neutral) or A2 (jumping to S/D position). The toggle can be additionally actuated (A1) or held in the upward position (A2) in order to advance to the shifter position. In each of the above referenced examples in FIG. 68, the Park position is only actionable by engaging the park button.

Figure 69:
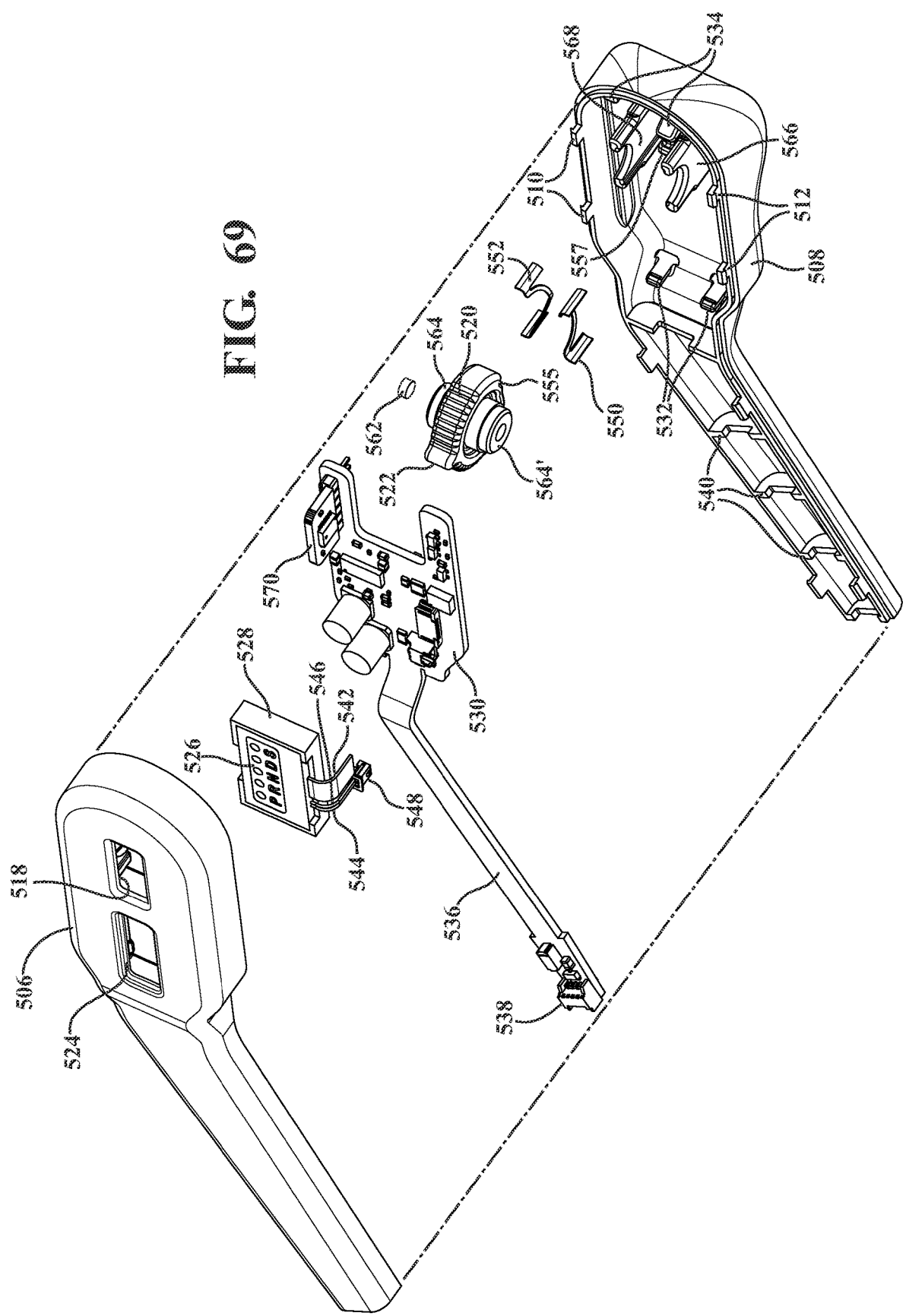
FIG. 69 is an exploded illustration of a steering column stalk mounted version of a toggle knob shifter assembly according to a yet further embodiment of the present invention.

Proceeding now to FIG. 69, an exploded illustration of a steering column stalk mounted version of a toggle knob shifter assembly is provided according to a yet further embodiment of the present invention (see as further represented in the assembled view in FIG. 70) according to a yet further embodiment of the present invention. The stalk mounted version of the toggle assembly includes each of an upper housing 506 and a lower housing 508 which are configured to inter-assemble, see edge configured engagement tabs 510 and 512 for the lower housing 508 which seat within receiving locations (hidden from view in FIG. 60 but depicted at 514 and 516 in the cutaway view of FIG. 71) configured in opposing and aligning locations of the upper housing 506 and so that the assembly is installed in supporting and extending fashion from the steering wheel column (not shown).

The upper housing 506 further includes a forward facing slot shaped aperture (see interconnecting rim edge 518) for receiving and partially protruding the knurled outer profile of an associated toggle wheel 520 having a peaked engagement location 522 defined in its outer perimeter. A second forward facing and laterally spaced slot shaped aperture (further defined by rim edge 524) is also configured in the upper housing 506 for framing an illuminating screen portion 526 of a display component 528 (again including without limitation any of a TFT, OLED or segmented version). As with previous embodiments, the aperture defining rim edges 518 and 524 can further include the installation of bezel window portions in order to provide an enhanced finish to the assembly.

The lower housing 504 further includes an open interior area within which is received a reconfiguration of a PCBA 530 (this further being assisted by pairs of engagement tabs 532 and 534 configured within the interior of the lower housing interior for fixing to the aligning side edges of the PCBA 530. A ribbon 536 and end connector 538 extends from the PCBA 530 to a base of the assembled stalk and so that the ribbon is supported within the stalk (see interior support ribs at 540 associated with the lower housing 508) with external inputs (such as remote return to park sensors and the like) are communicated to the PCBA 530 via the ribbon 536.

A separate ribbon 542 also extends from the display component to a connecting location on the PCBA 530 for controlling such as the LCD segments associated with the display. Also depicted are separate power lines 544 and 546 with a separate end connector 548 for attaching to the PCBA 530 to provide power to such as separately mounted LED elements (not shown) contained in the display component 528.

Figure 73:
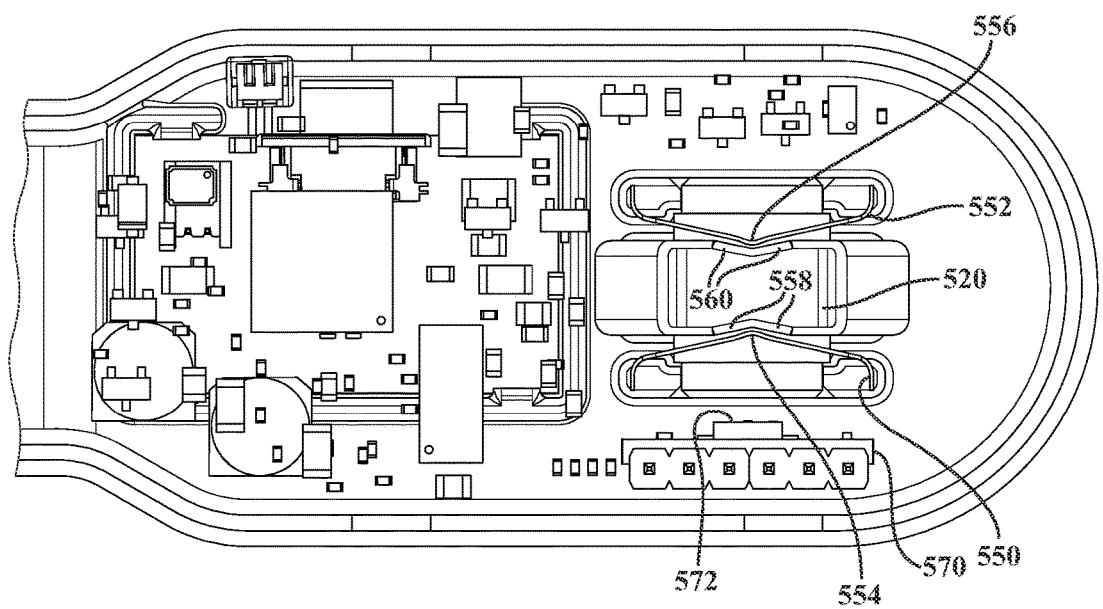
FIG. 73 is an enlarged view of FIG. 72, again with the lower housing removed, and depicting the toggle knob, side supporting wave springs and PCBA with proximally positioned sensor.

A pair of wave springs 550 and 552 are provided which align with opposite sides of the toggle wheel 520 and which likewise include central arcuate protruding locations 554 and 556 (see FIG. 73) which bias against opposing side detent profiles (see as further shown in FIG. 73 by opposing pairs of angled detent ramps 558 and 560 corresponding to the contacting wave springs 550/552. Although not clearly shown, an arcuate recess channel (see at 555 in FIG. 69) is depicted in a bottom annular profile of the toggle knob 520 for seating an abutment portion 557 in the lower housing interior between the cradle support portions 566/568. A round magnet 562 is integrated into a recessed side location of a spindle or shaft support 564 of the toggle wheel 520. This can again include without limitation over-molding the toggle wheel in its entirety around the magnet.

Figure 71:
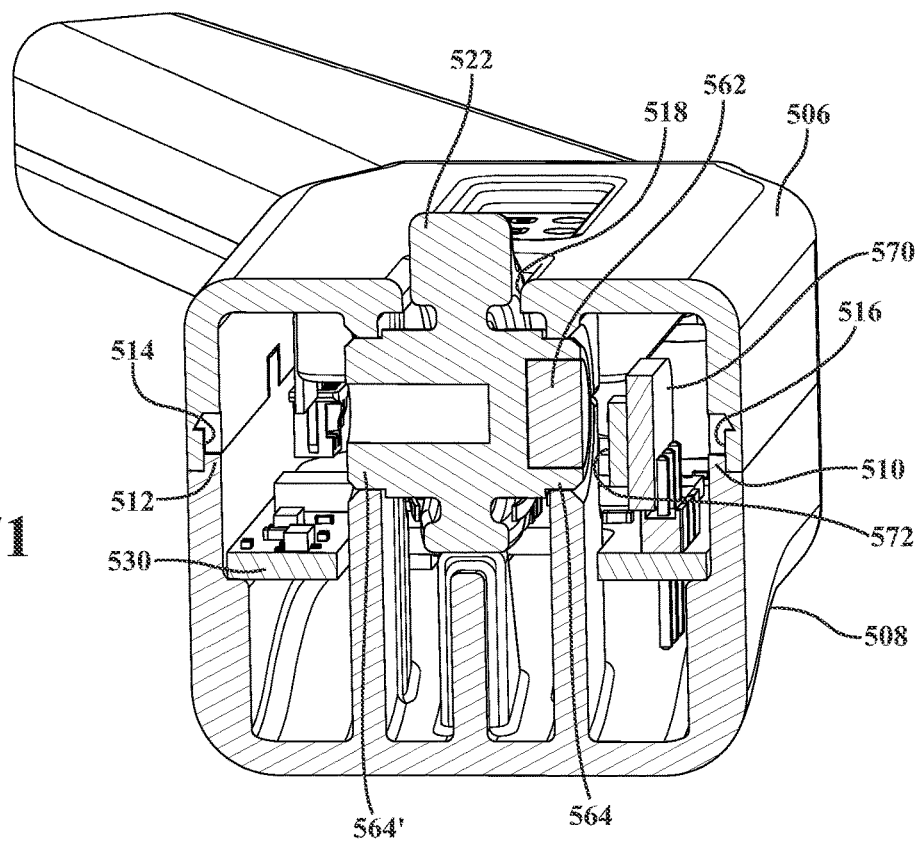
FIG. 71 is cross sectional cutaway of FIG. 70 with the upper housing removed and depicting the PCBA with ribbon and connector supported upon the lower housing along with the toggle knob with end supported magnet and side haptic supporting wave springs.

A pair of contoured cradle defining portions 566 and 568 are depicted projecting from the inside contoured surface of the lower housing 508 for receiving the opposite extending shaft portions (again at 564 and as further referenced at 564⬚ in FIGS. 69 and 71). The PCBA 530 further includes an angled shelf support 570 upon which is positioned a sensor 572 (such as including without limitation an inductive of Hall effect sensor and which is depicted in the cutaway view of FIG. 71) in proximity to the magnet 562 and so that rotation of the toggle wheel 520 in either direction results in rotational displacement of the magnet relative to the sensor, in turn allowing the associated processor in communication with the PCBA 530 to instruct a gear change to the ECU upon determining a certain angular rotation of the magnet.

FIG. 70 again depicts an assembled plan view of the embodiment of FIG. 69 and depicting both the toggle knob 520 and segmented or TFT/OLED display component 528. FIG. 71 again provides a cross sectional cutaway of FIG. 40, with the upper housing removed and depicting the PCBA 530 with ribbon 536 and connector 538 supported upon the lower housing 508 along with the toggle knob 520 with end supported magnet 562 and side haptic supporting wave springs 550 and 552.

Figure 70:
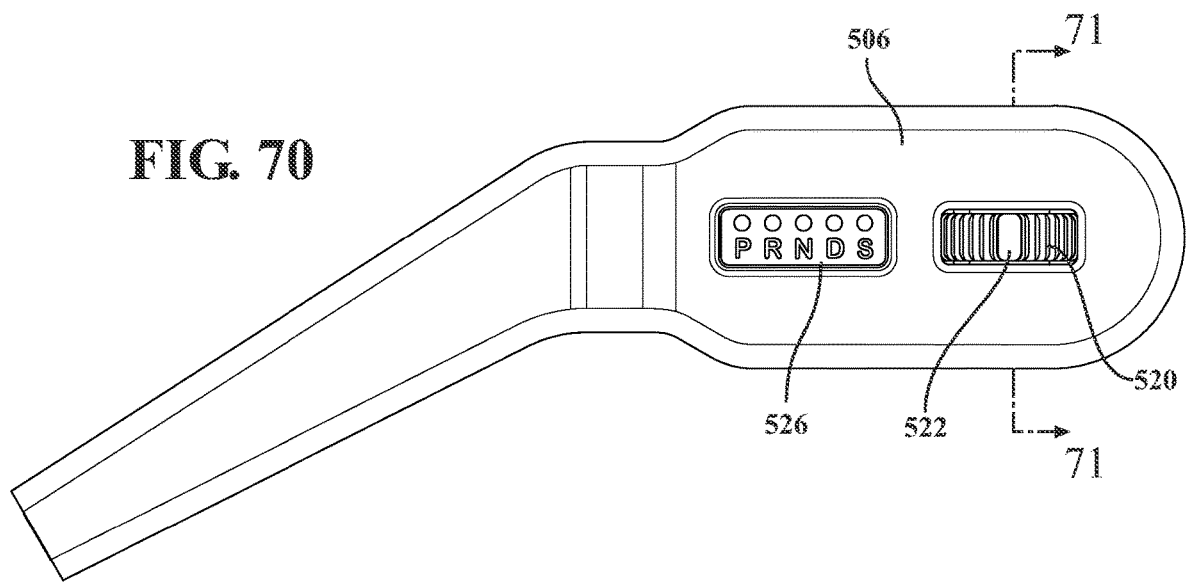
FIG. 70 is an assembled plan view of embodiment of FIG. 69 and depicting both the toggle knob and segmented or TFT/OLED display.
Figure 72:
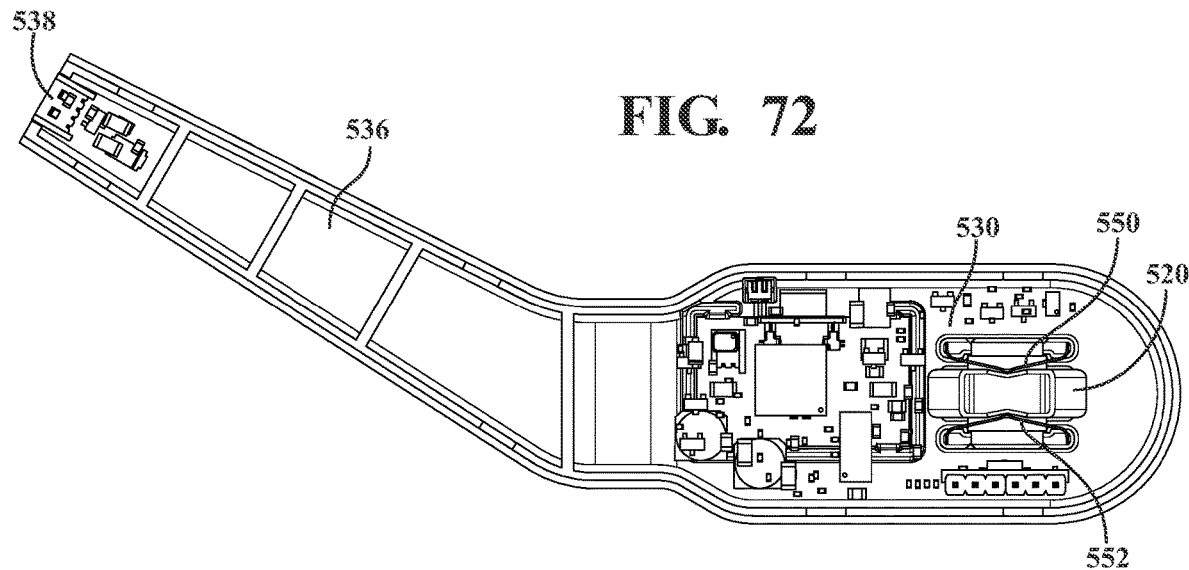
FIG. 72 provides a 180 degree rotated illustration of FIG. 70 with the lower housing removed and depicting the PCBA with ribbon and connector in combination with the toggle knob, and side supporting wave springs.

FIG. 72 provides a 180 degree rotated illustration of FIG. 70 with the lower housing removed and depicting the PCBA 530 with ribbon 536 and connector 538 in combination with the toggle knob 520, and side supporting wave springs 550/552. FIG. 73 is an enlarged view of FIG. 72, again with the lower housing removed, and depicting the toggle knob 520, side supporting wave springs 550/552 and PCBA 530 with proximally positioned sensor 572.

Figure 74A:
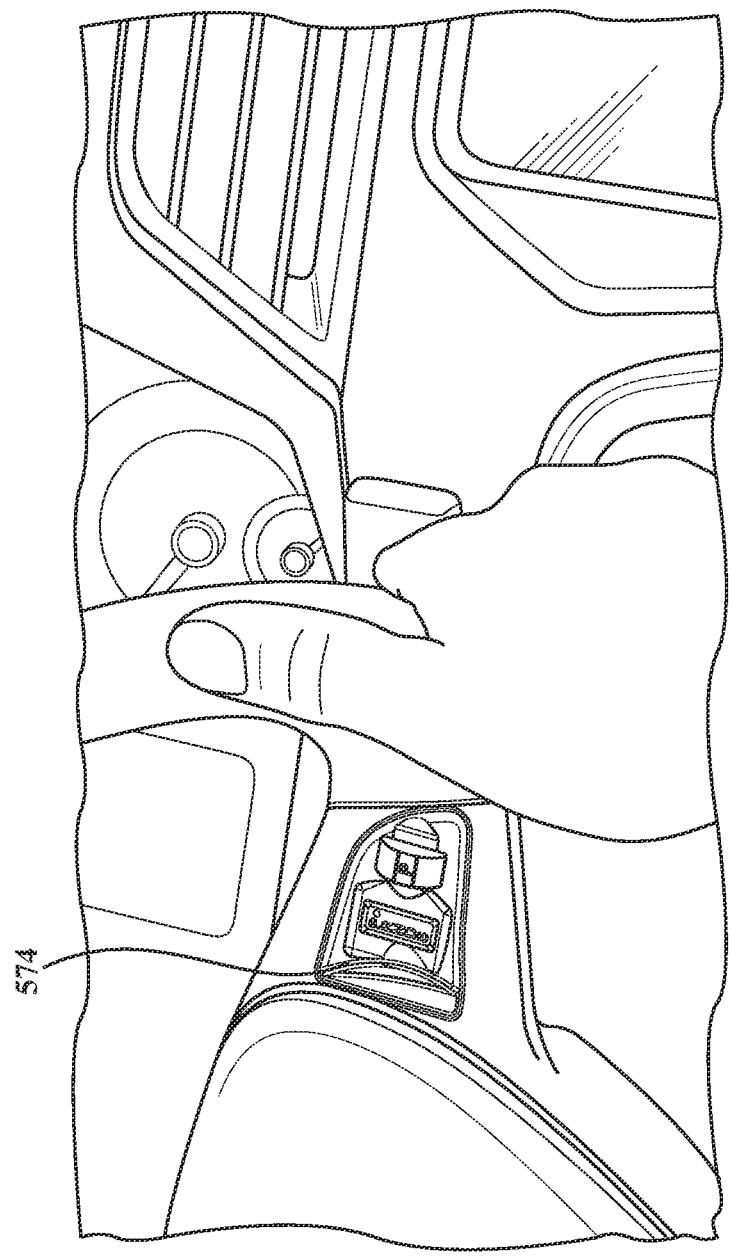
FIGS. 74A-74C depict a series of environmental views illustrating the ability to integrate the shifter assembly to a variety of locations within the vehicle interior not limited to any of the steering wheel, steering wheel column or stalk, or dashboard/instrument panel.
Figure 74B:
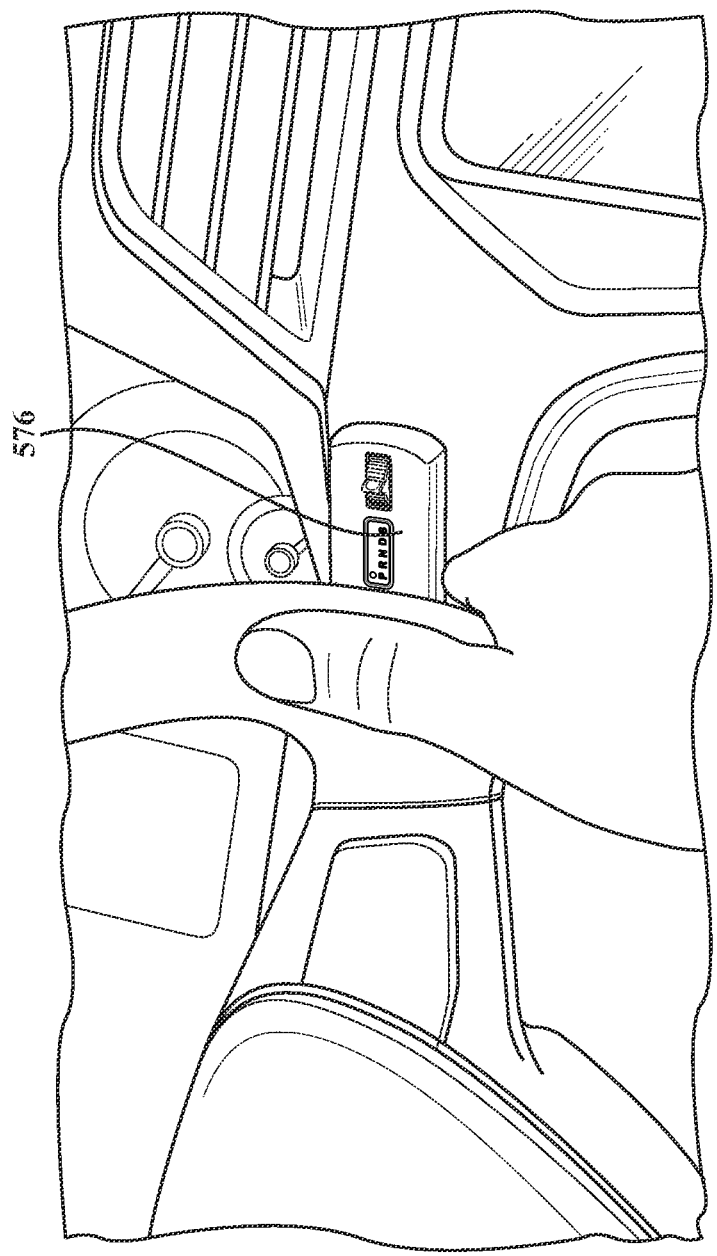
Figure 74C:
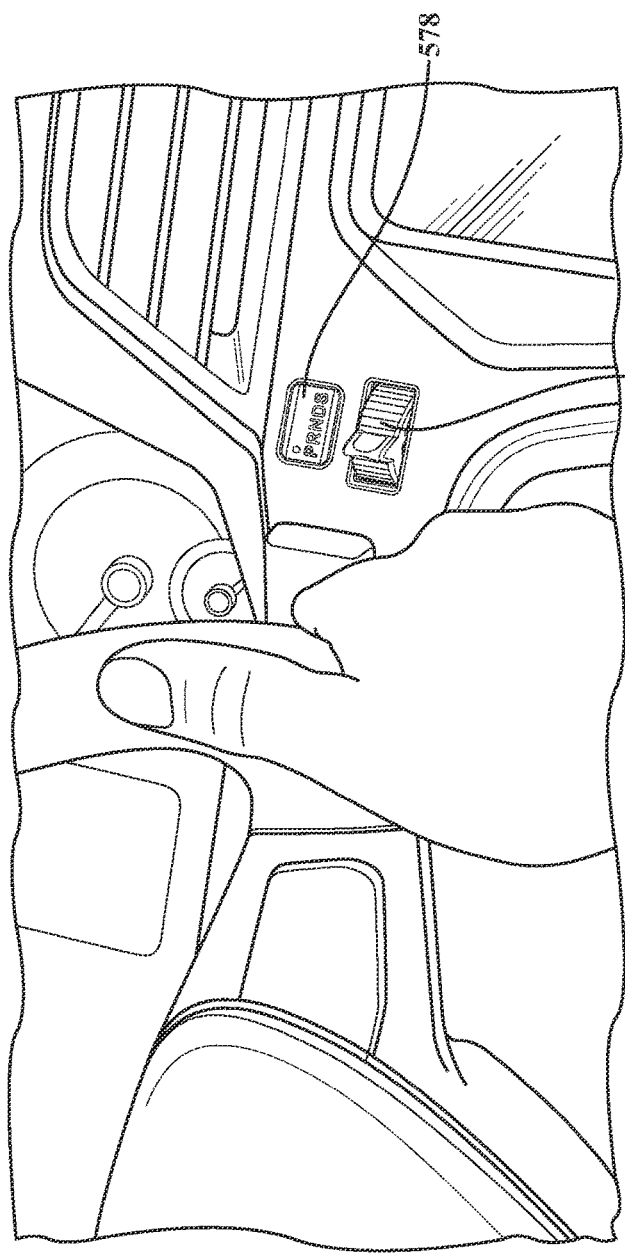
Figure 75:
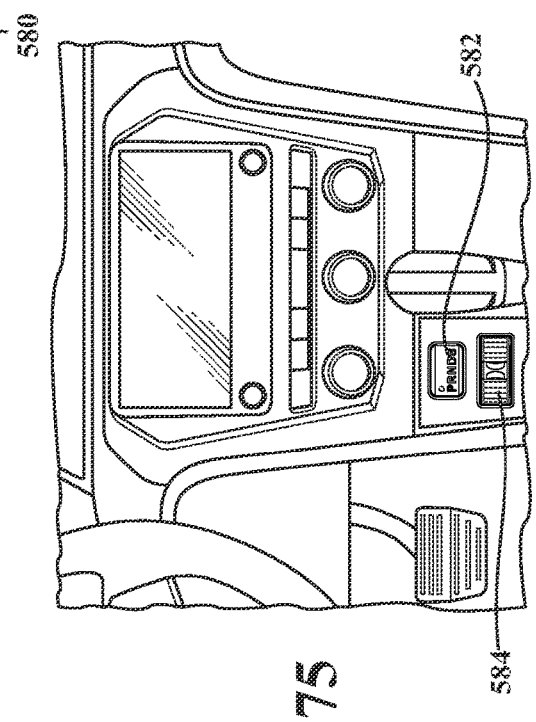
FIG. 75 presents a further environmental view of a toggle shifter incorporated into any of a center console or on the steering wheel stalk.

FIGS. 74A-74C depict a series of environmental views and illustrating the ability to integrate the shifter assembly to a variety of locations within the vehicle interior not limited to any of the steering wheel (at 574 in FIG. 74A), steering wheel column or stalk (at 576 in FIG. 74B), or dashboard/instrument panel (depicted by display 578 and toggle knob 580 in FIG. 74C). FIG. 75 presents a further environmental view of a toggle shifter incorporated into a center console as referenced by display portion 582 and toggle knob 584.

The present invention accordingly provides a rotatable toggle switch wheel vehicle shifter assembly which provides operator interface for transmission gear selection, as well as providing the operator with haptic feedback while shifting through the gear positions, such as again accomplished through the configuration of the annular detent profile against which is biased the spring loaded pawl for travel through the peaks and trenches/valleys of the profile. The toggle switch gear assembly provides the operator with single position (mono stable) functionality for between each of park, reverse, neutral, drive, or manual positions along with single bump operation for shifting between each of the gear positions.

The corresponding direct to drive or direct to park functionality is also accomplished by holding the mono stable toggle to a maximum rotated position for the determined time interval, and by which the associated interface between the toggle wheel end mounted magnet and proximate PCBA sensor facilitates the instructions sent from the associated processor for accomplishing the desired gear shift changes.

The present gear shifter design further again provides return to park functionality by which, in response to an external signal being received by the PCBA mounted processor (e.g. door opening or the like), causing the shifter position to be automatically resent to the Park position. Each of park lock and neutral lock functionality is also incorporated into the present design in order to prevent the vehicle from changing gears until certain preconditions are met (e.g. foot is depressed on brake) upon which the PCBA electronically allows the toggle wheel to shift the vehicle.

The display provides gear position indication according to any desired design configuration or orientation. Additional features include the housing and assembly providing the design flexibility for orienting the toggle wheel in any of up/down or left/right orientations. Other considerations include providing the design flexibility for reductions in package size in order to fit into numerous vehicle locations, including in particular the steering wheel or column as well as in the instrument panel (IP) dashboard or elsewhere.

It is further envisioned that the toggle assembly can be reconfigured for use in assemblies outside of vehicle gear shifting. To this end, the term ||shifter||, as most broadly interpreted, is contemplated to apply to windshield wiper control, volume control, or dimmer control functions by non-limiting example.

Having described my invention, other and additional preferred embodiments will become apparent to those skilled in the art to which it pertains, and without deviating from the scope of the appended claims. The detailed description and drawings are further understood to be supportive of the disclosure, the scope of which being defined by the claims. While some of the best modes and other embodiments for carrying out the claimed teachings have been described in detail, various alternative designs and embodiments exist for practicing the disclosure defined in the appended claims.

The invention claimed is:

1. A shifter assembly, comprising:
    a housing supporting a toggle knob having a projecting protuberance accessible to a vehicle operator;
    at least one detent profile configured upon said toggle knob;
    a magnet positioned in proximity to a sensor mounted to a printed circuit board (PCBA) within said housing, said magnet displacing relative to said sensor in response to actuating said toggle knob in either of opposite mono-stable directions;
    a display component in communication with said PCBA and visible through said housing; and
    at least one biasing element supported within said housing in contact with said detent profile such that, and upon an operator actuating said toggle knob, said biasing element is caused to displace relative to said detent profile, said magnet rotating relative to said PCBA sensor to electronically instruct a shift change by a processor associated with said PCBA.

2. The assembly of claim 1, said housing further comprising assembleable portions adapted for incorporation into any of a steering wheel, steering column, dash board, console or other location within a vehicle instrument panel.

3. The assembly of claim 1, further comprising at least one of a pair of first and second plates or spaced apart bearings secured within said housing for rotatably supporting said toggle knob therebetween.

4. The assembly of claim 3, said biasing element further comprising a pair of pawls biased by a pair of compression springs supported within said housing, said detent profile further including first and second detent profiles configured upon opposite sides of said toggle knob and against which said pawls bias.

5. The assembly of claim 1, said biasing element further comprising a pair of wave springs supported within said housing, said detent profile further including first and second detent profiles configured upon opposite sides of said toggle knob and against which said contact portions of said wave springs bias.

6. The assembly of claim 1, said biasing element further comprising a torsion spring incorporated into a shaft portion of said toggle knob, with rotation of said knob in either direction being counter-biased by said torsion spring.

7. The assembly of claim 1, said display component further comprising any of a thin film transistor, organic light emitting diode or segmented display.

8. The assembly of claim 1, further comprising a pair of windows defined in an upper face of said housing for seating each of said toggle wheel and said display component.

9. The assembly of claim 1, further comprising a return to park function in which said printed circuit board resets the shifter to Park in response to a determined external input.

10. The assembly of claim 1, further comprising each of a Park Lock and Neutral Lock function for preventing rotation of said toggle knob to effectuate a gear change unless said PCBA determines a necessary condition for providing electronic shifting.

11. The assembly of claim 1, further comprising said housing being supported within a steering wheel, rotation of which causing simultaneous rotation of the housing in order to maintain said display in a continuously upright orientation regardless of the rotational position of the wheel.

12. The assembly of claim 11, said display further comprising a capacitive touchscreen, a sensor determining an angular rotation of the steering wheel in order to reposition the display to maintain the upright orientation.

13. The assembly of claim 11, further comprising said housing having a circular configuration with any of a toothed or frictionally engaging outer circumference.

14. The assembly of claim 13, further comprising a drive belt extending around said outer circumference of said housing and a center axis support within the steering wheel.

15. The assembly of claim 13, further comprising a series of interconnected gearwheels for cooperatively rotating said housing in response to rotation of the steering wheel.

16. The assembly of claim 1, further comprising said housing being supported within a steering wheel, a sensor measuring a steering wheel angle for continuously reorienting to an upright viewed position said display.

17. The assembly of claim 1, said assembly further comprising application to any of a gear shifter, windshield wiper control, volume control, or dimmer control.

18. A toggle shifter assembly for a vehicle, comprising:
- a housing having upper and lower assembleable housings defining a package containing interior;
- a printed circuit board (PCBA) supported within said lower housing;
- a keypad located above said PCBA and incorporating a plurality of keypad buttons in selective communication with an arrangement of sensors and switches within said PCBA;
- a toggle knob supported upon said keypad in proximity to said keypad buttons and so that mono-stable rotation of said toggle knob in either of first or second opposite directions is counter biased to return said knob to a center position;
- a display component in communication with said PCBA and visible through said upper housing; and
- upon an operator actuating said toggle knob in either of said counterbiasing directions, at least one of said sensor/switches of said PCBA closing a circuit to electronically instruct a shift change by a processor associated with said PCBA.

19. The shifter assembly of claim 18, said toggle knob further comprising a paddle pivotally supported in selective contact with an outer subset plurality of said keypad buttons.

20. The shifter assembly of claim 19, further comprising a shoebox shaped inner knob housing seating said toggle knob, said inner housing positioned above an inner subset plurality of said keypad buttons and, in response to downwardly depressing said toggle knob, instructing the PCBA to shift the vehicle from any of a Reverse, Neutral or Drive position to return to Park position.

\* \* \* \* \*